(12) United States Patent
Ogawa

(10) Patent No.: US 6,312,970 B1
(45) Date of Patent: Nov. 6, 2001

(54) FABRICATION OF CCD TYPE SOLID STATE IMAGE PICKUP DEVICE HAVING DOUBLE-STRUCTURED CHARGE TRANSFER ELECTRODES

(75) Inventor: Chihiro Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/635,336

(22) Filed: Aug. 9, 2000

Related U.S. Application Data

(62) Division of application No. 09/120,466, filed on Jul. 23, 1998.

(30) Foreign Application Priority Data

Jul. 23, 1997 (JP) .................................................. 9-196688

(51) Int. Cl.[7] .................................................. H01L 21/00
(52) U.S. Cl. .................................................. 438/60
(58) Field of Search .................... 438/60, 73, 75, 438/78, 79, 97, 98

(56) References Cited

U.S. PATENT DOCUMENTS

| 4,725,872 | 2/1988 | Blouke et al. ........................ 257/249 |
|---|---|---|
| 5,510,285 * | 4/1996 | Kim ........................................ 438/60 |

FOREIGN PATENT DOCUMENTS

| 2-5440 | 1/1990 | (JP) . |
|---|---|---|
| 4-147651 | 5/1992 | (JP) . |
| 5-114617 | 5/1993 | (JP) . |
| 6-326136 | 11/1994 | (JP) . |
| 7-211883 | 8/1995 | (JP) . |

OTHER PUBLICATIONS

K. Orihara et al., "New Shunt Wiring Technologies for High Performance HDTV CCD Image Sensors", IEDM 92, pp. 105–108.

Japanese Office Action dated Dec. 27, 2000, with partial English translation.

* cited by examiner

*Primary Examiner*—Charles Bowers
*Assistant Examiner*—K Christianson
(74) *Attorney, Agent, or Firm*—McGinn & Gibb, PLLC

(57) ABSTRACT

In a CCD type solid state image pickup device including a semiconductor substrate having photo/electro conversion portions and a first insulating layer formed on the semiconductor substrate, a plurality of charge transfer electrodes are formed on the first insulating layer and are a double structure formed by a first conductive layer and a second conductive layer having a lower resistance value than the first conductive layer. A second insulating layer is interposed between two adjacent ones of the charge transfer electrodes.

44 Claims, 74 Drawing Sheets

FABRICATION OF CCD TYPE SOLID STATE IMAGE PICKUP DEVICE HAVING DOUBLE-STRUCTURED CHARGE TRANSFER ELECTRODES

The present Application is a Divisional Application of U.S. patent application Ser. No. 09/120,466 filed on Jul. 23, 1998.

BACKGROUND OF THE INVENTION

1. Field of the Invention

The present invention relates to a charge-coupled device (CCD) type solid state image pickup device.

2. Description of the Related Art

CCD type solid state pickup devices instead of pickup tubes have been used in family video cameras, electronic news gathering (ENG) cameras and the like.

In a prior art CCD type solid state image pickup device including a semiconductor substrate having photo/electro conversion portions and a first insulating layer formed on the semiconductor substrate, a plurality of charge transfer electrodes are formed on the first insulating layer and are a single structure formed by polycrystalline silicon. Also, a second insulating layer is interposed between two adjacent ones of the charge transfer electrodes. This will be explained later in detail.

In the above-described prior art device, however, the parasitic resistance of the charge transfer electrodes is considerably large, due to the high resistance of polycrystalline silicon. Therefore, a time constant determined by the above-mentioned large parasitic resistance and a parasitic capacitance formed by the charge transfer electrode is increased which rounds the waveform of a voltage applied to the center of the charge transfer electrode, and reduces the charge transfer efficiency.

In order to reduce the parasitic resistance of the charge transfer electrodes, an optical shield layer can be connected to the charge transfer electrodes (see: K. Orihara et al., "New Shunt Wiring Technologies for High Performance HDTV CCD Image Sensors", IEDM92, pp. 105–108).

In this case, however, the optical shield effect is deteriorated which increases smear charges, which causes image defects. In addition, when the number of pixels is increased, the gap among the portions of the optical shield layer is also very small. For example, this gap is about 0.2 $\mu$m. However, since the optical shield layer is made of tungsten or aluminum, not polycrystalline silicon., it is impossible to form such a 0.2 $\mu$m gap in the optical shield layer.

SUMMARY OF THE INVENTION

It is an object of the present invention to provide a CCD type solid state image pickup device capable of reducing the parasitic resistance of charge transfer electrodes, thus enhancing the charge transfer efficiency.

According to the present invention, in a CCD type solid state image pickup device including a semiconductor substrate having photo/electro conversion portions and a first insulating layer formed on the semiconductor substrate, a plurality of charge transfer electrodes are formed on the first insulating layer and are a double structure formed by a first conductive layer and a second conductive layer having a lower resistance value than the first conductive layer. A second insulating layer is interposed between two adjacent ones of the charge transfer electrodes.

Thus, since the charge transfer electrodes are of a double structure, the parasitic resistance thereof can be reduced.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art CCD type solid state image pickup devices will be explained with reference to FIGS. 1, 2, 25 3A, 3B and 4.

Figure 1:
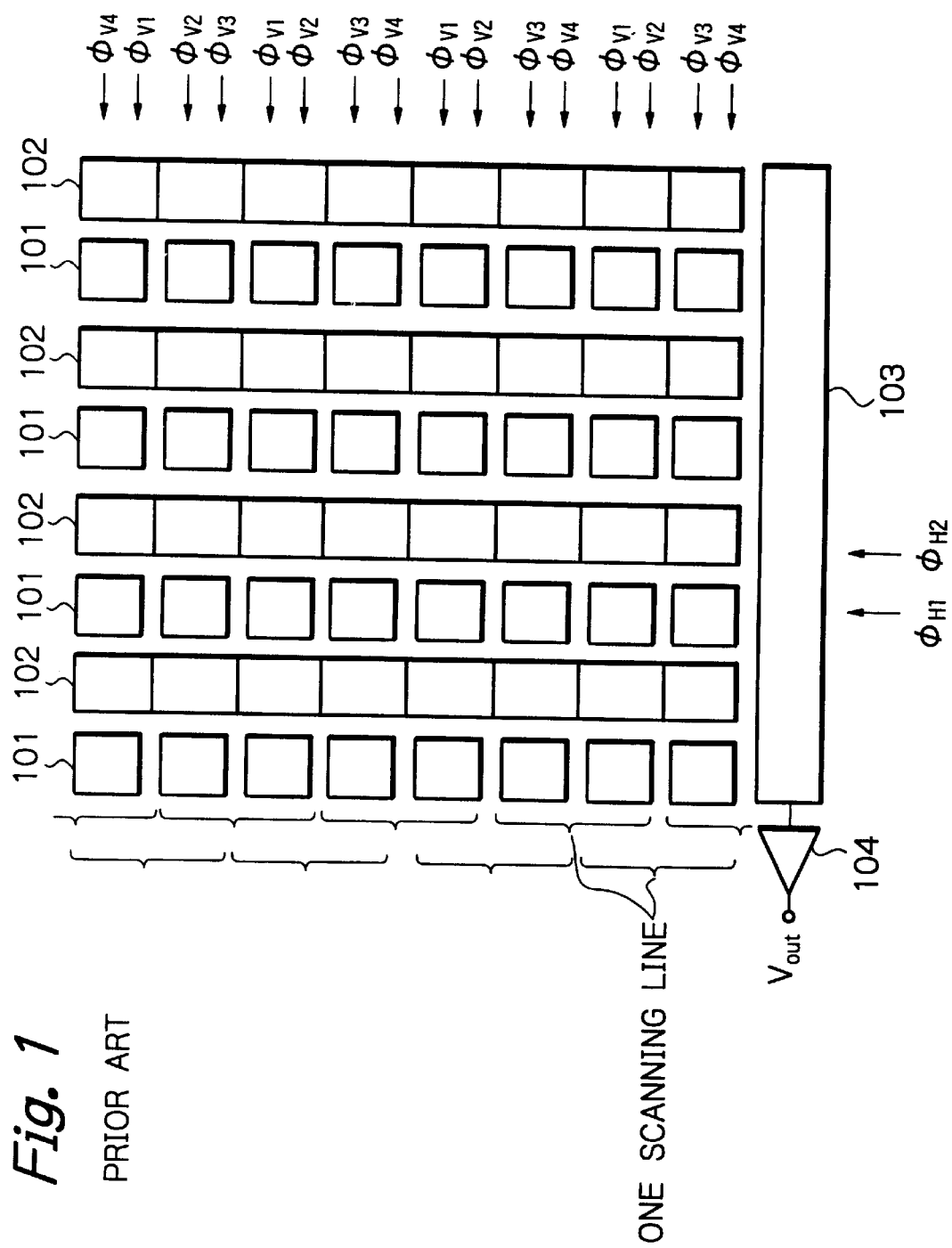
FIG. 1 is a plan view illustrating a prior art CCD type solid state image pickup device.

In FIG. 1, which is a plan view illustrating a prior art CCD type solid state image pickup device, light is incident to two-dimensionally arranged photo/electro conversion portions 101 formed by photo diodes, and as a result, signal charges obtained by the photo/electro conversion portions 101 are transferred to vertical shift registers 102. The signal charges are further transferred via a horizontal output register 103 to a signal charge output register 104 which generates an output voltage $V_{out}$. The vertical shift registers 102 are operated by four-phase transfer pulse signals $\phi_{v1}$, $\phi_{v2}$, $\phi_{v3}$ and $\phi_{v}$, and the horizontal output register 103 is operated by two-phase phase transfer pulse signals $\phi_{H1}$ and $\phi_{H2}$.

In FIG. 1, note that every two rows of the photo/electro conversion portions 101 form one scanning line.

Figure 2:
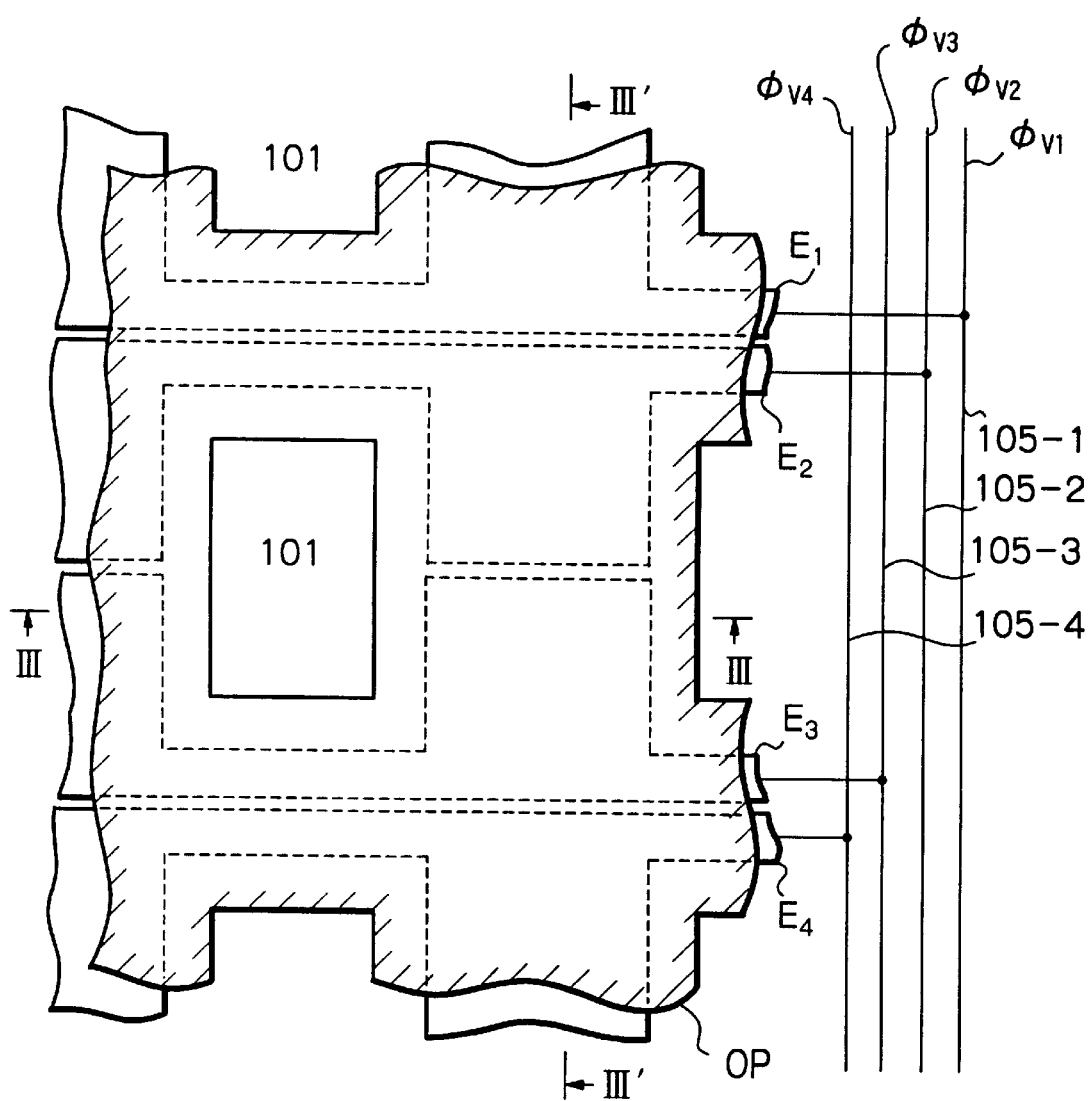
FIG. 2 is a partial plan view of the device of FIG. 1.

In FIG. 2, which is a partially enlarged plan view of the device of FIG. 1, transfer electrodes $E_1$, $E_2$, $E_3$ and $E_4$ made of polycrystalline silicon are provided for each two columns of the photo/electro conversion portions 101. In this case, the transfer electrodes $E_1$ and $E_3$ also serve as read gates for read gate regions, which will be explained later.

Also, four bus lines 105-1, 105-2, 105-3 and 105-4 made of aluminum are provided and connected to the transfer electrodes $E_1$, $E_2$, $E_3$ and $E_4$, respectively. Transfer pulse signals $\phi v_1$, $\phi_{v2}$, $\phi_{v3}$ and $\phi_{v4}$ are supplied to the bus lines 105-1, 105-2, 105-3 and 105-4, respectively.

Further, an optical shield layer OP having openings for the photo/electro conversion regions 101 is formed on the charge transfer electrodes $E_1$, $E_2$, $E_3$ and $E_4$.

The device of FIG. 2 is explained next in detail with reference to FIGS. 3A and 3B, which are cross-sectional views taken along the lines III—III and III'—III', respectively.

Figure 3A:
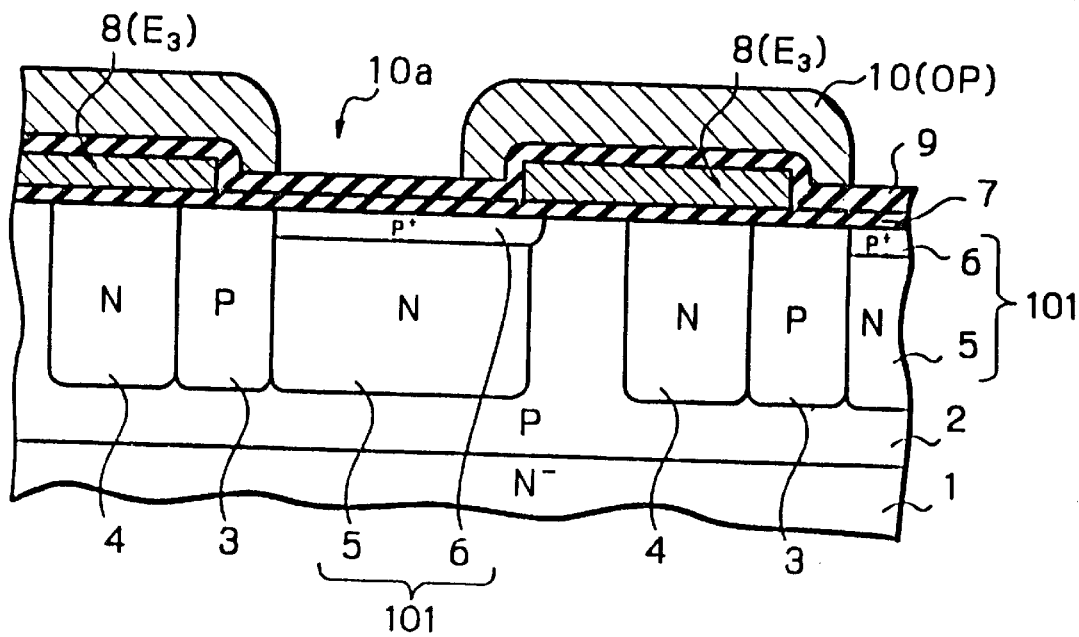
FIGS. 3A and 3B are cross-sectional views of the device of FIG. 2.
Figure 3B:
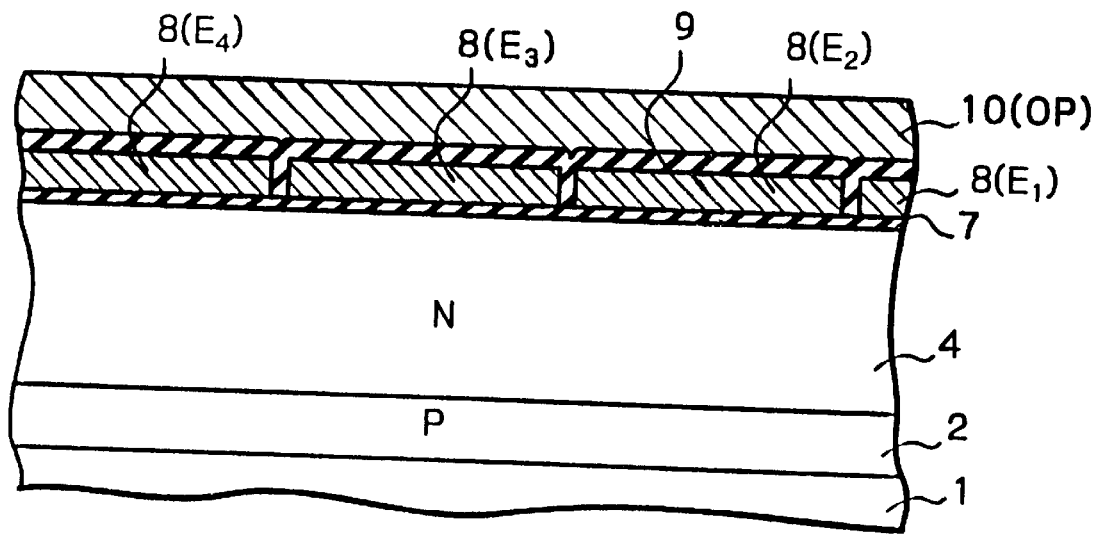

In FIGS. 3A and 3B, reference numeral 1 designates an N$^-$-type monocrystalline silicon substrate on which a P-type well 2 is formed. Also, a P-type isolation region 3, an N-type charge transfer region 4, an N-type impurity diffusion region 5 and a P$^+$-type impurity diffusion region 6 are formed within the P-type well 2. In this case, the N-type impurity diffusion region 5 and the P$^+$-type impurity diffusion region 6 form a diode, i.e., one of the photo/electro conversion portions 101 of FIG. 2.

Also, a gate insulating layer 7 is formed on the entire surface. Then, a polycrystalline silicon layer is deposited on the gate insulating layer 7 and is patterned to form the charge transfer gates $E_1$, $E_2$, $E_3$ and $E_4$.

Further, an insulating layer 9 is deposited on the entire surface. Then, a metal layer 10 made of tungsten or aluminum is deposited on the insulating layer 9 and is patterned to perforate openings 10$a$ for the photo/electro conversion portions 101 in the metal layer 10. Thus, the optical shield layer OP is formed.

In the device of FIGS. 1, 2, 3A and 3B, when light is incident to one of the photo/electro conversion portions 101, charges are created therein. Next, when the read gate region between the photo/electro conversion portion 101 and the charge transfer region 4 is reversed by the transfer electrode such as $E_3$, the charges are transferred to the charge transfer region 4. Thereafter, the charges are transferred via the vertical shift registers 102 and the horizontal output register 103 to the signal charge output register 104 of FIG. 1.

When the device is applied to a high vision television camera pickup element having a large number of pixels, the chip of the device needs to be highly-integrated, and also, the speed of charge transfer needs to be increased so as to output signal charges of all the pixels is 1/30 sec or so.

In the device of FIGS. 1, 2, 3A and 3B, the parasitic resistance of the charge transfer electrodes $E_1$, $E_2$, $E_3$ and $E_4$ is considerably large. For example, in a high vision television camera pickup element, if the sheet resistance of polycrystalline silicon is about 30Ω/□, the parasitic resistance of the charge transfer electrode such as $E_3$ at the center position thereof is 150×(2000/2)/2=75 kΩ

Therefore, a time constant determined by the above-mentioned large parasitic resistance and a parasitic capacitance formed by the charge transfer electrode such as $E_3$ and the P$^+$-type impurity region 6 is increased which rounds the waveform of a voltage applied to the center of the charge transfer electrode such as $E_3$, and reduces the charge transfer efficiency.

Figure 4:
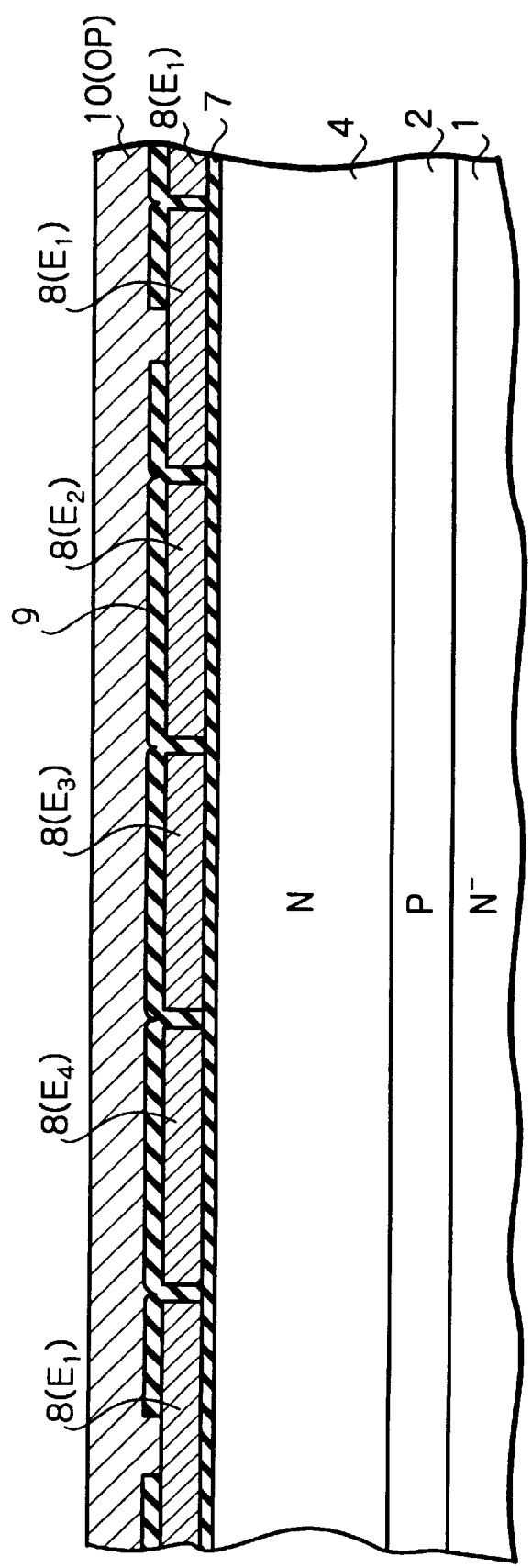
FIG. 4 is a plan view illustrating another prior art CCD type solid state image pickup device.

In order to reduce the parasitic resistance of the charge transfer electrodes, the optical shield layer OP can be connected to the charge transfer electrodes $E_1$, $E_2$, $E_3$ and $E_4$, as illustrated in FIG. 4 (see: K. Orihara et al., "New Shunt Wiring Technologies for High Performance HDTV CCD Image Sensors", IEDM92, pp. 105–108). That is, the metal layer 10 is patterned simultaneously with the formation of the openings 10$a$, so that first, second, third and fourth portions are formed. In this case, the first portion is connected to the charge transfer electrodes $E_1$, the second portion is connected to the charge transfer electrode $E_2$, the third portion is connected to the charge transfer electrodes $E_3$, and the fourth portion is connected to the charge transfer electrode $E_4$.

In the device as illustrated in FIG. 4, however, since the metal layer 10 is patterned into the first, second, third and fourth portions, the metal layer 10 is not sufficient as the optical shield layer OP, so that the optical shield effect is deteriorate which increases smear charges, and causes image defects. In addition, when the number of pixels is increased, the gap among the first, second, third and fourth portions of the metal layer 10 is also very small. For example, this gap is about 0.2 μm. However, since the metal layer 10 is made of tungsten or aluminum, not polycrystalline silicon, it is impossible to form such a 0.2 μm gap in the metal layer 10.

FIGS. 5A, 5B, 6A, 6B, 7A, 7B, 8A, 8B, 9A, 9B, 10A, 10B, 11A and 11B are cross-sectional views for explaining a first embodiment of the CCD type solid state image pickup device according to the present invention.

Note that FIGS. 5A, 6A, 7A, 8A, 9A, 10A and 11A correspond to FIG. 3A, and FIGS. 5B, 6B, 7B, 8B, 9B, 10B and 11B correspond to FIG. 38.

Figure 5A:
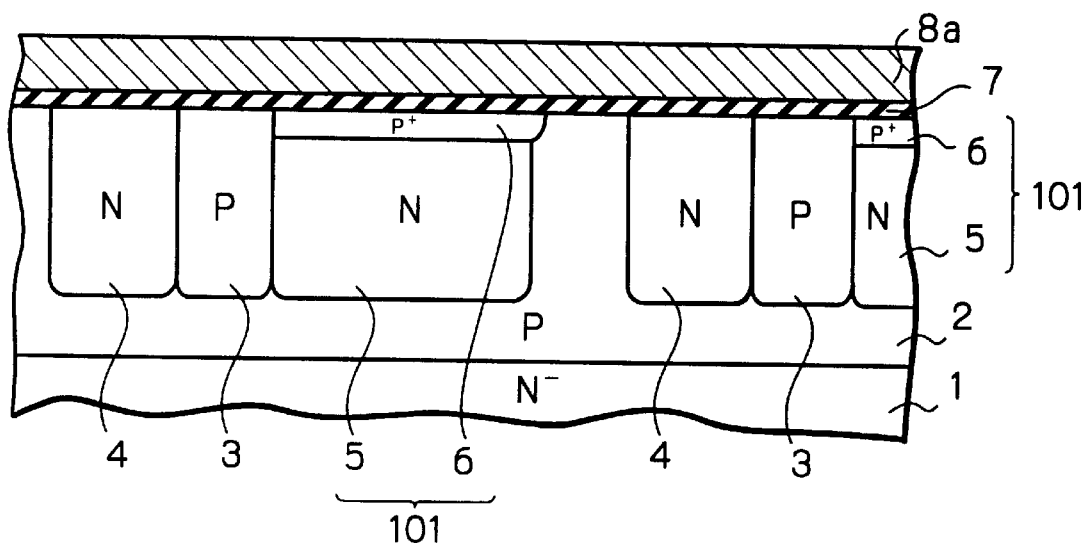
FIGS. 5A, 5B, 6A, 6B, 7A, 7B, 8A, 8B, 9A, 9B, 10A, 10B, 11A and 11B are cross-sectional views for explaining a first embodiment of the CCD type solid state image pickup device according to the present invention.
Figure 5B:
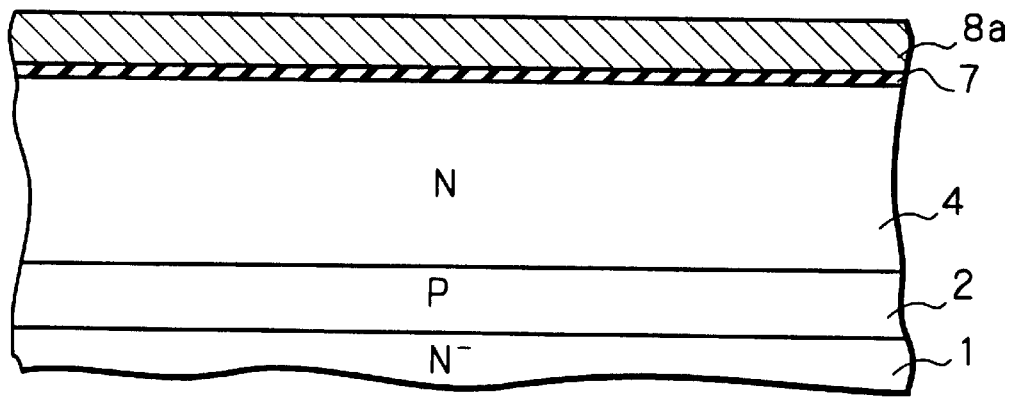

First, referring to FIGS. 5A and 5B, P-type impurities are introduced into an N$^-$-type monocrystalline silicon substrate 1 to form a P-type well 2. Next, a P-type isolation region 3, an N-type charge transfer region 4, an N-type impurity region 5 and a P$^+$-type impurity region 6 are sequentially formed by using an ion implantation method in the P-type well 2. In this case, the N-type impurity diffusion region 5 and the P$^+$-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, an about 0.3 to 0.8 μm thick polycrystalline silicon layer 8$a$ including phosphorus is deposited on the gate insulating layer 7.

Figure 6A:
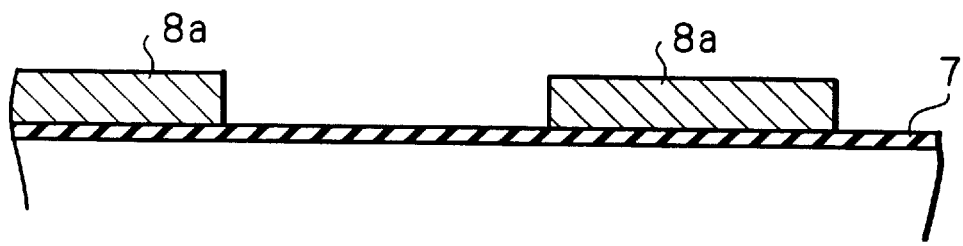
Figure 6B:
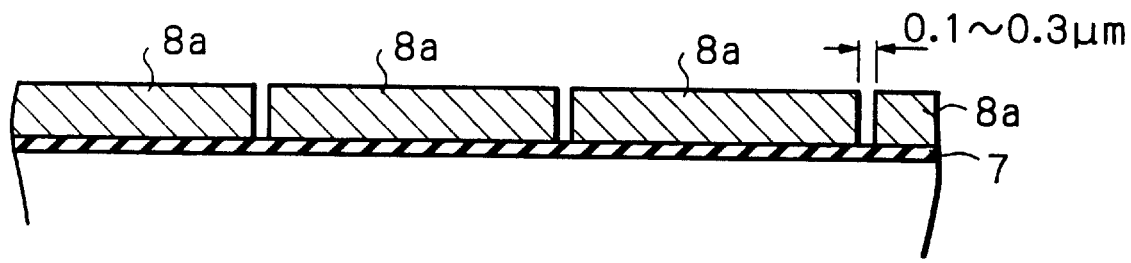

Next, referring to FIGS. 6A and 6B, the polycrystalline silicon layer 8$a$ is patterned by using a photolithography and etching process. In this case, a gap of the patterned polycrystalline silicon layer 8$a$ is about 0.1 to 0.3 μm. Note that boron ions can be introduced through the gap of the polycrystalline silicon layer 8a to reduce the potential gap of the charge transfer region 4. Also, a silicon oxide layer can be deposited before the formation of a photoresist pattern, and the silicon oxide layer is patterned by using the photoresist pattern. In this case, the polycrystalline silicon layer 8a is patterned by using the patterned silicon oxide layer, and thereafter, a silicon oxide layer is again deposited, and is etched back so that a sidewall silicon oxide layer is formed within the gap of the polycrystalline silicon layer 8a.

Figure 7A:
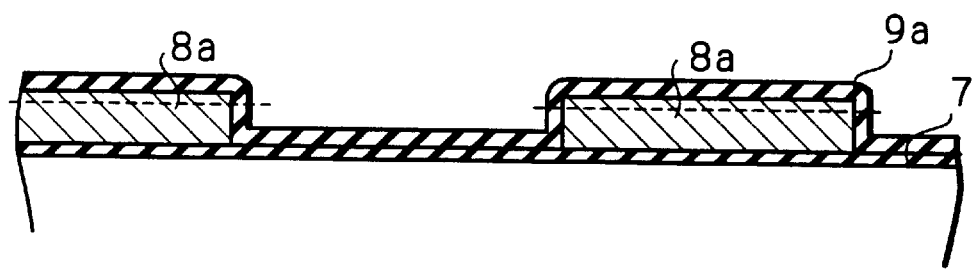
Figure 7B:
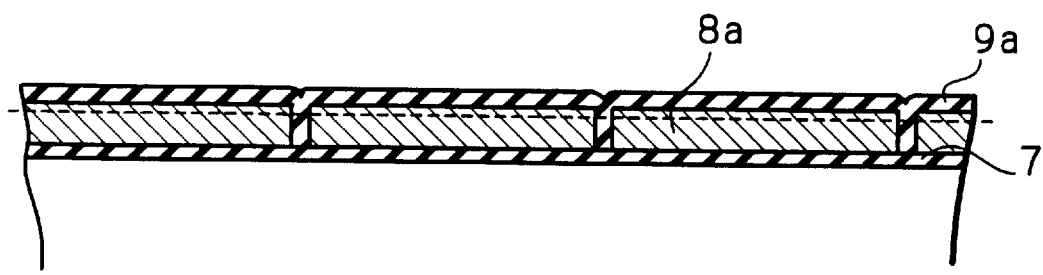

Next, referring to FIGS. 7A and 7B, an insulating layer 9a made of silicon oxide or silicon nitride is deposited on the entire surface, so that the insulating layer 9a is completely buried in the gap of the polycrystalline silicon layer 8a.

Figure 8A:
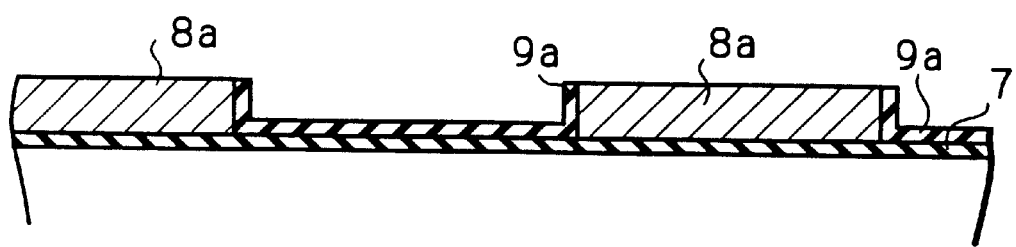
Figure 8B:
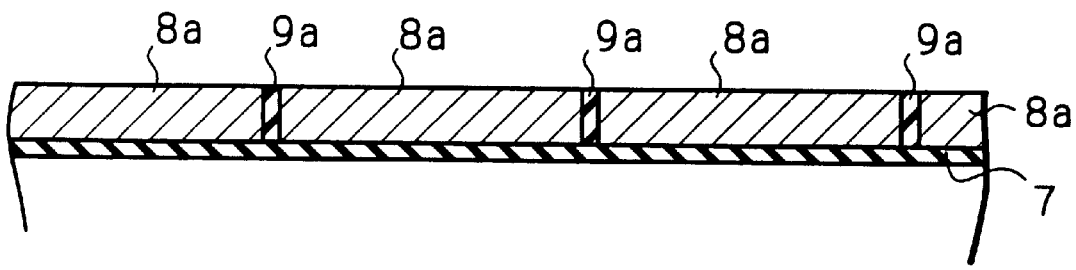

Next, referring to FIGS. 8A and 8B, the insulating layer 9a is removed by a chemical mechanical polishing (CMP) process, until the polycrystalline silicon layer 8a is exposed. In this case, a part of the upper portion of the polycrystalline silicon layer 8a as indicated by a dot line in FIGS. 7A and 7B is also removed.

Figure 9A:
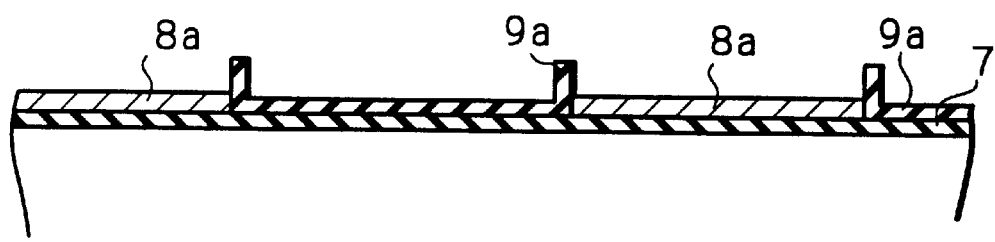
Figure 9B:
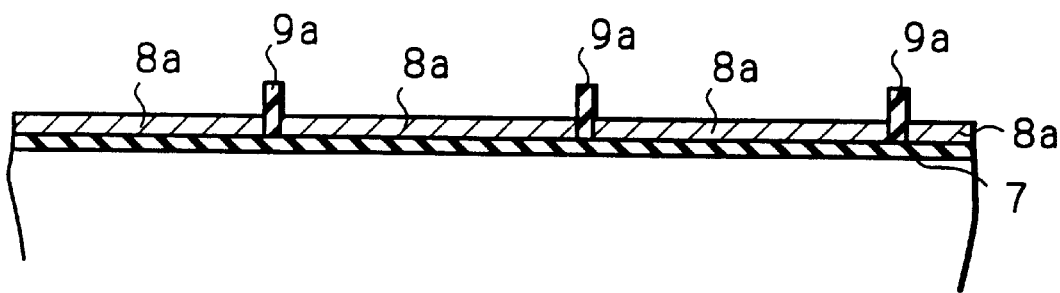

Next, referring to FIGS. 9A and 9B, the upper portion of the polycrystalline silicon layer 8a is etched by using dilute nitric acid. In this case, if the polycrystalline silicon layer 8a before the etching is 0.6 µm, the etching amount is 3500 Å and accordingly, the remaining polycrystalline silicon layer 8a is 2500 Å thick.

Figure 10A:
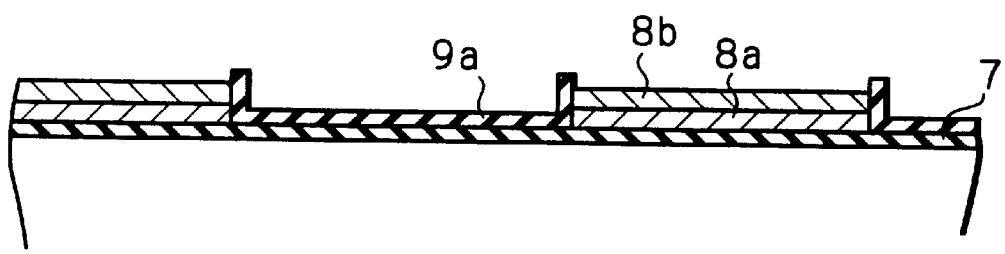
Figure 10B:
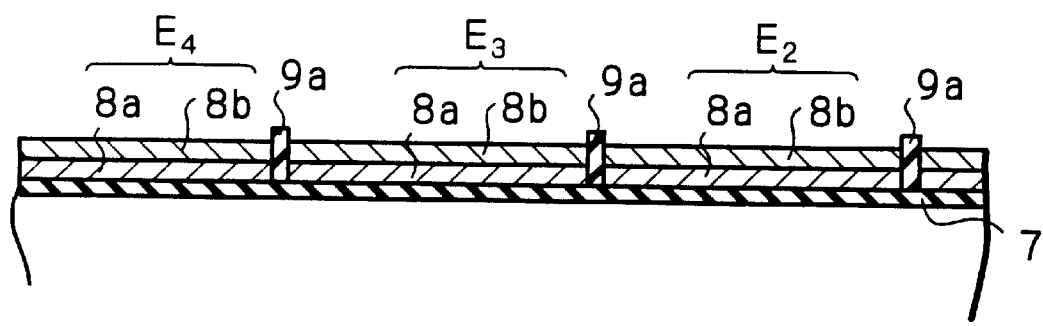

Next, referring to FIGS. 10A and 10B, a metal layer 8b made of aluminum or refractory metal such as tungsten is selectively grown only on the polycrystalline silicon layer 8a. In this case, the upper surface of the metal layer 8b is made lower than the top of the insulating layer 9a. Therefore, the charge transfer electrodes $E_1$, $E_2$, $E_3$ and $E_4$ formed by the polycrystalline silicon layer 8a and the metal layer 8b are electrically isolated from each other.

Figure 11A:
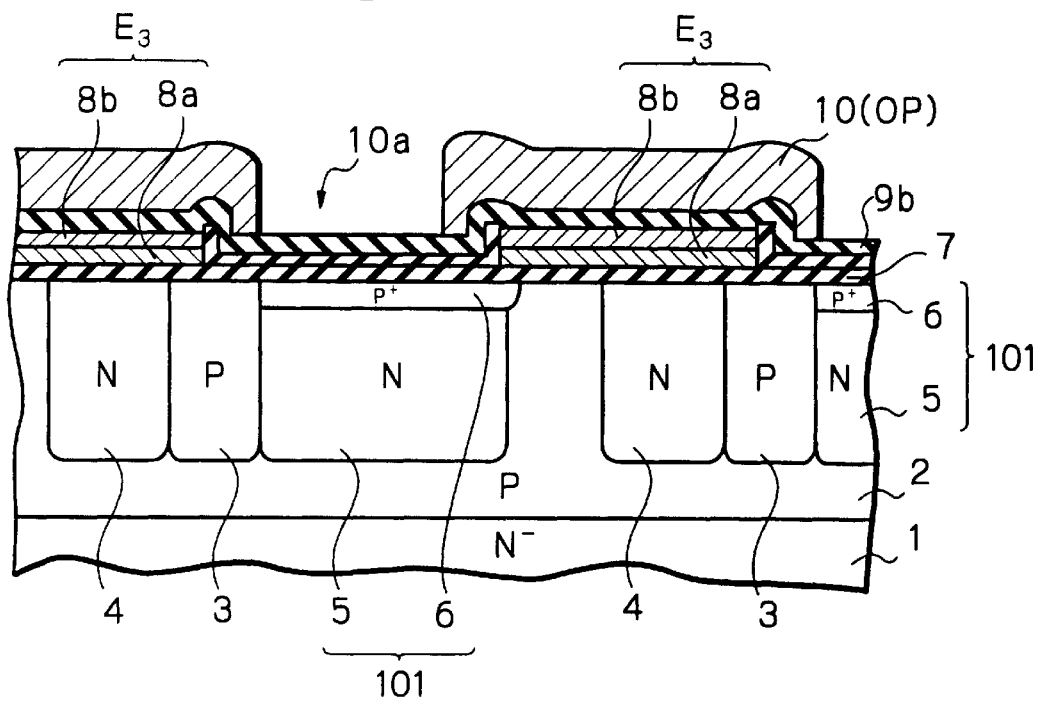
Figure 11B:
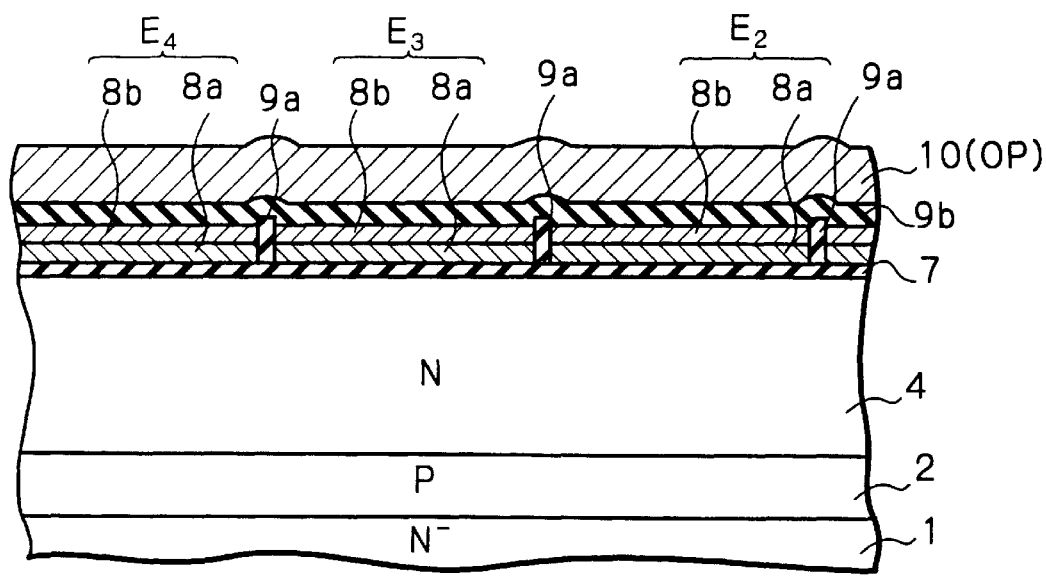

Finally, referring to FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

In the first embodiment as shown in FIGS. 5A, 5B, 6A, 6B, 7A, 7B, 8A, 8B, 9A, 9B, 10A, 10B, 11A and 11B, if the metal layer 9b is 0.4 µm thick, the resistance is about several tens of mΩ for aluminum and about several hundreds of mi for tungsten. Note that the resistance of 0.4 µm thick polycrystalline silicon is several tens of Ω. Therefore, the parasitic resistance of the charge transfer electrodes $E_1$, $E_2$, $E_3$ and $E_4$ can be remarkably reduced.

Figure 12A:
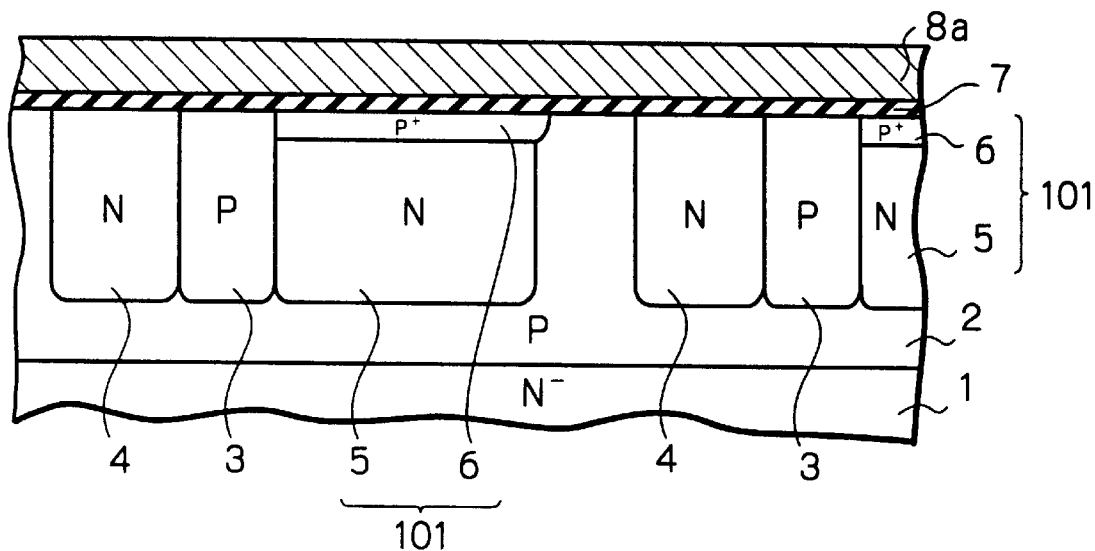
FIGS. 12A, 12B, 13A, 13B, 14A, 14B, 15A, 15B, 16A, 16B, 17A, 17B, 18A and 18B are cross-sectional views for explaining a second embodiment of the CCD type solid state image pickup device according to the present invention.
Figure 12B:
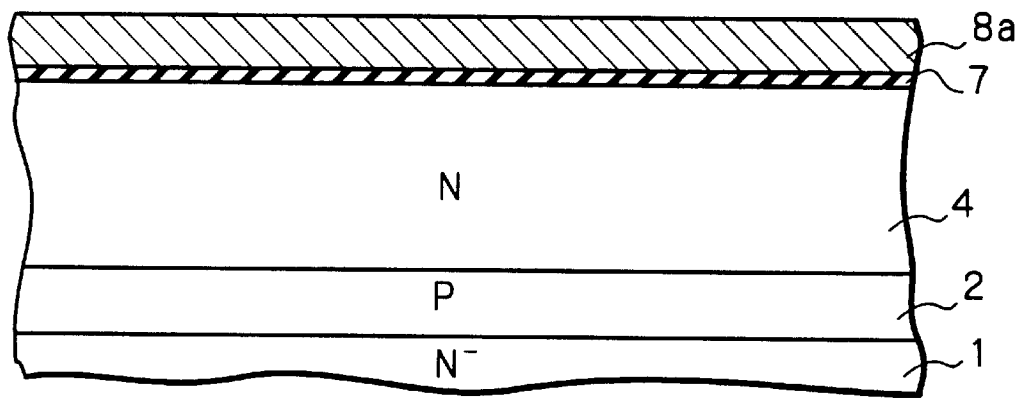

FIGS. 12A, 12B, 13A, 13B, 14A, 14B, 15A, 15B, 16A, 16B, 17A, 17B, 18A and 18B are cross-sectional views for explaining a second embodiment of the CCD type solid state image pickup device according to the present invention. Note that FIGS. 12A, 12B, 13A, 13B, 14A, 14B, 15A, 15B, 16A, 16B, 17A, 17B, 18A and 18B correspond to FIGS. 5A, 6A, 7A, 8A, 9A, 10A and 11A; respectively, First, referring to FIGS. 12A and 12B, in the same way as in FIGS. 5A and 5B, P-type impurities are introduced into an $N^-$-type monocrystalline silicon substrate 1 to form a P-type well 2. Next, a P-type isolation region 3, an N-type charge transfer region 4, an N-type impurity region 5 and a $P^+$-type impurity region 6 are sequentially formed by using ion implantation method in the P-type well 2. In this case, the N-type impurity diffusion region 5 and the $P^+$-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, an about 0.3 to 0.8 µm thick polycrystalline silicon layer 8a including phosphorus is deposited on the gate insulating layer 7.

Figure 13A:
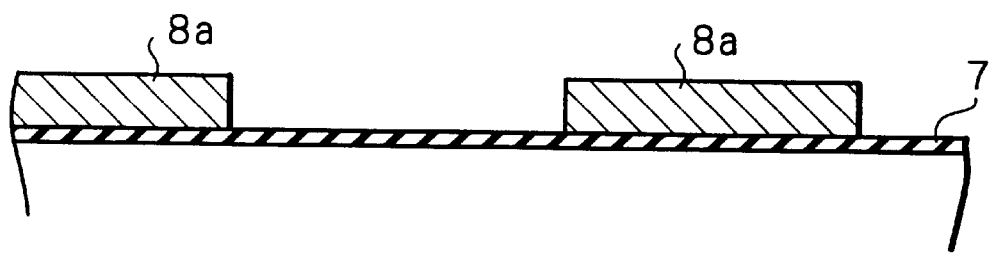
Figure 13B:
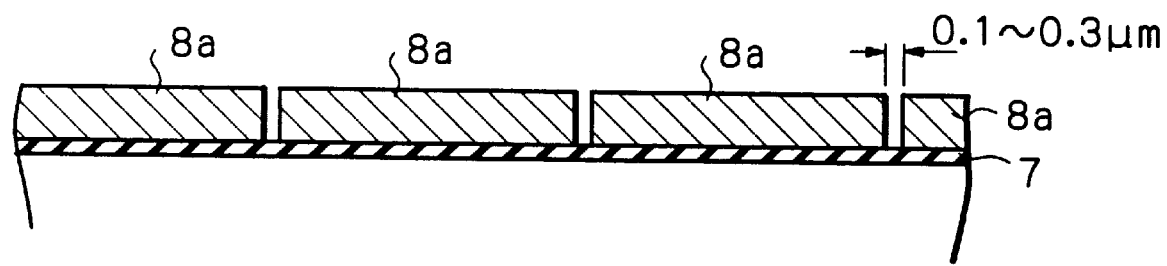

Next, referring to FIGS. 13A and 13B, in the same way as in FIGS. 6A and 6B, the polycrystalline silicon layer 8a is patterned by using a photolithography and etching process. In this case, a gap of the patterned polycrystalline silicon layer 8a is about 0.1 to 0.3 µm. Note that boron ions can be introduced through the gap of 8a to reduce the potential gap of the charge transfer region 4. Also, a silicon oxide layer can be deposited before the formation of a photoresist pattern, and the silicon oxide layer is then patterned by using the photoresist pattern. In this case, the polycrystalline silicon layer 8a is patterned by using the patterned silicon oxide layer, and thereafter, a silicon oxide layer is again deposited, and is etched so that silicon oxide layer is formed within the gap of the polycrystalline silicon layer 8a.

Figure 14A:
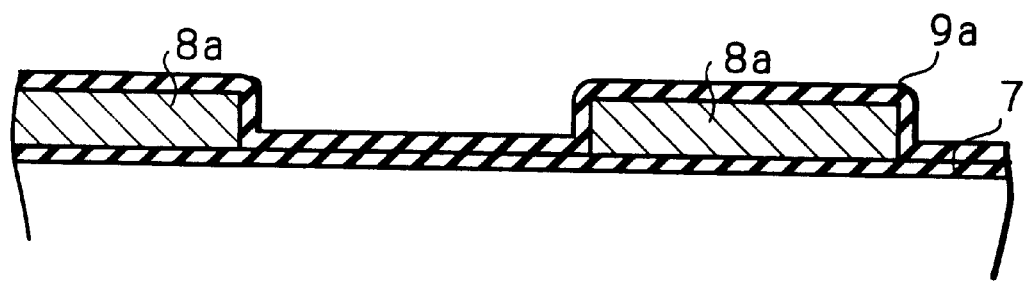
Figure 14B:
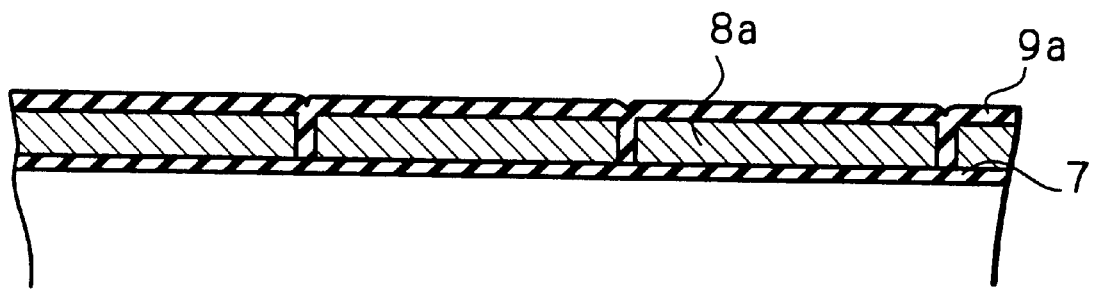

Next, referring to FIGS. 14A and 14B, in the same way as in FIGS. 7A and 7B, an insulating layer 9a made of silicon oxide or silicon nitride is deposited on the entire surface, so that the insulating layer 9a is completely buried in the gap of the, polycrystalline silicon layer 8a.

Figure 15A:
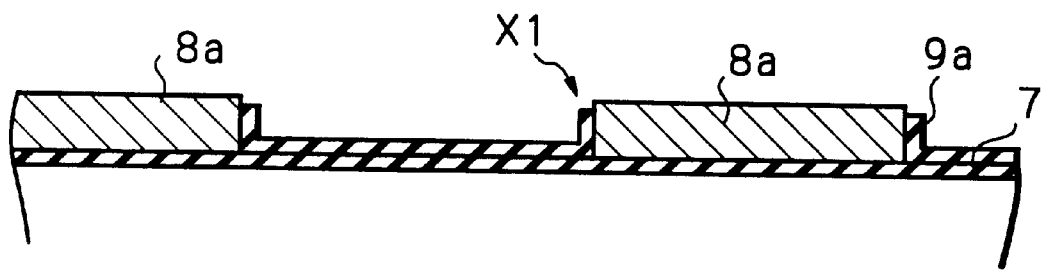
Figure 15B:
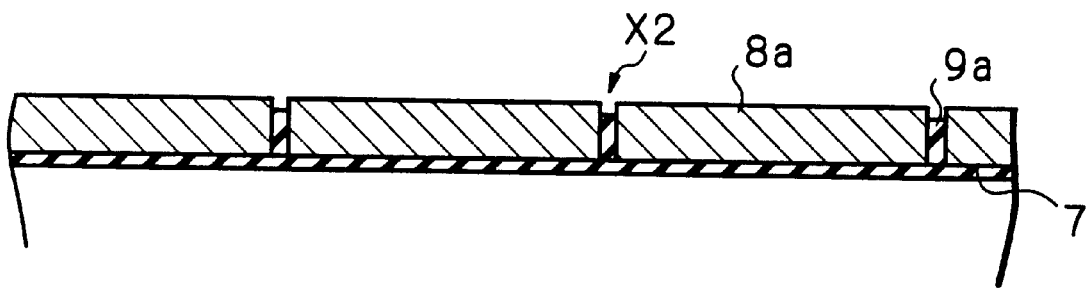

Next, referring to FIGS. 15A and 15B, the insulating layer 9a is etched back by using an anisotropic etching process, so that the insulating layer 9a on the polycrystalline silicon layer 9a is completely removed. In this case, since the etching rate fluctuates within each wafer, within a batch of wafers and within batches of wafers, the insulating layer 9a is preferably a little over etched indicated by X1 and X2 in FIGS. 15A and 15B. Also, the gate insulating layer 7 is a little etched as illustrated in FIG. 15A. However, if the gate insulating layer 7 is made of silicon oxide and the insulating layer 9a is made of silicon nitride, the etching ratio therebetween can be greatly different from 1, so that the gate insulating layer 7 can hardly be etched.

Figure 16A:
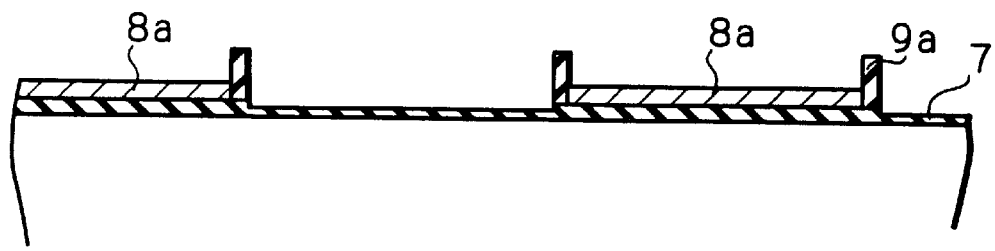
Figure 16B:
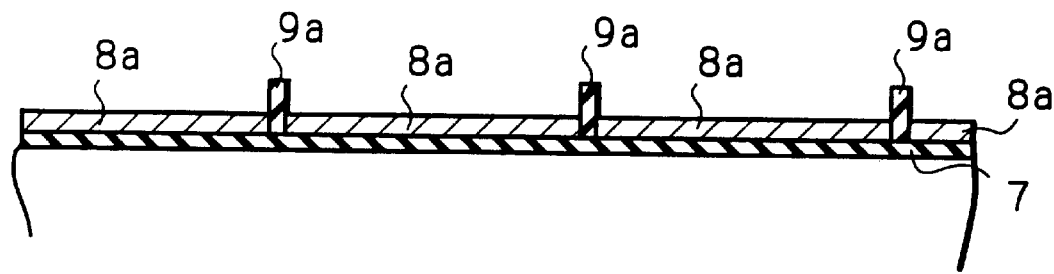

Next, referring to FIGS. 16A and 16B, in the same way as in FIGS. 9A and 9B, the upper portion of the polycrystalline silicon layer 8a is etched by using dilute nitric acid. In this case, if the polycrystalline silicon layer 8a before the etching is 0.6 µm, the etching amount is 3500 Å and accordingly, the remaining polycrystalline silicon layer 8a is 2500 Å thick.

Figure 17A:
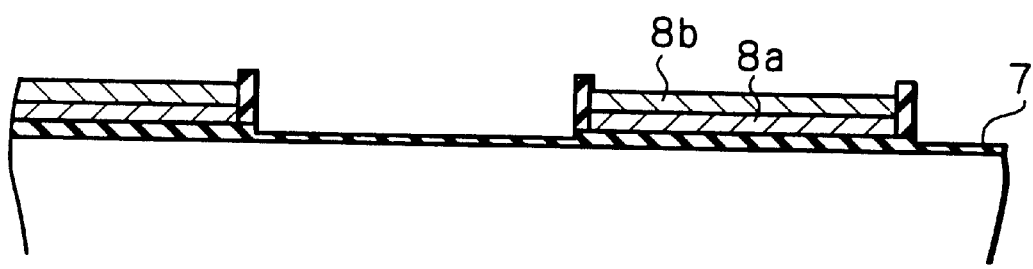
Figure 17B:
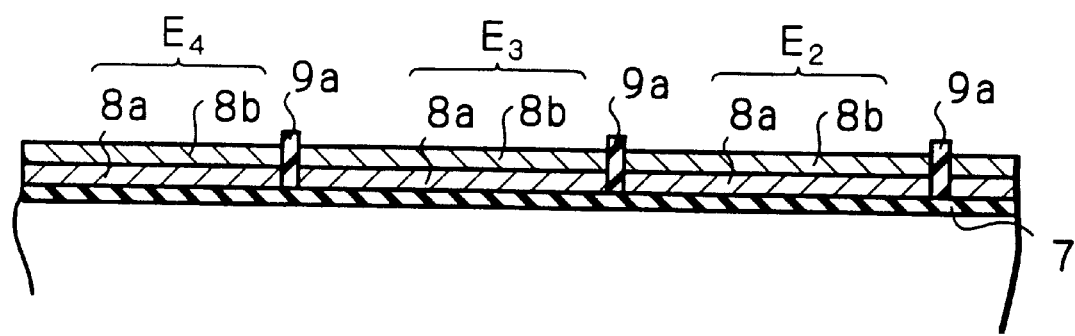

Next, referring to FIGS. 17A and 17B, in the same way as in FIGS. 10A and 10B, a metal layer 8b made of aluminum or refractory metal such as tungsten is selectively grown only on the polycrystalline silicon layer 8a. In this case, the upper surface of the metal layer 8b is made lower than the top of the insulating layer 9a. Therefore, the charge transfer electrodes $E_1$, $E_2$, $E_3$ and $E_4$ formed by the polycrystalline silicon layer 8a and the metal layer 8b are electrically isolated from each other.

Figure 18A:
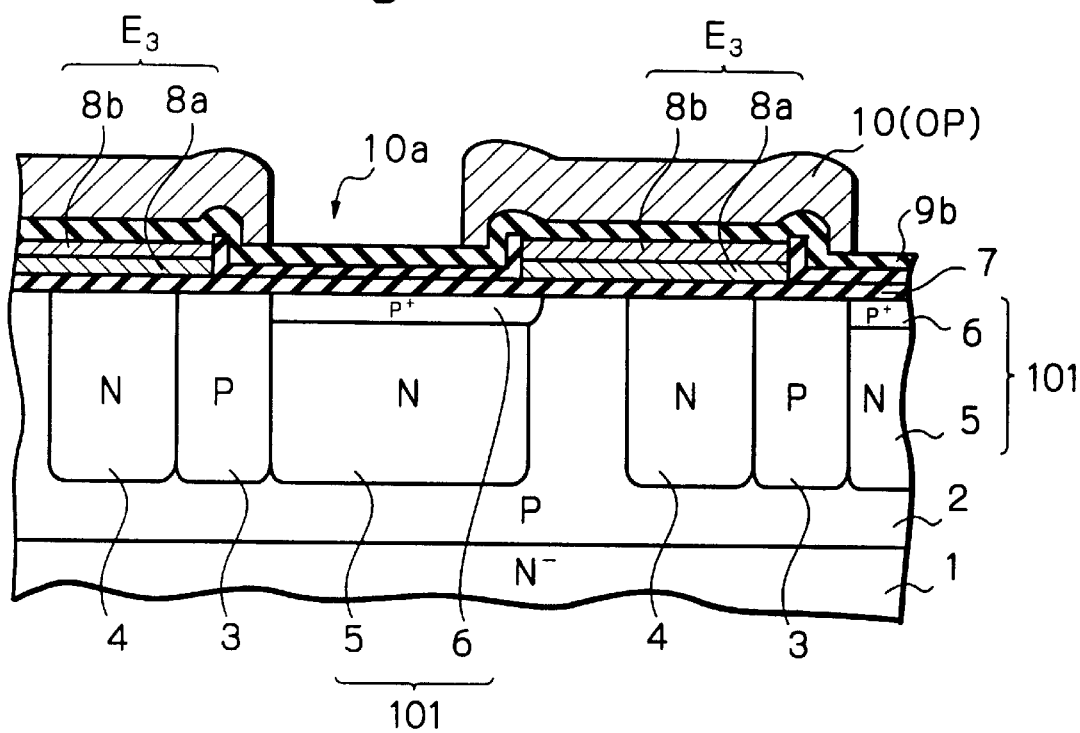
Figure 18B:
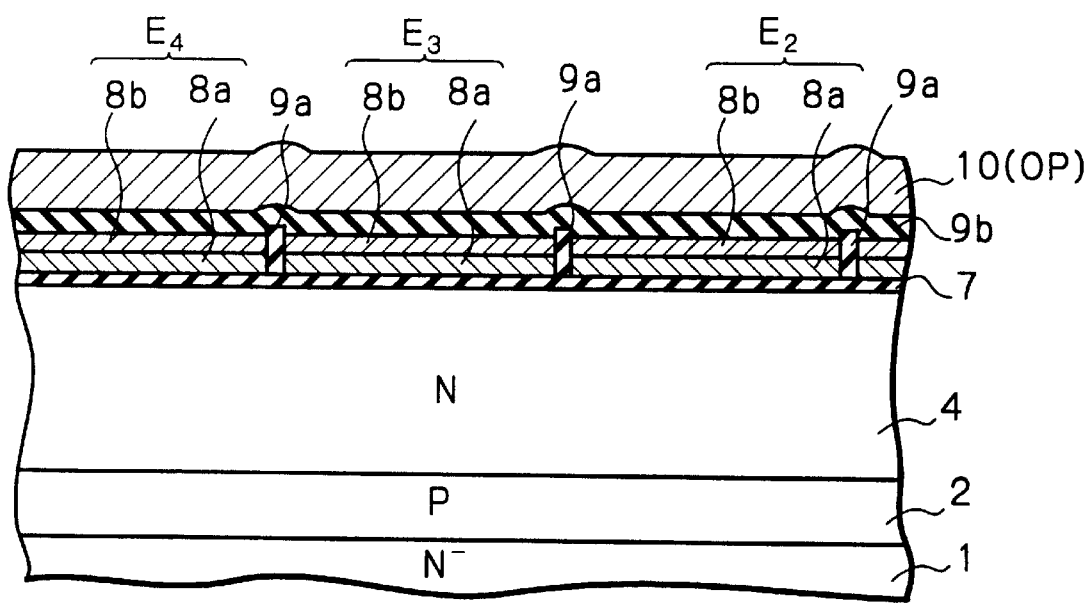

Finally, referring to FIGS. 18A and 18B, in the same way as in FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

Even in the second embodiment as shown in FIGS. 12A, 12B, 13A, 13B, 14A, 14B, 15A, 15B, 16A, 16B, 17A, 17B, 18A and 18B, the parasitic resistance of the charge transfer electrodes $E_1$, $E_2$, $E_3$ and $E_4$ can be remarkably reduced.

FIGS. 19A, 19B, 20A, 20B, 21A, 21B, 22A, 22B, 23A, 23B, 24A, 24B, 25A, 25B, 26A and 26B are cross-sectional views for explaining a third embodiment of the CCD type solid state image pickup device according to the present invention. Note that FIGS. 19A, 19B correspond to FIGS. 5A and 5B, respectively. FIGS. 24A, 24B, 25A, 25B, 26A and 26B correspond to FIGS. 8A, 8B, 9A, 9B, 10A, 10B, 11A and 11B, respectively. Further, FIG. 22C is a plan view of the polycrystalline silicon layers of FIGS. 22A and 22B, and FIG. 23C is a plan view of the polycrystalline silicon layers of FIGS. 23A and 23B.

Figure 19A:
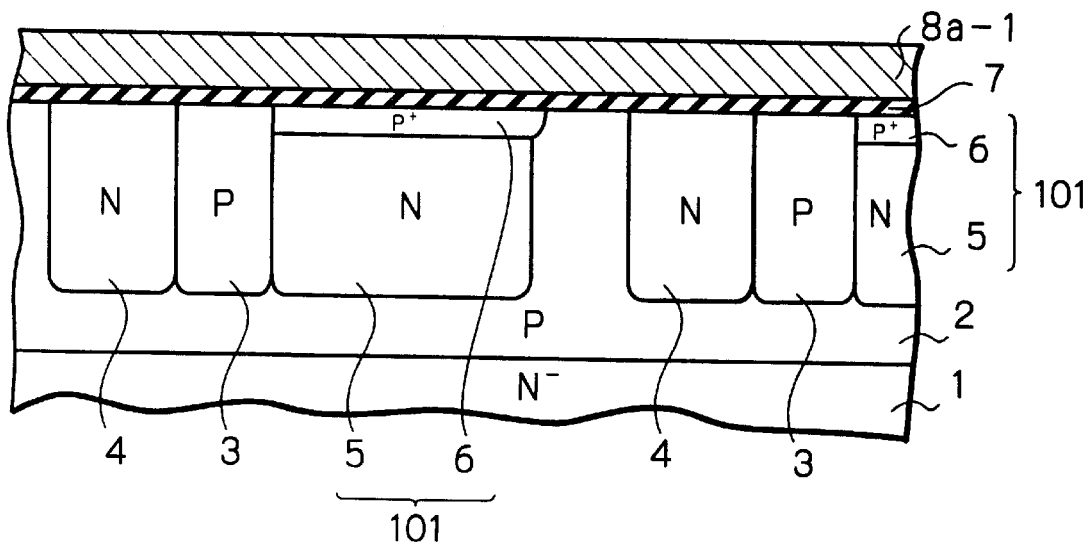
FIGS. 19A, 19B, 20A, 20B, 21A, 21B, 22A, 22B, 23A, 23B, 24A, 24B, 25A, 25B, 26A and 26B are cross-sectional views for explaining a third embodiment of the CCD type solid state image pickup device according to the present invention.
Figure 19B:
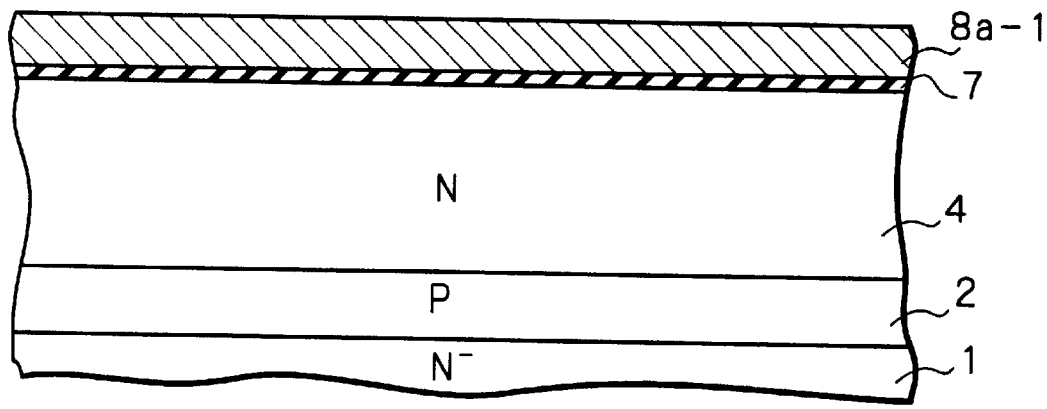

First, referring to FIGS. 19A and 19B, in the same way as in FIGS. 5A and 5B, P-type impurities are introduced into a N⁻-type monocrystalline silicon substrate 1 to form a P-type well 2. Next, a P-type isolation region 3, an N-type charge transfer region 4, an N-type impurity region 5 and a P⁺-type impurity region 6 are sequentially formed by using an ion implantation method in the P-type well 2. In this case, the N-type impurity diffusion region 5 and the P⁺-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, an about 0.3 to 0.8 μm thick polycrystalline silicon layer 8a-1 is deposited on the gate insulating layer 7.

Figure 20A:
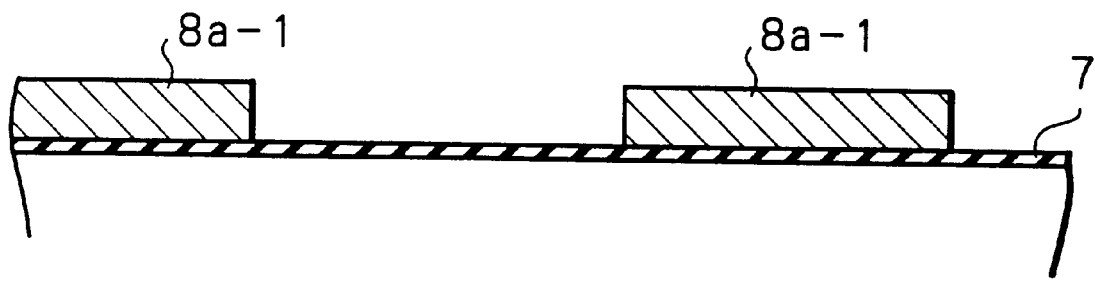
Figure 20B:
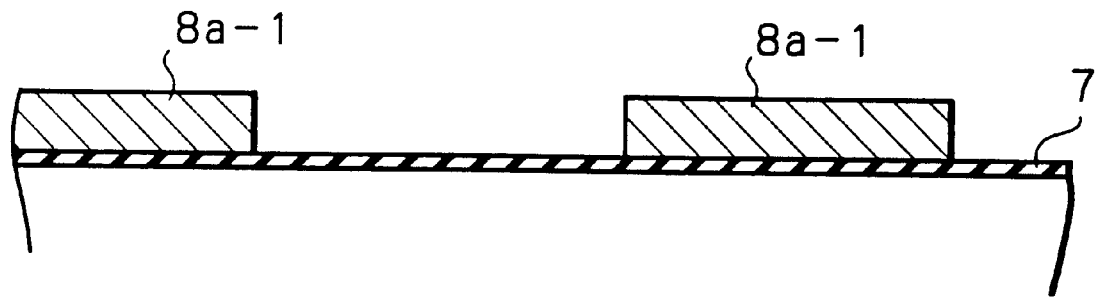

Next, referring to FIGS. 20A and 20B, the polycrystalline silicon layer 8a-1 is patterned by using a photolithography and etching process.

Figure 21A:
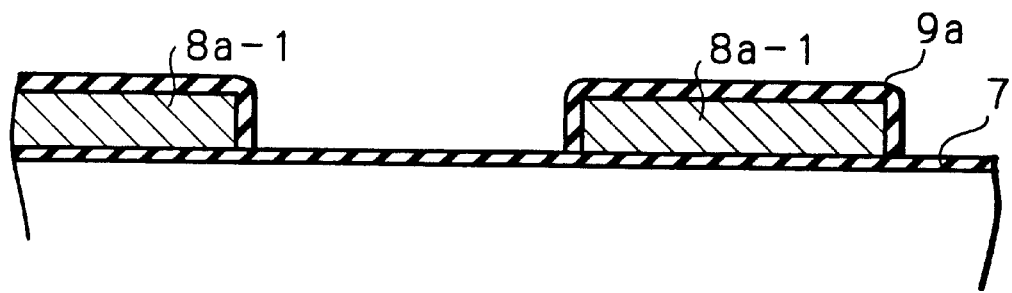
Figure 21B:
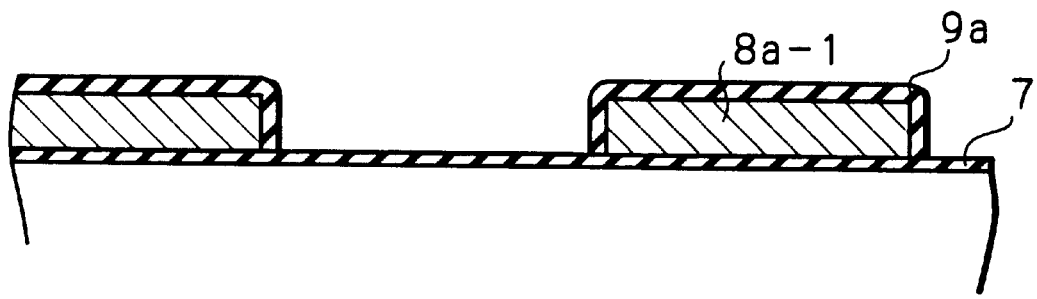
Figure 22A:
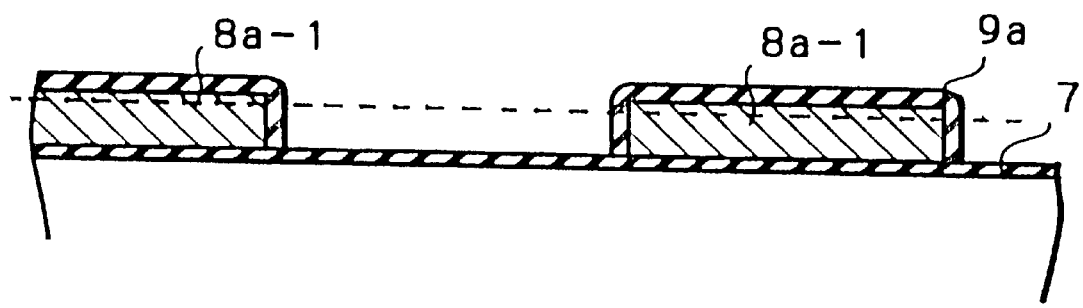
Figure 22B:
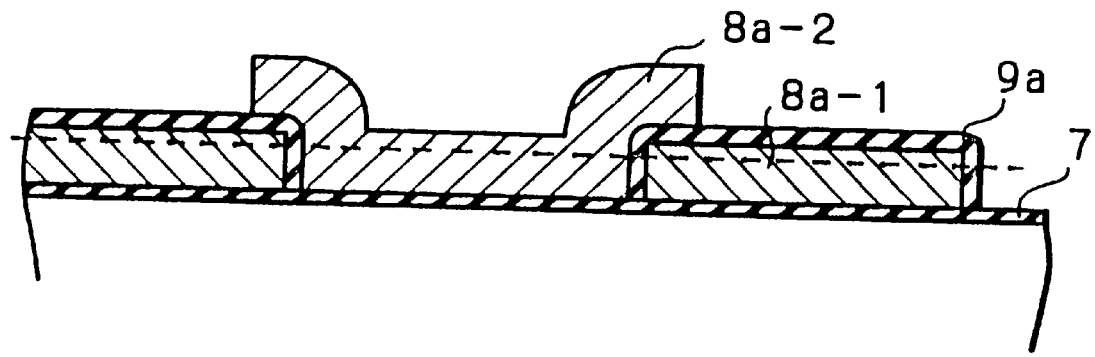
Figure 22C:
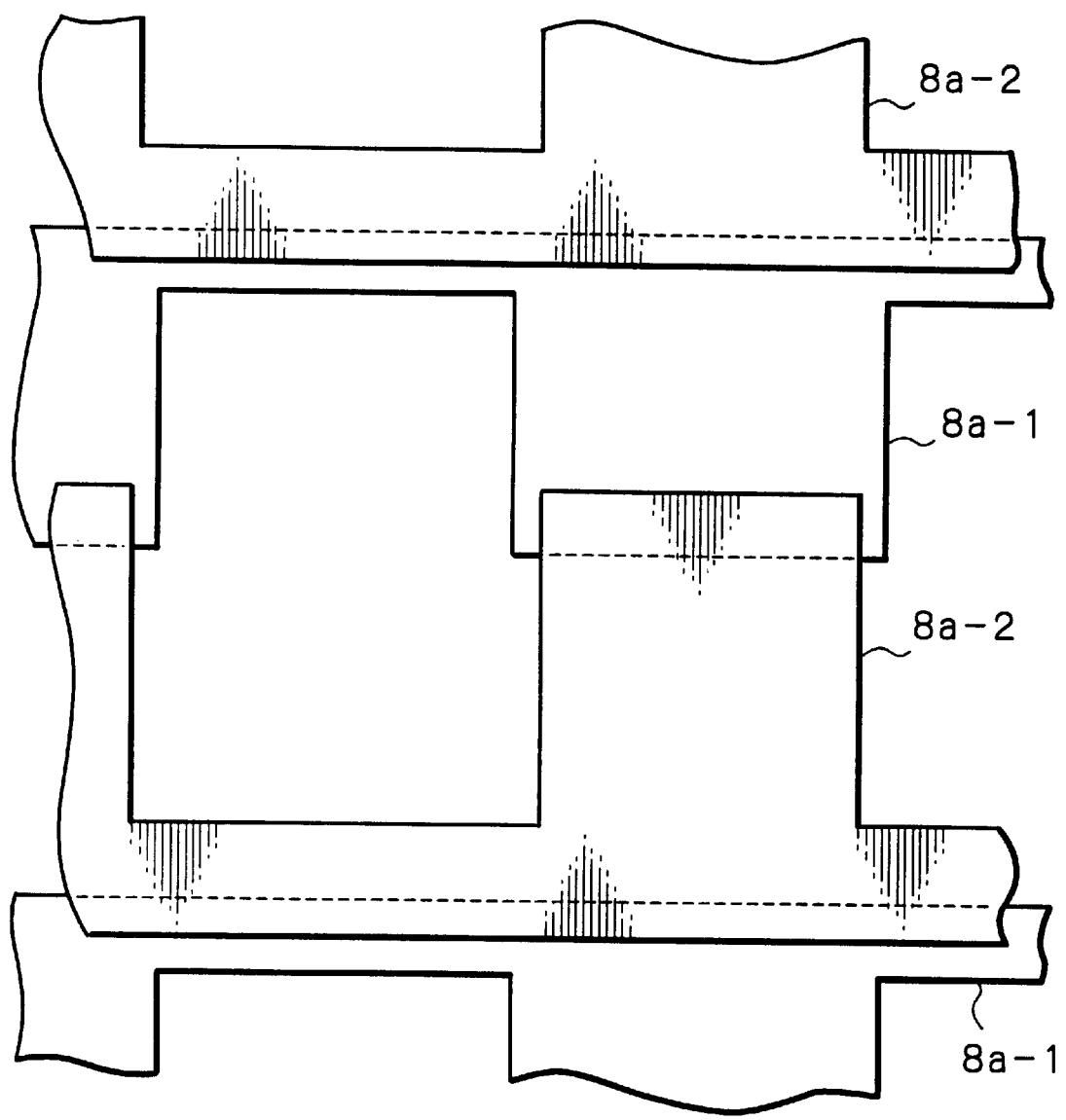
FIG. 22C is a plan view of the polycrystalline silicon layers of FIGS. 22A and 22B.

Next, referring to FIGS. 21A and 21B, an about 500 to 3000 Å thick insulating layer 9a made of silicon oxide or silicon nitride is thermally grown on the polycrystalline silicon layer 8a-1. Note that the insulating layer 9a can be deposited on the entire surface by a chemical vapor deposition (CVD) process.

Next, referring to FIGS. 22A, 22B and 22C, an about 0.3 to 0.8 μm thick polycrystalline silicon layer 8a-2 including phosphorus is deposited on the gate insulating layer 7. Then, the polycrystalline silicon layer 8a-2 is patterned by a photolithography and etching process. In this case, as illustrated in FIG. 22C, the polycrystalline silicon layer 8a-2 is formed partly on the polycrystalline silicon layer 8a-1.

Figure 23A:
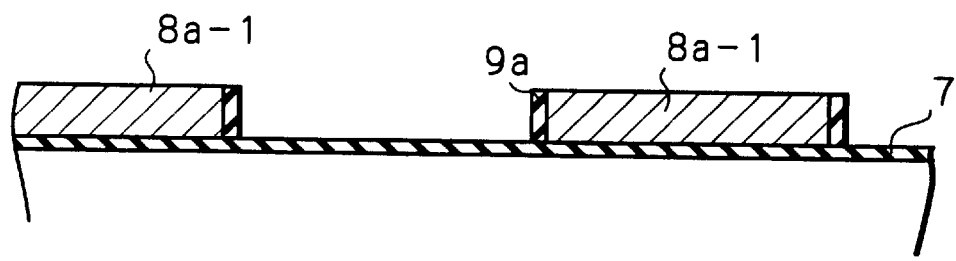
Figure 23B:
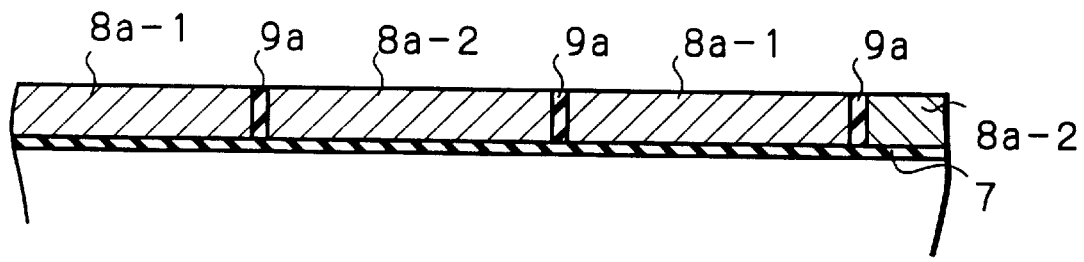
Figure 23C:
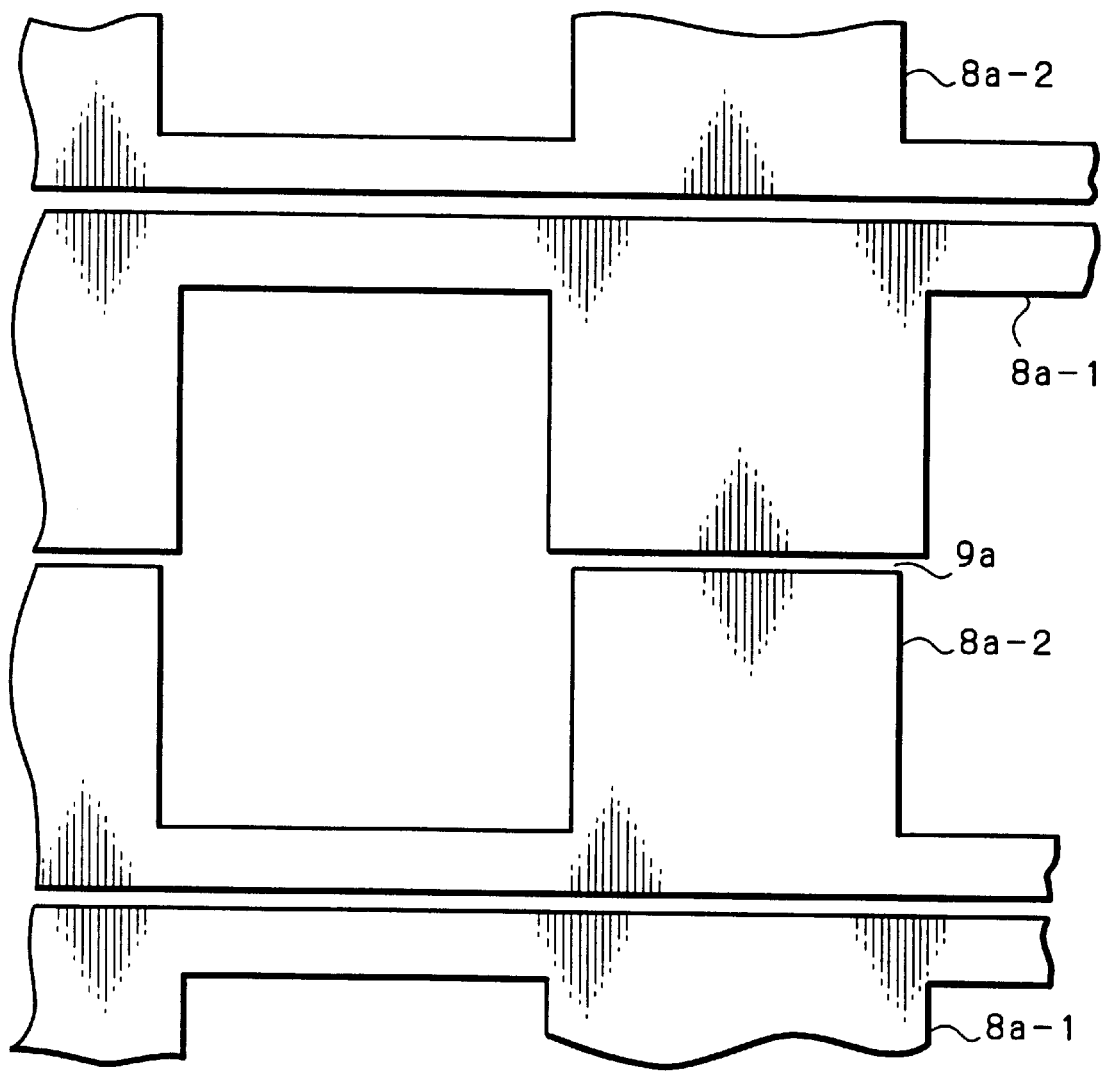
FIG. 23C is a plan view of the polycrystalline silicon layers of FIGS. 23A and 23B.

Next, referring to FIGS. 23A, 23B and 23C, parts of the polycrystalline silicon layer 8a-2 and the insulating layer 9a are removed by a CMP process, until the polycrystalline silicon layer 8a-1 is exposed. In this case, a part of the upper portion as indicated by a dot line in FIGS. 23A and 23B is also removed. As a result, as illustrated in FIGS. 23B and 23C, the insulating layer 9a is completely buried in the gap between the polycrystalline silicon layers 8a-1 and 8a-2.

Figure 24A:
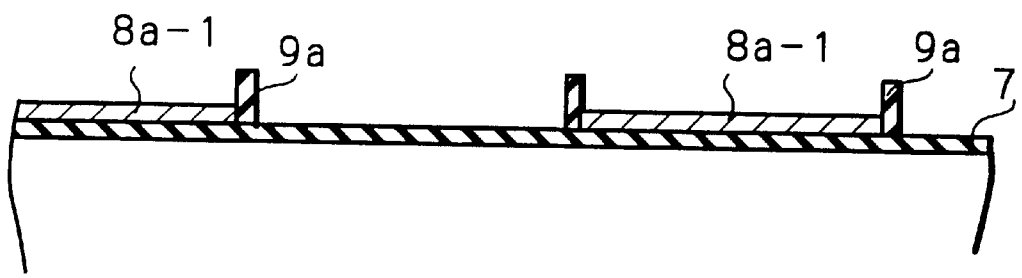
Figure 24B:
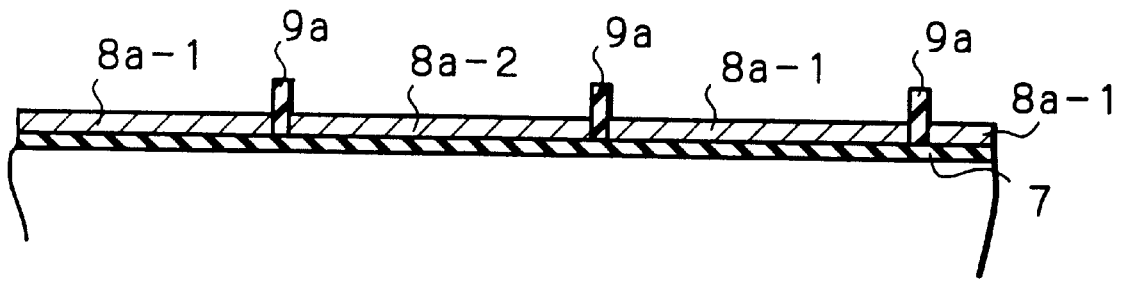

Next, referring to FIGS. 24A and 24B, in the same way as in FIGS. 9A and 9B, the upper portion of the polycrystalline silicon layers 8a-1 and 8a-2 are etched by using dilute nitric acid. In this case, if the polycrystalline silicon layers 8a-1 and 8a-2 before the etching is 0.6 μm, the etching amount is 3500 Å and accordingly, the remaining polycrystalline silicon layers 8a-1 and 8a-2 are 2500 Å thick.

Figure 25A:
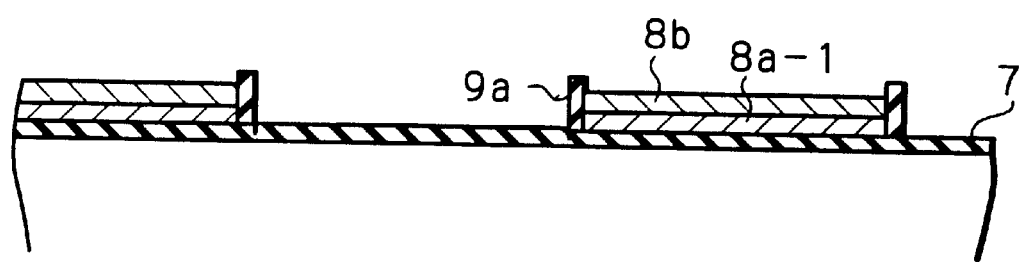
Figure 25B:
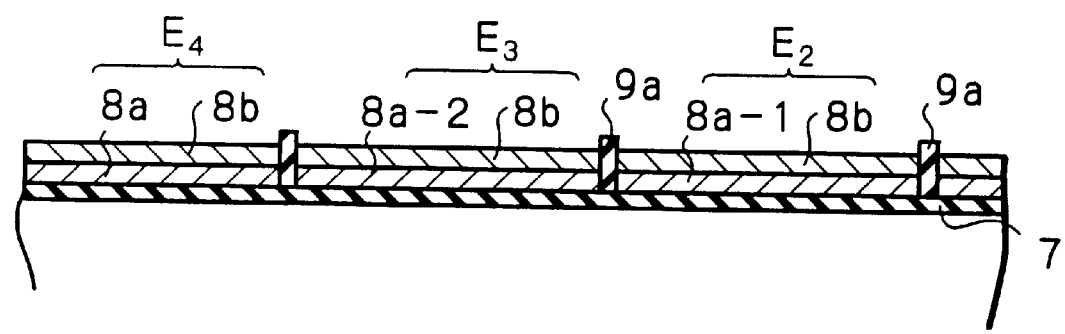

Next, referring to FIGS. 25A and 25B, in the same way as in FIGS. 10A and 10B, a metal layer 8b made of aluminum or refractory metal such as tungsten is selectively grown only on the polycrystalline silicon layers 8a-1 and 8a-2. In this case, the upper surface of the metal layer 8b is made lower than the top of the insulating layer 9a. Therefore, the charge transfer electrodes $E_1$, $E_2$, $E_3$ and $E_4$ formed by the polycrystalline silicon layers 8a-1 and 8a-2 and the metal layer 8b are electrically isolated from each other.

Figure 26A:
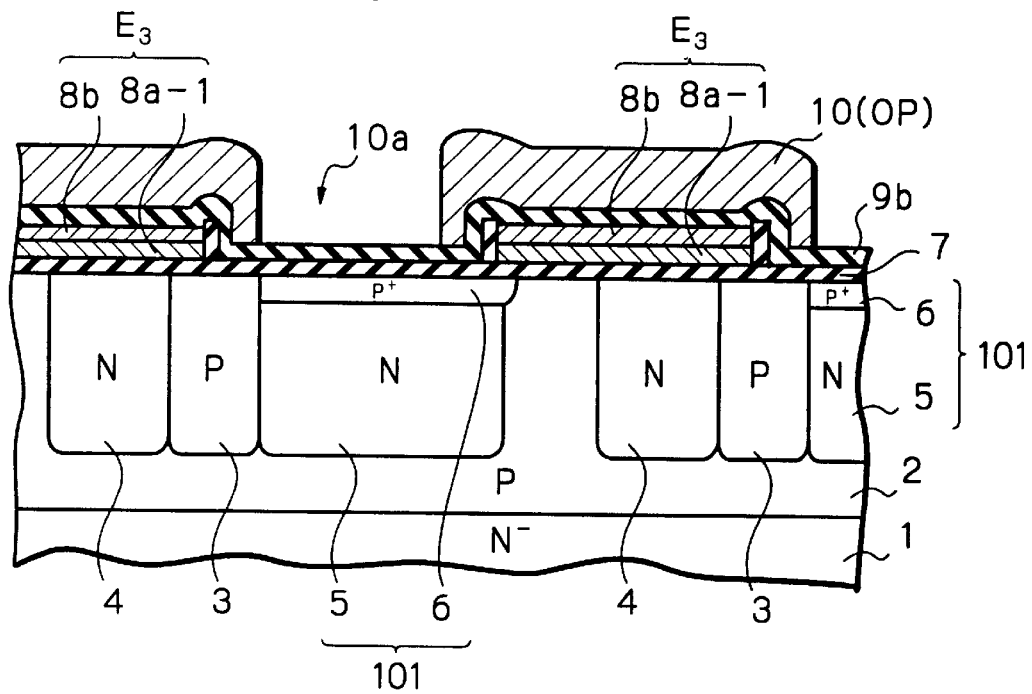
Figure 26B:
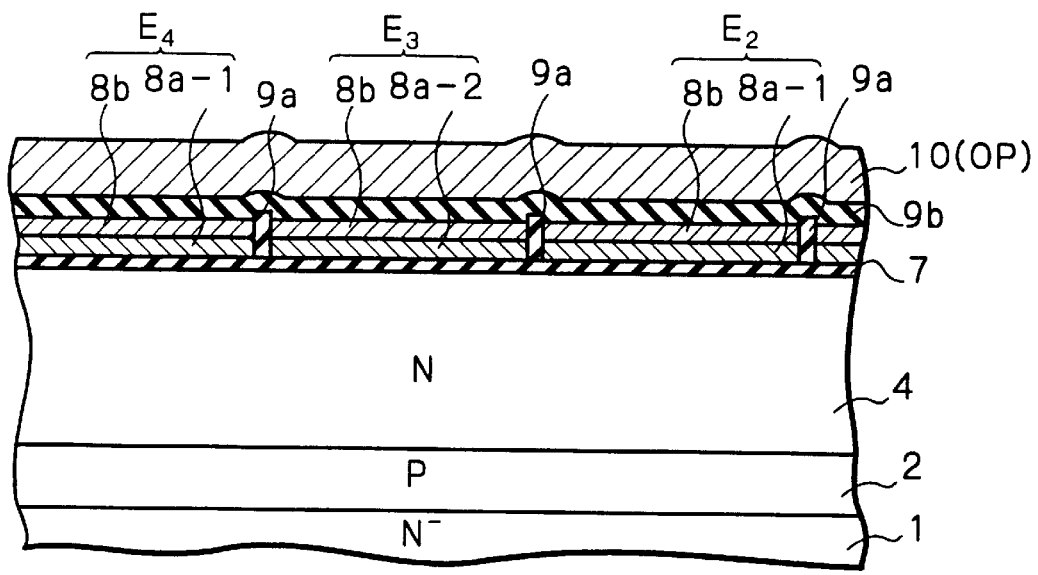

Finally, referring to FIGS. 26A and 26B, in the same way as in FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

In the third embodiment, an etching back process as in the second embodiment can be used for etching the insulating layer 9a instead of the CMP process.

Even in the third embodiment as shown in FIGS. 19A, 19B, 20A, 20B, 21A, 21B, 22A, 22B, 22C, 23A, 23B, 23C, 24A, 24B, 25A, 25B, 26A and 26B, the parasitic resistance of the charge transfer electrodes $E_1$, $E_2$, $E_3$ and $E_4$ can be remarkably reduced. In addition, the gap between the polycrystalline silicon layers 8a-1 and 8a-2 can be easily obtained by a so-called double polycrystalline silicon technology, which is helpful in reducing the manufacturing cost.

FIGS. 27A, 27B, 28A, 28B, 29A, 29B, 30A and 30B are cross-sectional views for explaining a fourth embodiment of the CCD type solid state image pickup device according to the present invention. Note that FIGS. 27A, 27B, 28A, 28B, 29A, 29B, 30A and 30B correspond to FIGS. 5A, 5B, 6A, 6B, 7A, 7B, 8A and 8B, respectively. Also, FIGS. 9A, 9B, 10A, 10B, 11A and 11B are also cross-sectional views for explaining the fourth embodiment of the present invention.

Figure 27A:
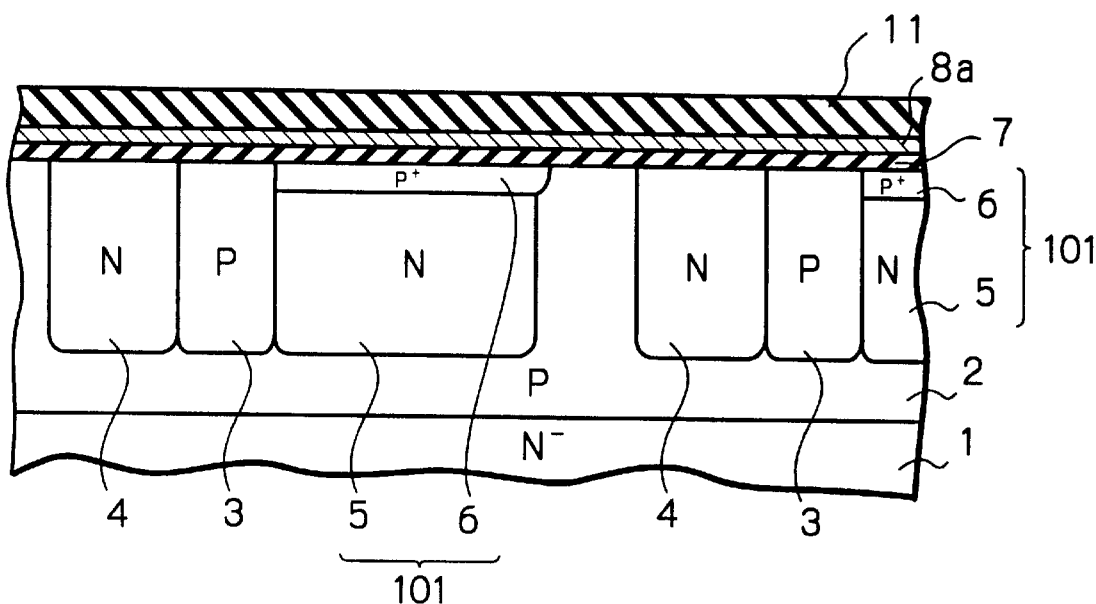
FIGS. 27A, 27B, 28A, 28B, 29A, 29B, 30A and 30B are cross-sectional views for explaining a fourth embodiment of the CCD type solid state image pickup device according to the present invention.
Figure 27B:
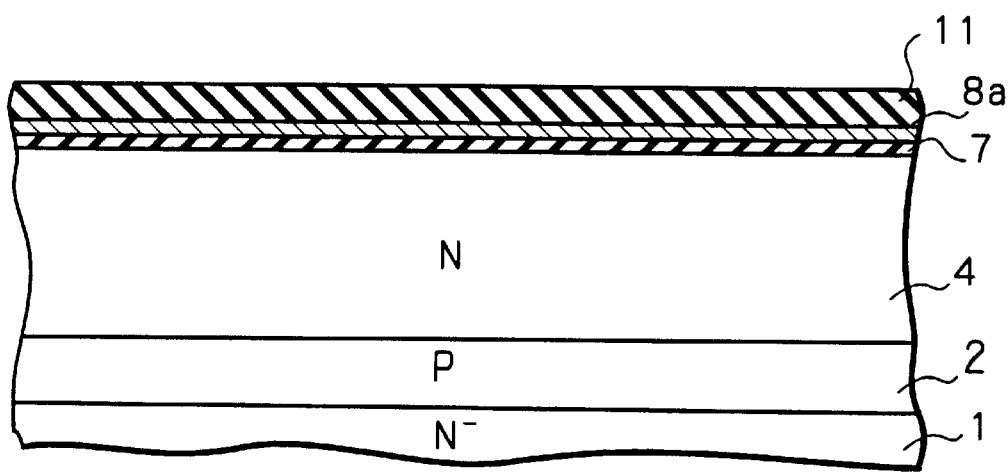

First, referring to FIGS. 27A and 27B, in the same way as in FIGS. 5A and 5B, P-type impurities are introduced into an N⁻-type monocrystalline silicon substrate 1 to form a P-type well 2. Next, a P-type isolation region 3, an N-type charge transfer region 4, an N-type impurity region 5 and a P⁺-type impurity region 6 are sequentially formed by using an ion implantation method in the P-type well 2. In this case, the N-type impurity diffusion region 5 and the P⁺-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, a polycrystalline silicon layer 8a including phosphorus is deposited on the gate insulating layer 7. Note that the thickness of the polycrystalline silicon layer 8a is about 0.1 to 0.4 μm, i.e., thin from the beginning.

Additionally, as illustrated in FIGS. 27A and 27B, an about 0.2 to 0.5 μm thick boron-included silicated glass (BSG) layer 11 is deposited on the polycrystalline silicon layer 8a.

Figure 28A:
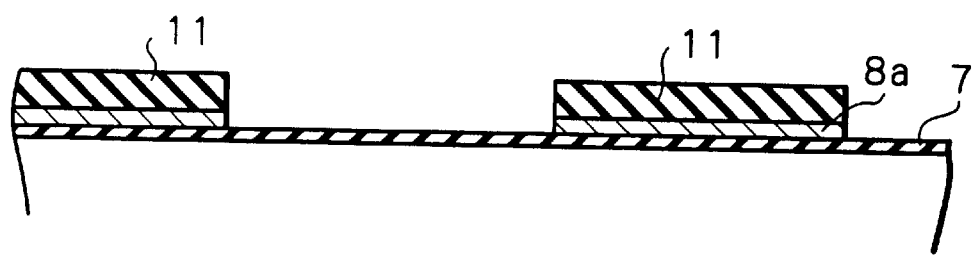
Figure 28B:
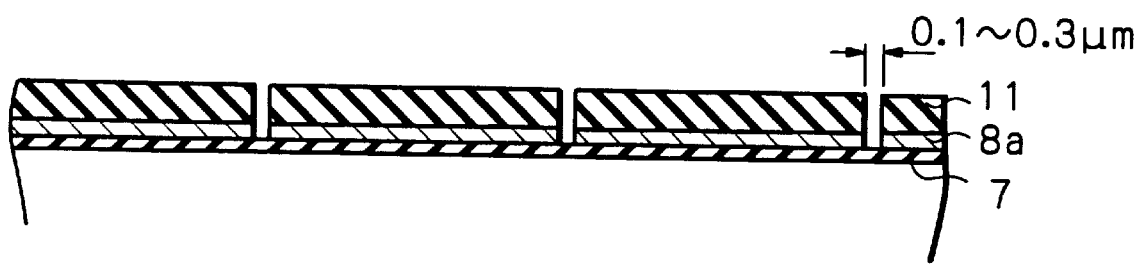

Next, referring to FIGS. 28A and 28B, in a similar way to that of FIGS. 6A and 6B, the BSG layer 11 and the polycrystalline silicon layer 8a are patterned by using a photolithography and etching process. In this case, a gap of the patterned BSG layer 11 and the patterned polycrystalline silicon layer 8a is about 0.1 to 0.3 μm. Note that boron ions can be introduced through the gap of 8a to reduce the potential gap of the charge transfer region 4.

Figure 29A:
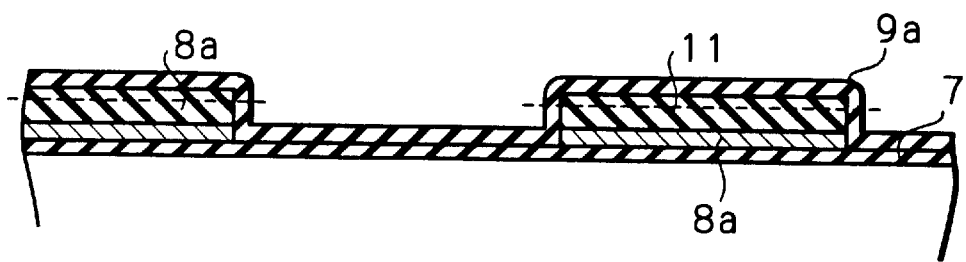
Figure 29B:
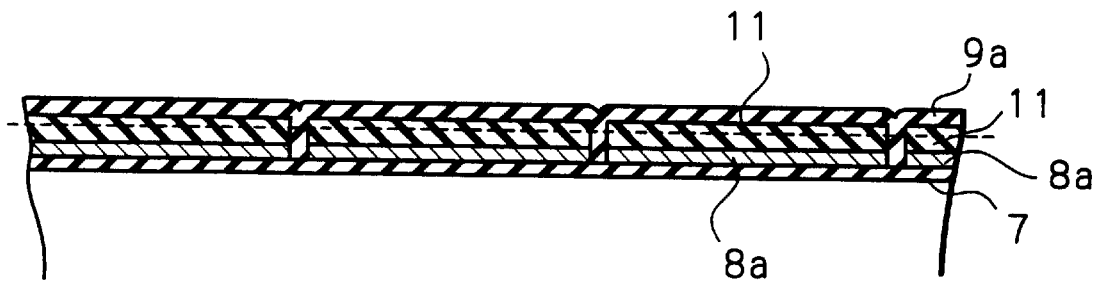

Next, referring to FIGS. 29A and 29B, in the same way as in FIGS. 7A and 7B, an insulating layer 9a made of silicon oxide or silicon nitride is deposited on the entire surface, so that the insulating layer 9a is completely buried in the gap of the PSG layer 11 and the polycrystalline silicon layer 8a.

Figure 30A:
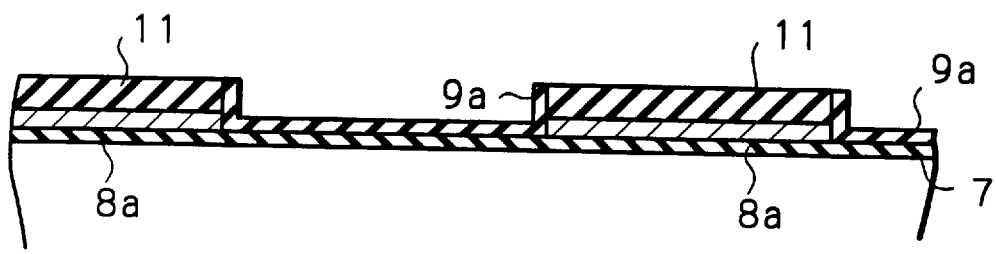
Figure 30B:
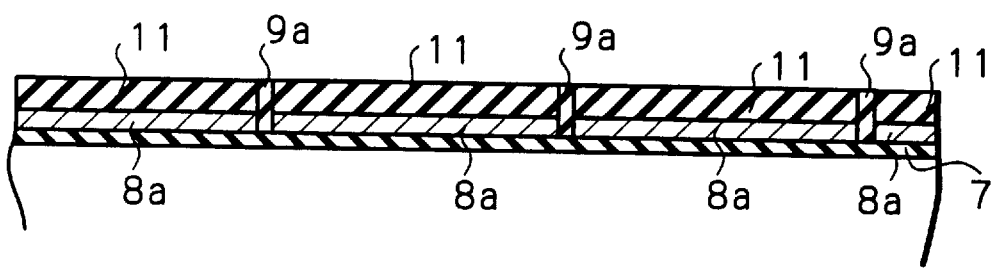

Next, referring to FIGS. 30A and 30B, in the same way as in FIGS. 8A and 8B, the insulating layer 9a is removed by a CMP process, until the BSG layer 11 is exposed. Note that an anisotropic etching process can be used instead of the CMP process. In this case, a part of the upper portion of the BSG layer 11 as indicated by a dot line in FIGS. 29A and 29B is also removed.

Next, the BSG layer 11 is removed by a gas phase hydrogen fluoride (HF) etching process. As a result, the device as illustrated in FIGS. 30A and 30B becomes a device as illustrated in FIGS. 9A and 9B.

After that, in the same way as in FIGS. 10A, 10B, 11A and 11B, a metal layer 8b made of aluminum or refractory metal such as tungsten is selectively grown only on the polycrystalline silicon layer 8a. Then, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

Even in the fourth embodiment as shown in FIGS. 27A, 27B, 28A, 28B, 29A, 29B, 30A, 30B, 9A, 9B, 10A, 10B, 11A and 11B, the parasitic resistance of the charge transfer electrodes $E_1$, $E_2$, $E_3$ and $E_4$ can be remarkably reduced.

FIGS. 31A, 31B, 32A, 32B, 33A, 33B, 34A and 34B are cross-sectional views for explaining a fifth embodiment of the CCD type solid state image pickup device according to the present invention. Note that FIGS. 31A, 31B, 32A, 32B, 33A, 33B, 34A and 34B correspond to FIGS. 5A, 5B, 6A, 6B, 7A, 7B, 8A and 8B, respectively. Also, FIGS. 9A, 9B, 10A, 10B, 11A and 11B are also cross-sectional views for the fifth embodiment of the present invention.

Figure 31A:
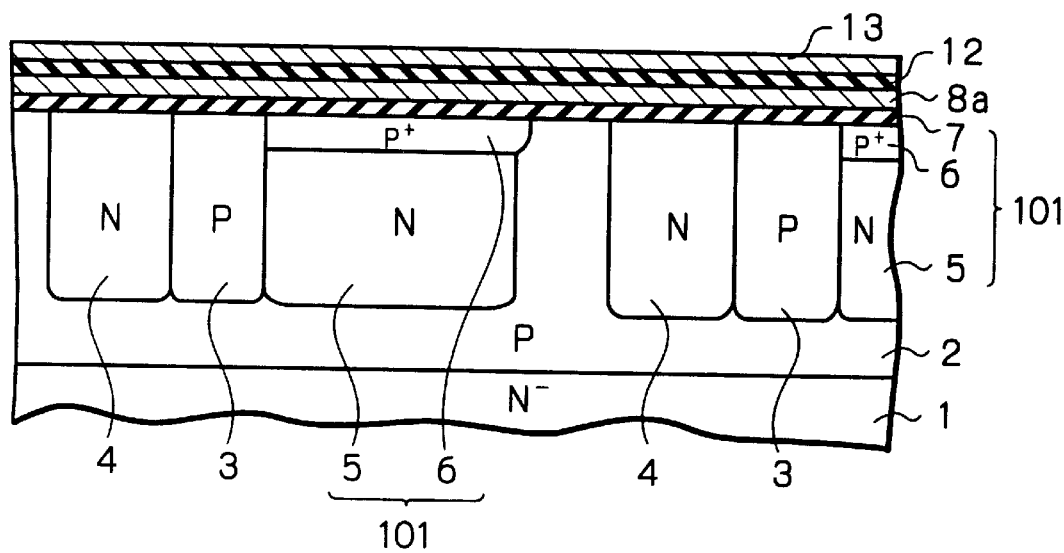
FIGS. 31A, 31B, 32A, 32B, 33A, 33B, 34A and 34B are cross-sectional views for explaining a fifth embodiment of the CCD type solid state image pickup device according to the present invention.
Figure 31B:
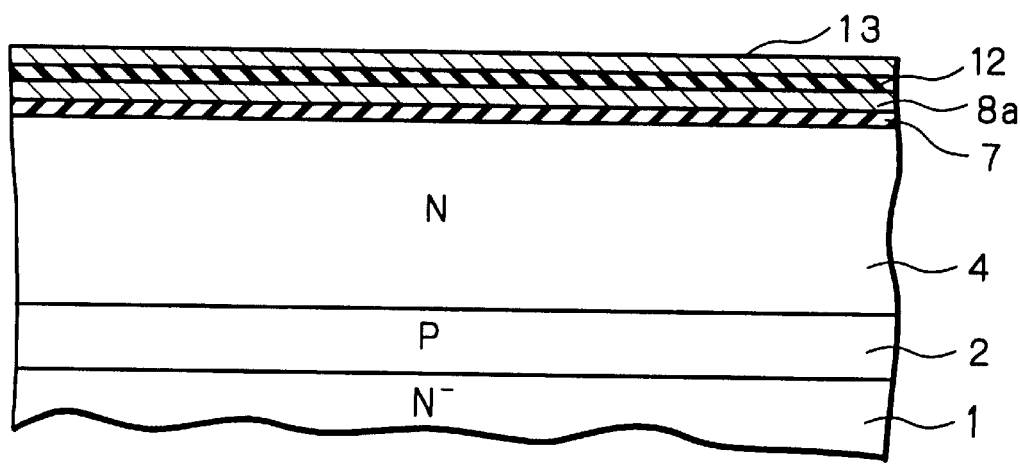

First, referring to FIGS. 31A and 31B, in the same way as in FIGS. 5A and 5B, P-type impurities are introduced into an N⁻-type monocrystalline silicon substrate 1 to form a P-type well 2. Next, a P-type isolation region 3, an N-type charge transfer region 4, an N-type impurity region 5 and a P⁺-type impurity region 6 are sequentially formed by using an ion implantation method in the P-type well 2. In this case, the N-type impurity diffusion region 5 and the P⁺-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, a polycrystalline silicon layer 8a including phosphorus is deposited on the gate insulating layer 7. Note that the thickness of the polycrystalline silicon layer 8a is about 0.1 to 0.4 μm, i.e., thin from the beginning.

Additionally, as illustrated in FIGS. 31A and 31B, an about 50 Å thick silicon oxide layer 12 and an about 0.2 to 0.5 μm thick polycrystalline silicon layer 13 are deposited on the polycrystalline silicon layer 8a.

Figure 32A:
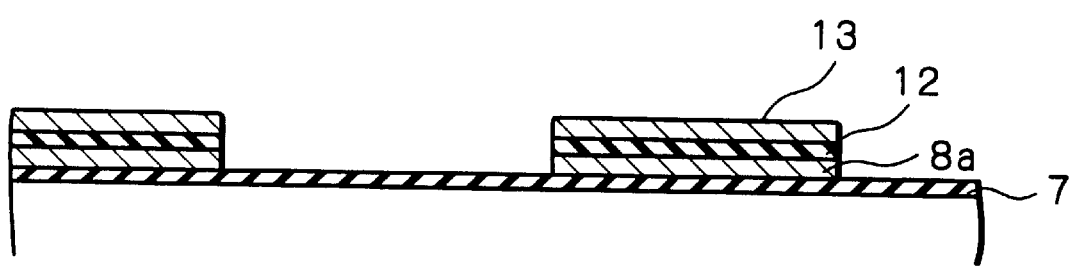
Figure 32B:
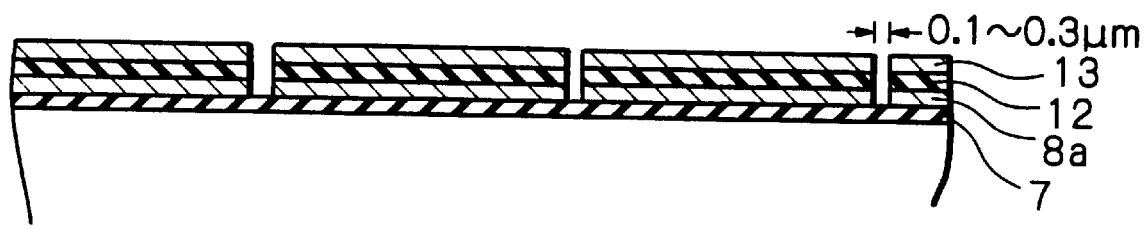

Next, referring to FIGS. 32A and 32B, in a similar way to that of FIGS. 6A and 6B, the polycrystalline silicon layer 13, the silicon oxide layer 12 and the polycrystalline silicon layer 8a are patterned by using a photolithography and etching process. In this case, a gap of the patterned polycrystalline silicon layer 13, the patterned silicon oxide layer 12 and the patterned polycrystalline silicon layer 8a is about 0.1 to 0.3 μm. Note that boron ions can be introduced through the gap of 8a to reduce the potential gap of the charge transfer region 4.

Figure 33A:
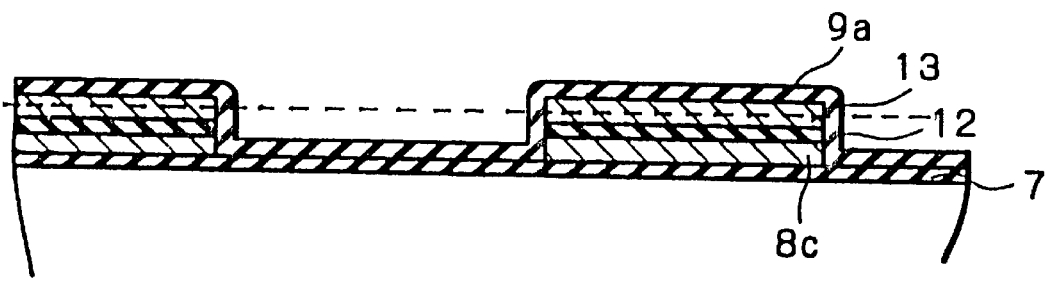
Figure 33B:
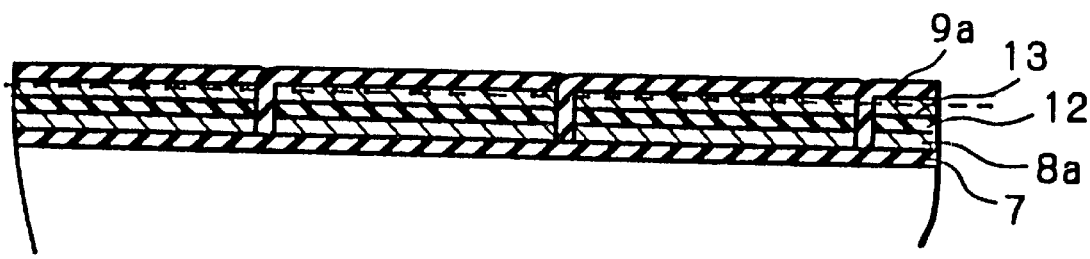

Next, referring to FIGS. 33A and 33B, in the same way as in FIGS. 7A and 7B, an insulating layer 9a made of silicon oxide or silicon nitride is deposited on the entire surface, so that the insulating layer 9a is completely buried in the gap of the polycrystalline silicon layer 13, the silicon oxide layer 12 and the polycrystalline silicon layer 8a.

Figure 34A:
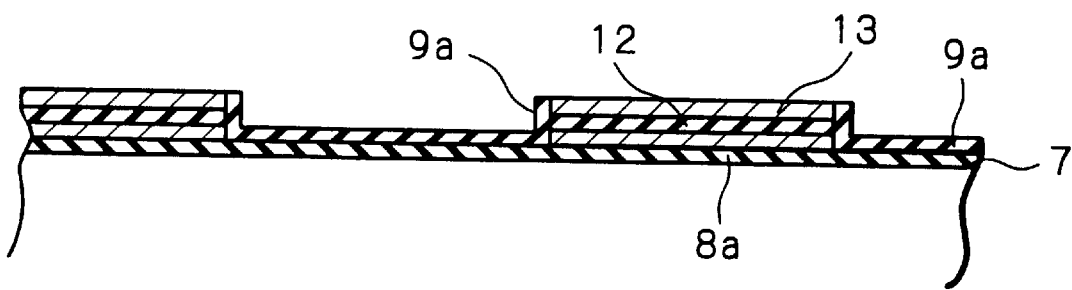
Figure 34B:
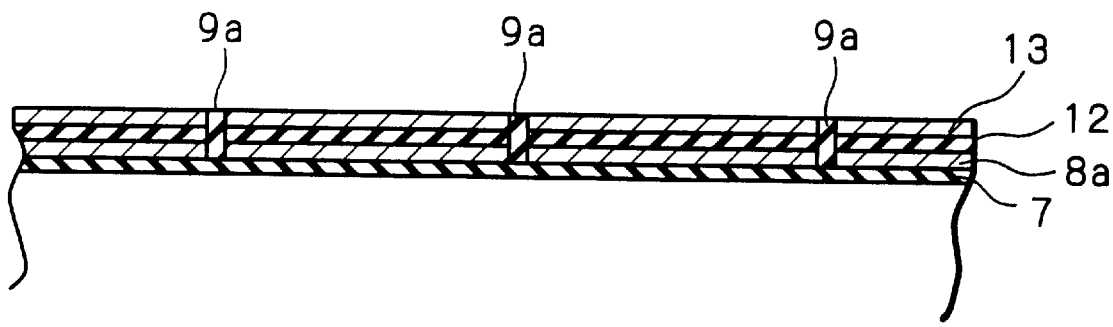

Next, referring to FIGS. 34A and 34B, in the same way as in FIGS. 8A and 8B, the insulating layer 9a is removed by a CMP process, until the BSG layer 11 is exposed. Note that an anisotropic etching process can be used instead of the CMP process. In this case, a part of the upper portion of the polycrystalline silicon layer 13 as indicated by a dot line in FIGS. 33A and 33B is also removed.

Next, the polycrystalline silicon layer 13 is removed by an etching process using the insulating layer 9a and the silicon oxide layer 12 as an etching stopper. Then, the silicon oxide layer 12 is removed by an etching process using dilute fluoric acid. As a result, the device as illustrated in FIGS. 34A and 34B becomes a device as illustrated in FIGS. 9A and 9B.

After that, in the same way as in FIGS. 10A, 10B, 11A and 11B, a metal layer 8b made of aluminum or refractory metal such as tungsten is selectively grown on only the polycrystalline silicon layer 8a. Then, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

Even in the fifth embodiment as shown in FIGS. 31A, 31B, 32A, 32B, 33A, 33B, 34A, 34B, 9A, 9B, 10A, 10B, 11A and 11B, the parasitic resistance of the charge transfer electrodes $E_1$, $E_2$, $E_3$ and $E_4$ can be remarkably reduced. Simultaneously, the thickness of the polycrystalline silicon layer 8a can be accurately controlled.

FIGS. 35A, 35B, 36A, 36B, 37A, 37B, 38A, 38B, 39A, 39B, 40A, 40B, 41A and 41B are cross-sectional views for explaining a sixth embodiment of the CCD type solid state image pickup device according to the present invention. Note that FIGS. 35A, 35B, 36A, 36B, 37A, 37B, 38A, 38B, 40A, 40B, 41A and 41B correspond to FIGS. 5A, 5B, 6A, 6B, 7A, 7B, 8A, 8B, 10A, 10B, 11A and 11B, respectively.

Figure 35A:
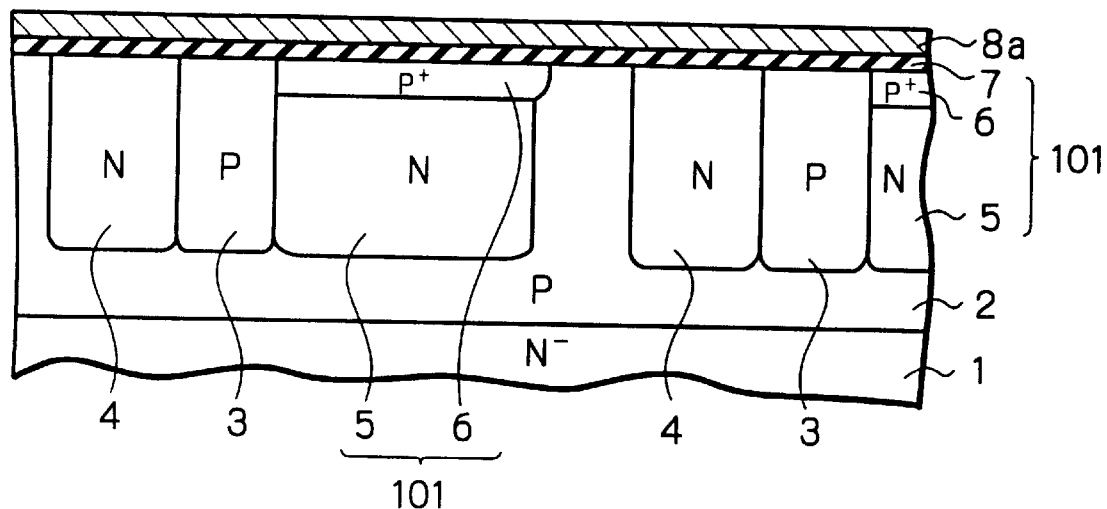
FIGS. 35A, 35B, 36A, 36B, 37A, 37B, 38A, 38B, 39A, 39B, 40A, 40B, 41A and 41B are cross-sectional views for explaining a sixth embodiment of the CCD type solid state image pickup device according to the present invention.
Figure 35B:
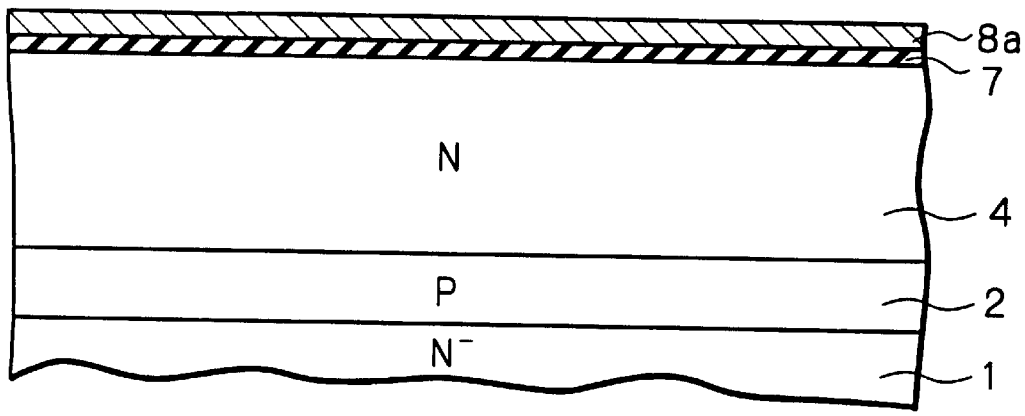

First, referring to FIGS. 35A and 35B, in the same way as in FIGS. 5A and 5B, P-type impurities are introduced into an N⁻-type monocrystalline silicon substrate 1 to form a P-type well 2. Next, a P-type isolation region 3, an N-type charge transfer region 4, an N-type impurity region 5 and a P⁺-type impurity region 6 are sequentially formed by using an ion implantation method in the P-type well 2. In this case, the N-type impurity diffusion region 5 and the P⁺-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, a polycrystalline silicon layer 8a including phosphorus is deposited on the gate insulating layer 7. Note that the thickness of the polycrystalline silicon layer 8a is about 0.1 to 0.4 μm, i.e., thin from the beginning.

Figure 36A:
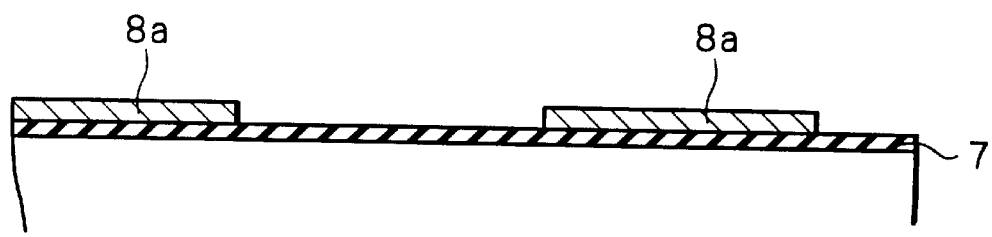
Figure 36B:
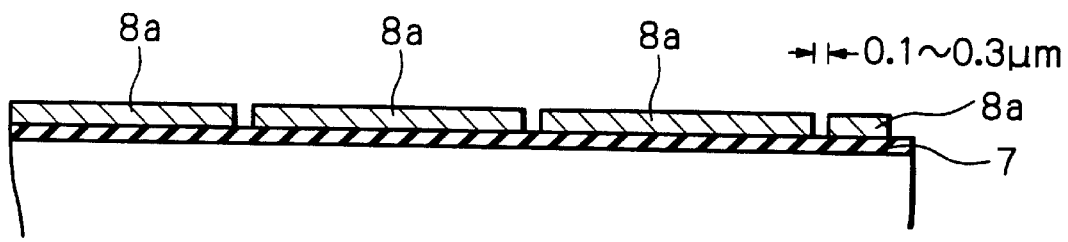

Next, referring to FIGS. 36A and 36B, in the same way as in FIGS. 6A and 6B, the polycrystalline silicon layer 8a is patterned by using a photolithography and etching process. In this case, a gap of the patterned polycrystalline silicon layer 8a is about 0.1 to 0.3 μm. Note that boron ions can be introduced through the gap of 8a to reduce the potential gap of the charge transfer region 4. Also, a silicon oxide layer can be deposited before the formation of a photoresist pattern, and the silicon oxide layer is then patterned by using the photoresist pattern. In this case, the polycrystalline silicon layer 8a is patterned by using the patterned silicon oxide layer, and thereafter, a silicon oxide layer is again deposited, and is etched so that a silicon oxide layer is formed within the gap of the polycrystalline silicon layer 8a.

Figure 37A:
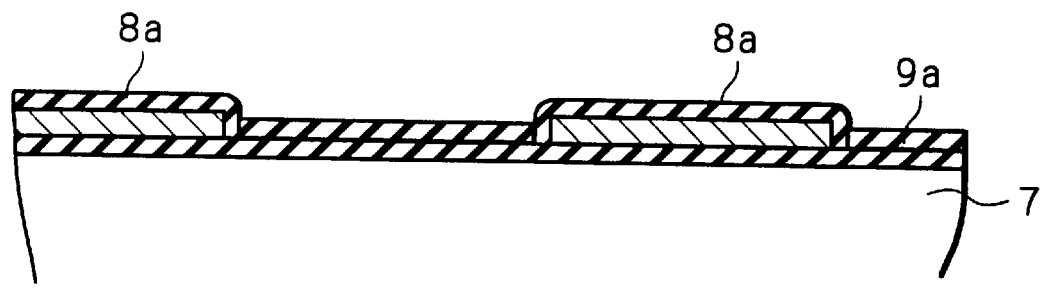
Figure 37B:
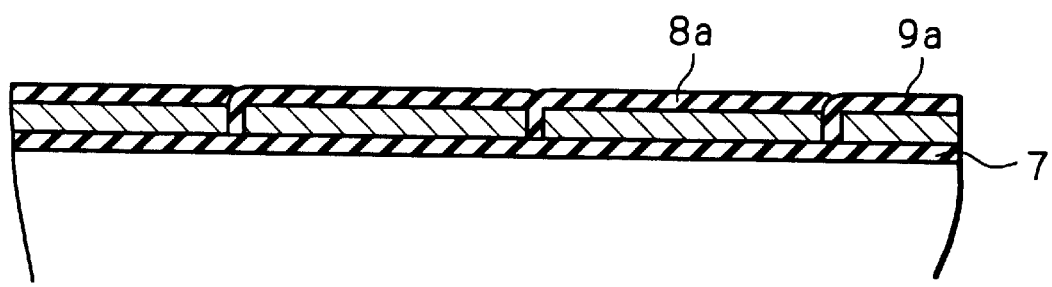

Next, referring to FIGS. 37A and 37B, in the same way as in FIGS. 7A and 7B, an insulating layer 9a made of silicon oxide or silicon nitride is deposited on the entire surface, so that the insulating layer 9a is completely buried in the gap of the polycrystalline silicon layer 8a.

Figure 38A:
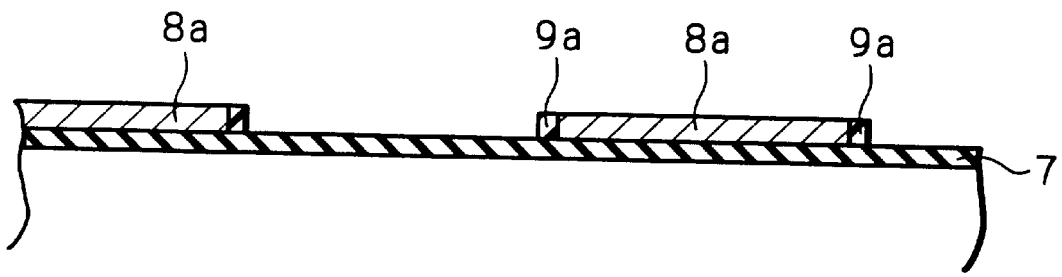
Figure 38B:
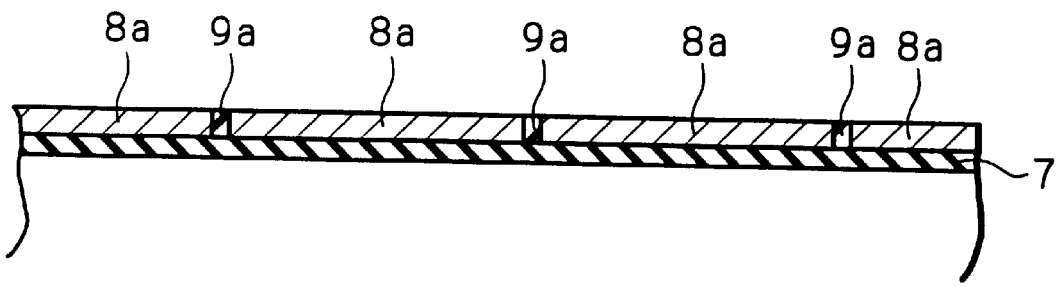

Next, referring to FIGS. 38A and 38B, in a similar way to that of FIGS. 8A and 8B, the insulating layer 9a is removed by an anisotropic etching process, until the polycrystalline silicon layer 8a is exposed. In this case, a part of the upper portion of the gate insulating layer 7 as indicated by a dot line in FIGS. 37A and 37B is also removed.

Figure 39A:
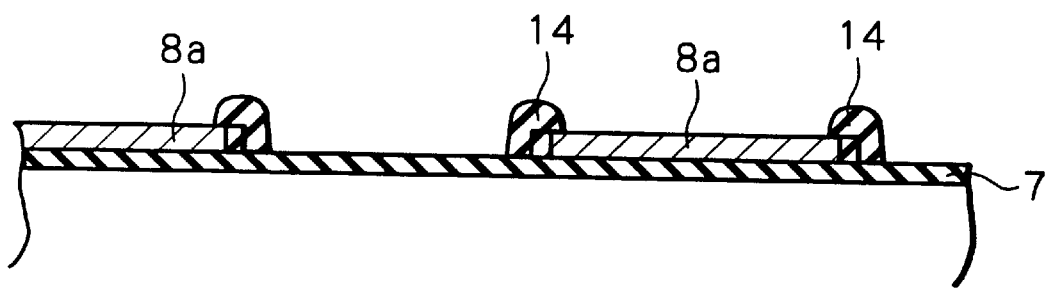
Figure 39B:
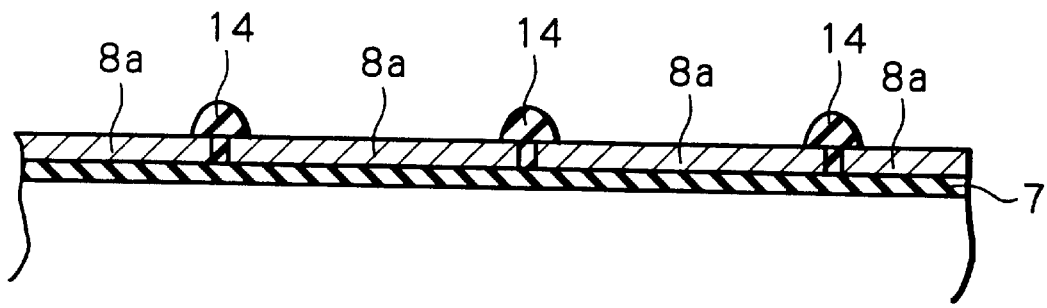

Next, referring to FIGS. 39A and 39B, a silicon oxide layer 14 is deposited on only the insulating layer 9a by a liquid phase deposition (LPD) process.

Figure 40A:
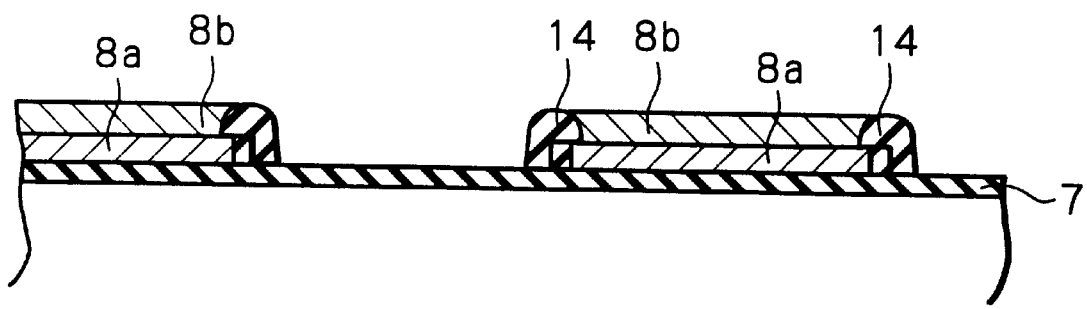
Figure 40B:
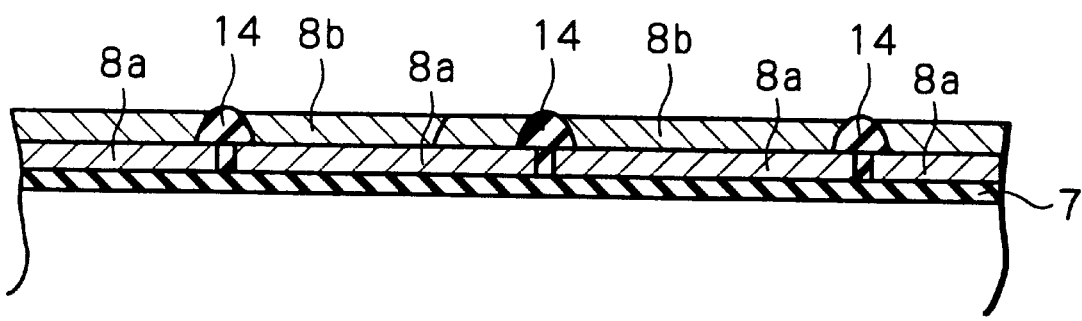

Next, referring to FIGS. 40A and 40B, in the same way as in FIGS. 10A and 10B, a metal layer 8b made of aluminum or refractory metal such as tungsten is selectively grown only on the polycrystalline silicon layer 8a. In this case, the upper surface of the metal layer 8b is made lower than the top of the silicon oxide layer 14. Therefore, the charge transfer electrodes $E_1$, $E_2$, $E_3$ and $E_4$ formed by the polycrystalline silicon layer 8a and the metal layer 8b are electrically isolated from each other.

Figure 41A:
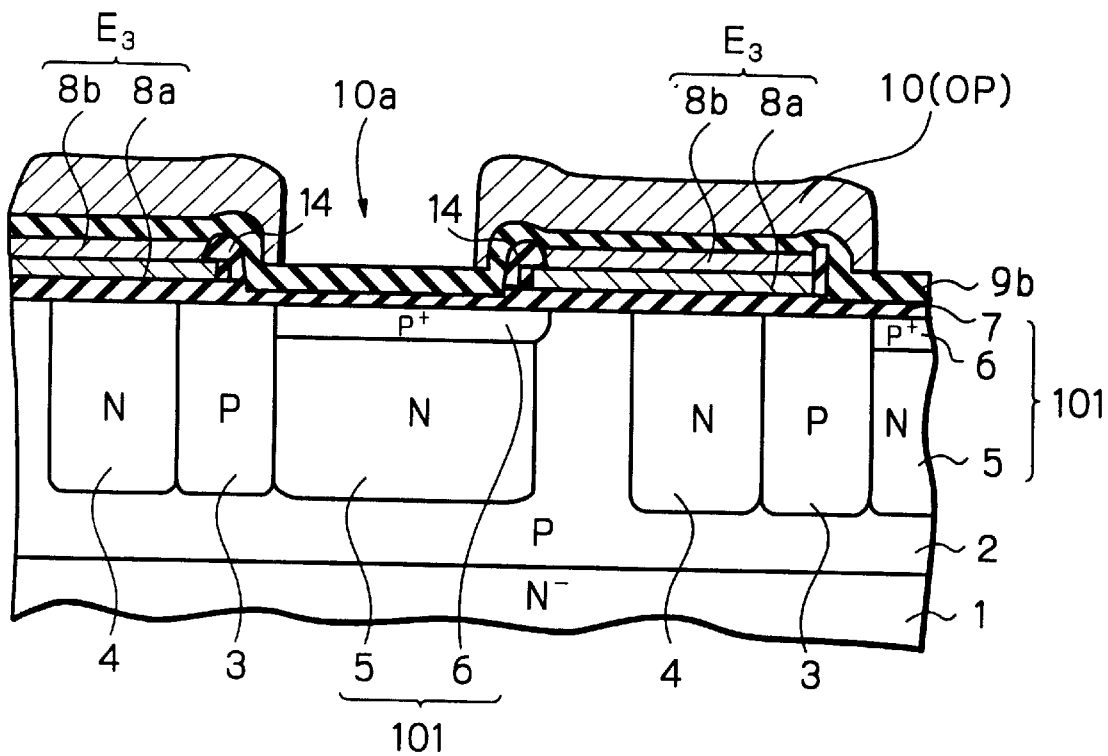
Figure 41B:
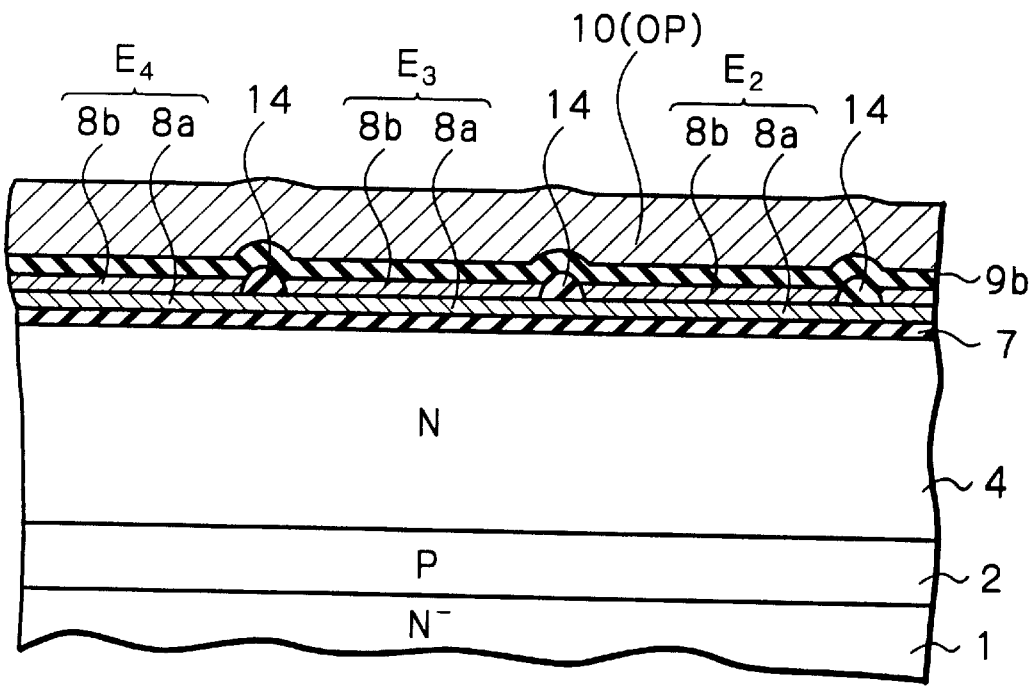

Finally, referring to FIGS. 41A and 41B, in the same way as in FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

Even in the sixth embodiment as shown in FIGS. 35A, 35B, 36A, 36B, 37A, 37B, 38A, 38B, 39A, 39B, 40A, 40B, 41A and 41B, the parasitic resistance of the charge transfer electrodes $E_1$, $E_2$, $E_3$ and $E_4$ can be remarkably reduced.

FIGS. 42A, 42B, 43A, 43B, 44A, 44B, 45A, 45B, 46A, 46B, 47A, 47B, 48A, 48B, 49A, 49B, 50A and 50B are cross-sectional views for explaining a seventh embodiment of the CCD type solid state image pickup device according to the present invention. Note that FIGS. 42A, 42B, 43A, 43B, 44A, 44B, 45A, 45B, 49A, 49B, 50A and 50B correspond to FIGS. 5A, 5B, 6A, 6B, 7A, 7B, 8A, 8B, 10A, 10B, 11A and 11B, respectively.

Figure 42A:
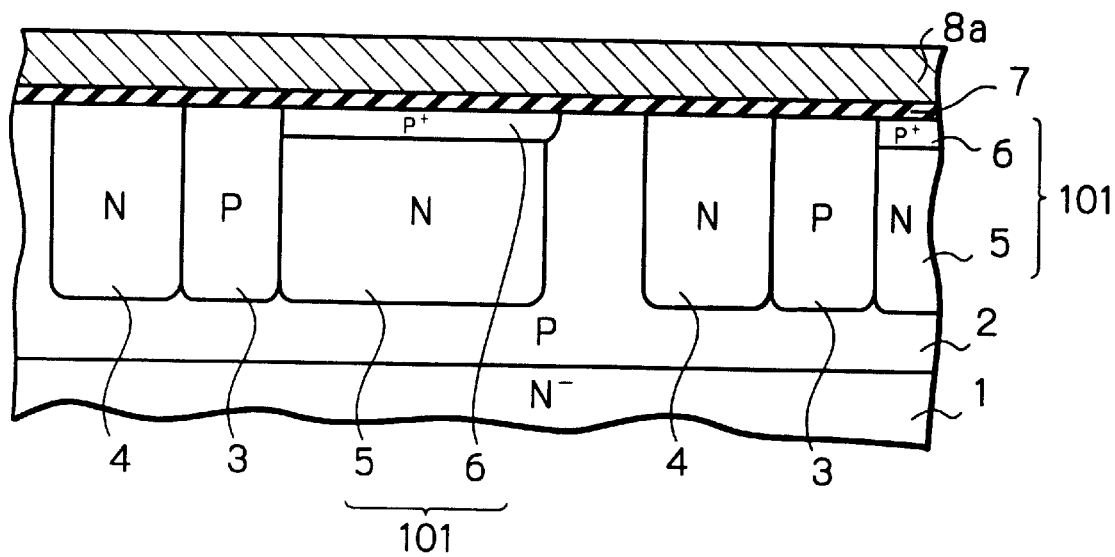
FIGS. 42A, 42B, 43A, 43B, 44A, 44B, 45A, 45B, 46A, 46B, 47A, 47B, 48A, 48B, 49A, 49B, 50A and 50B are cross-sectional views for explaining a seventh embodiment of the CCD type solid state image pickup device according to the present invention.
Figure 42B:
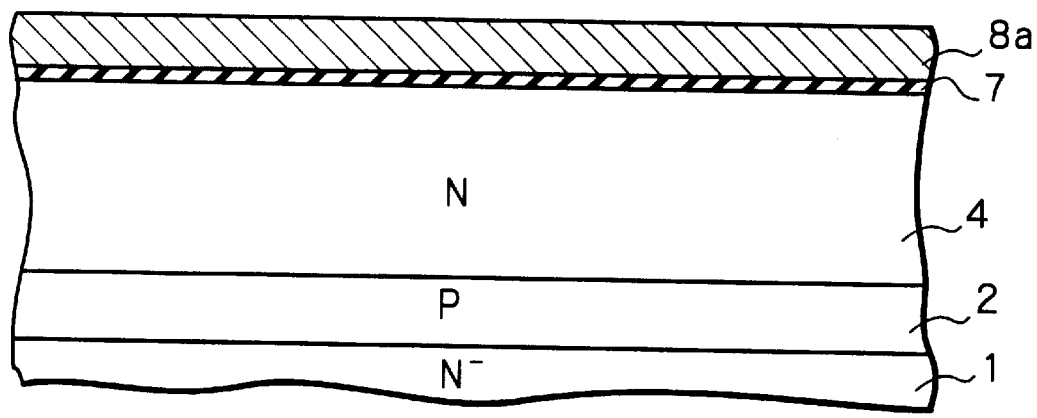

First, referring to FIGS. 42A and 42B, in the same way as in FIGS. 5A and 5B, P-type impurities are introduced into an N⁻-type monocrystalline silicon substrate 1 to form a P-type well 2. Next, a P-type isolation region 3, an N-type charge transfer region 4, an N-type impurity region 5 and a P⁺-type impurity region 6 are sequentially formed by using an ion implantation method in the P-type well 2. In this case, the N-type impurity diffusion region 5 and the P⁺-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, an about 0.3 to 0.8 μm thick polycrystalline silicon layer 8a including phosphorus is deposited on the gate insulating layer 7.

Figure 43A:
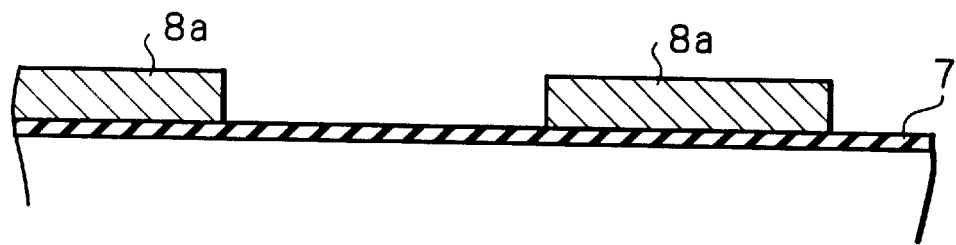
Figure 43B:
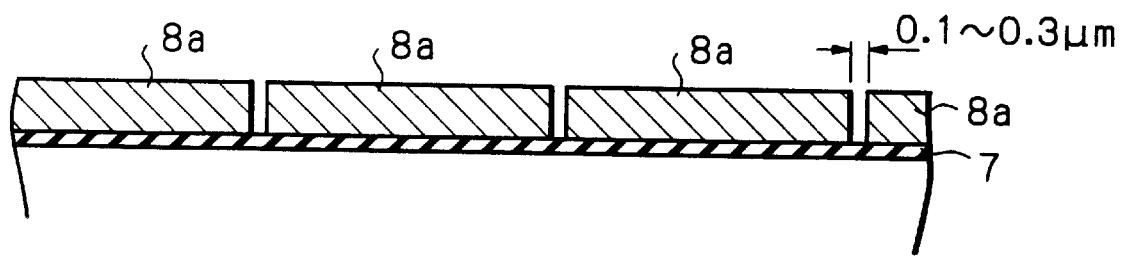

Next, referring to FIGS. 43A and 43B, in the same way as in FIGS. 6A and 6B, the polycrystalline silicon layer 8a is patterned by using a photolithography and etching process. In this case, a gap of the patterned polycrystalline silicon layer 8a is about 0.1 to 0.3 m. Note that boron ions can be introduced through the gap of the polycrystalline silicon layer 8a to reduce the potential gap of the charge transfer region 4. Also, a silicon oxide layer can be deposited before the formation of a photoresist pattern, and the silicon oxide layer is then patterned by using the photoresist pattern. In this case, the polycrystalline silicon layer 8a is patterned by using the patterned silicon oxide layer, and thereafter, a silicon oxide layer is again deposited, and is etched back so that a sidewall silicon oxide layer is formed within the gap of the polycrystalline silicon layer 8a.

Figure 44A:
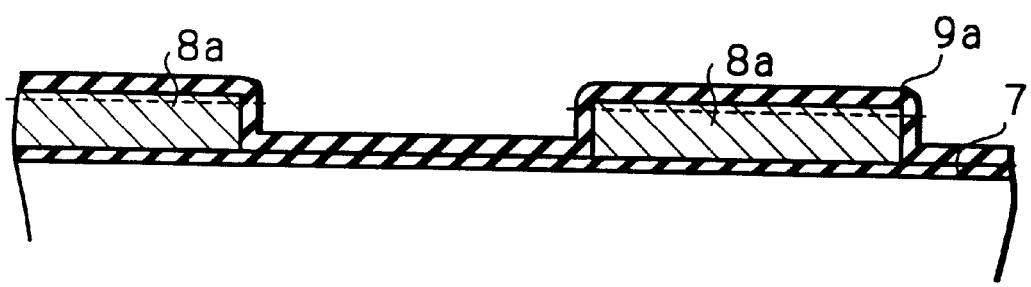
Figure 44B:
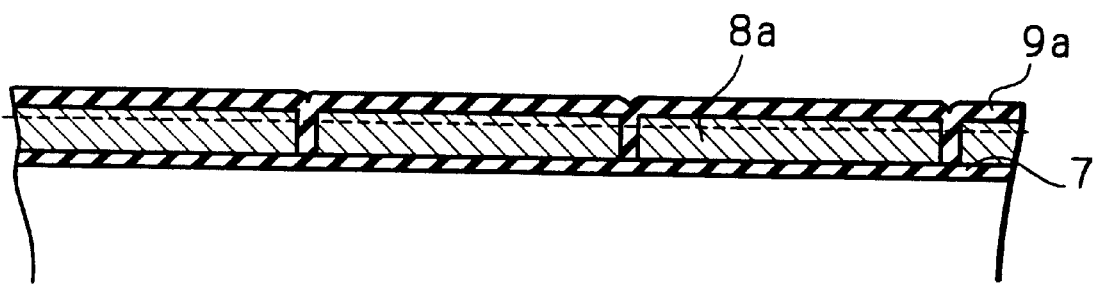

Next, referring to FIGS. 44A and 44B, in the same way as in FIGS. 7A and 7B, an insulating layer 9a made of silicon oxide or silicon nitride is deposited on the entire surface, so that the insulating layer 9a is completely buried in the gap of the polycrystalline silicon layer 8a.

Figure 45A:
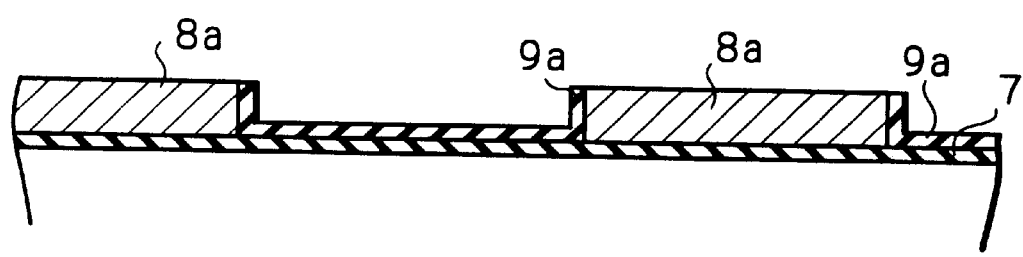
Figure 45B:
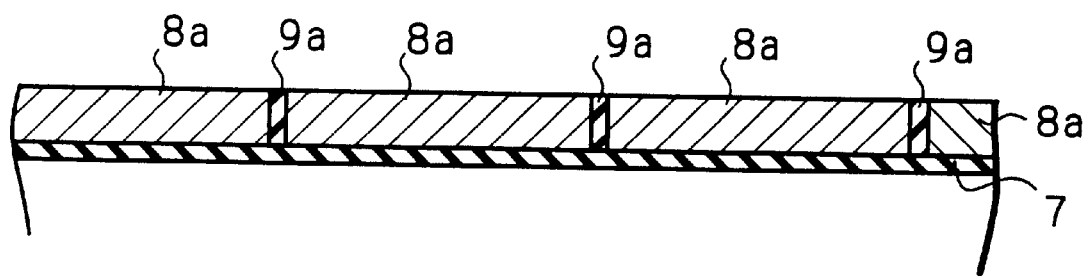

Next, referring to FIGS. 45A and 45B, in the same way as in FIGS. 8A and 8B, the insulating layer 9a is removed by a CMP process, until the polycrystalline silicon layer 8a is exposed. In this case, a part of the upper portion of the polycrystalline silicon layer 8a as indicated by a dot line in FIGS. 44A and 44B is also removed.

Figure 46A:
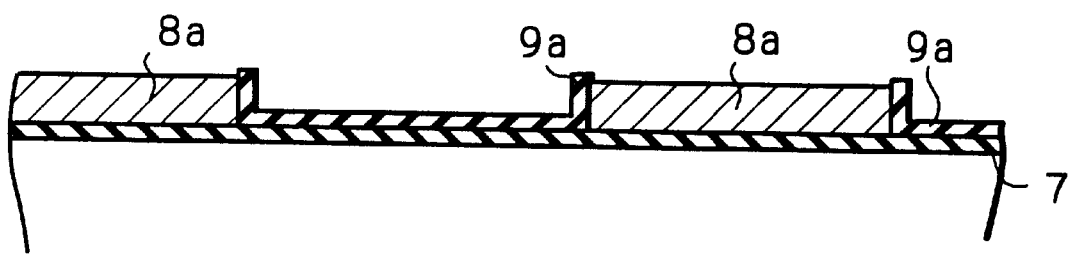
Figure 46B:
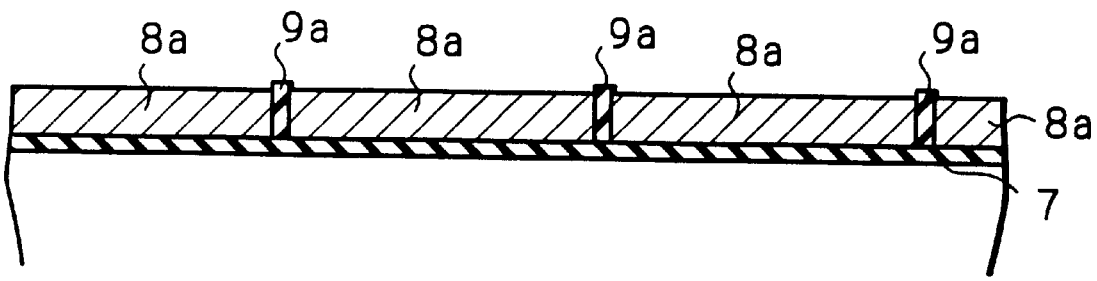

Next, referring to FIGS. 46A and 46B, the upper portion of the polycrystalline silicon layer 8a is slightly etched by using dilute nitric acid.

Figure 47A:
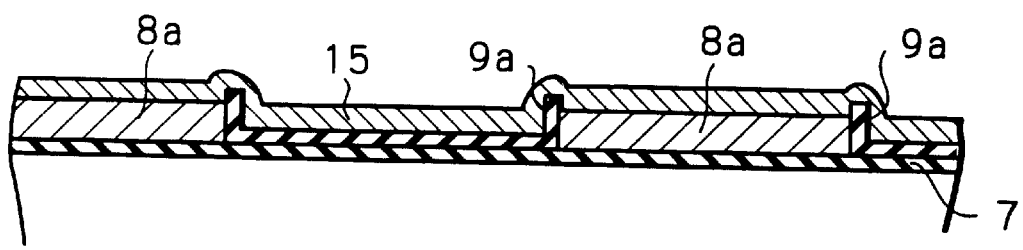
Figure 47B:
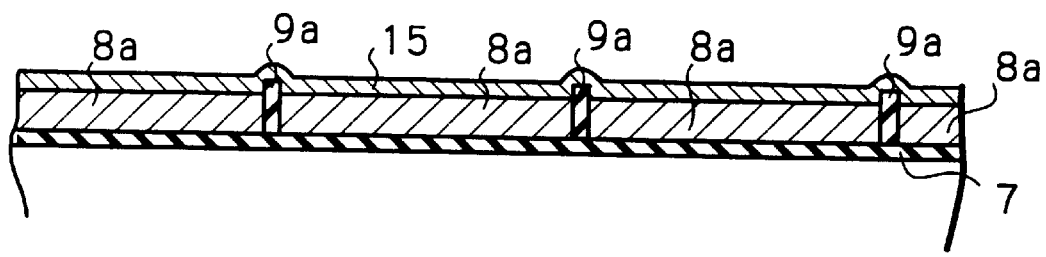

Next, referring to FIGS. 47A and 47B, an about 100 to 1000 Å thick metal layer 15 made of platinum or refractory metal such as titanium is deposited on the entire surface.

Figure 48A:
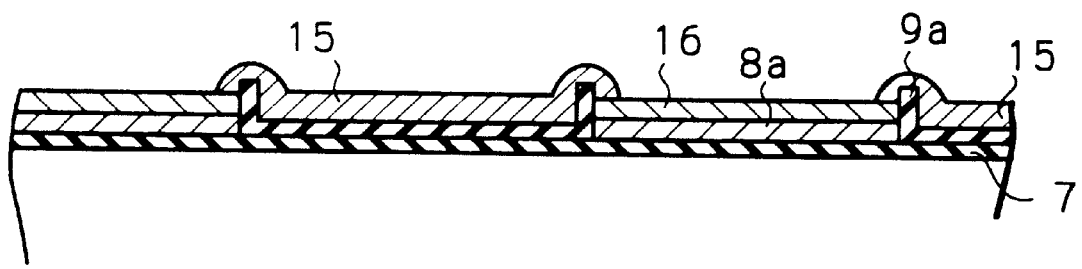
Figure 48B:
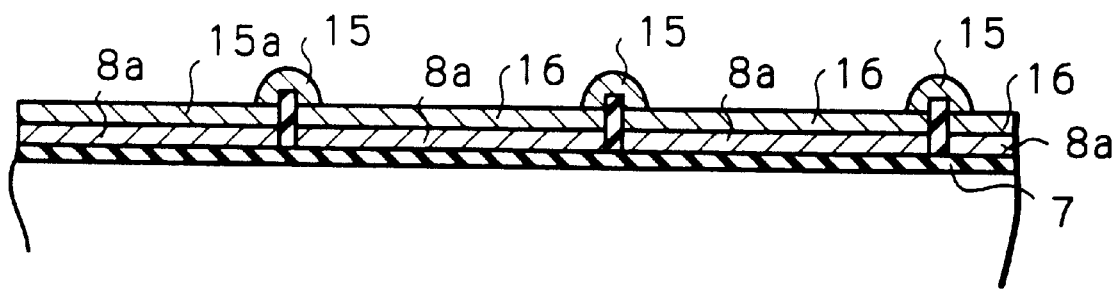

Next, referring to FIGS. 48A and 48B, a heat operation is carried out, so that the metal layer 15 reacts with the polycrystalline silicon layer 8a. As a result, a metal silicide layer 16 is formed. In this case, the metal layer 15 on the insulating layer 9a is unreacted.

Figure 49A:
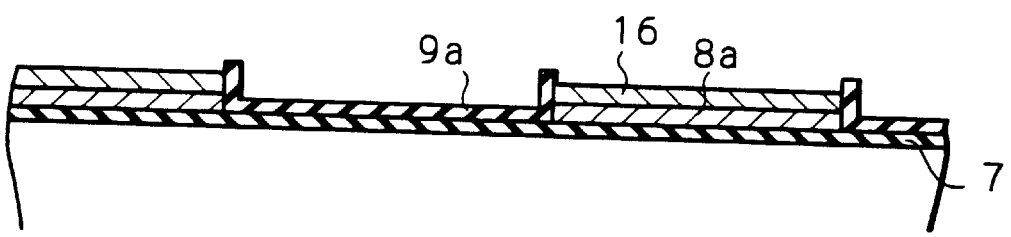
Figure 49B:
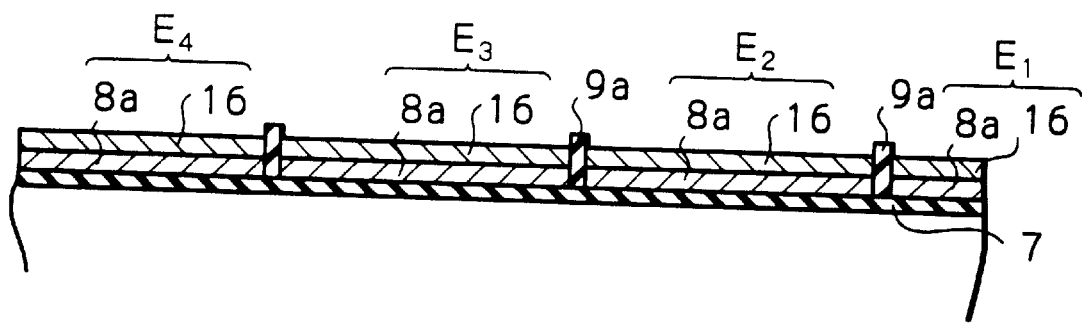

Next, referring to FIGS. 49A and 49B, the unreacted metal layer 15 is removed by an etching process. In this case, if the metal layer 15 is made of platinum, the etching process uses aqua regia as etching liquid, while if the metal layer 15 is made of titanium, the etching process uses dilute fluoric acid as etching liquid.

In FIGS. 49A and 49B, the upper surface of the metal silicide layer 16 is made lower than the top of the insulating layer 9a. Therefore, the charge transfer electrodes $E_1$, $E_2$, $E_3$ and $E_4$ formed by the polycrystalline silicon layer 8a and the metal silicide layer 8b are electrically isolated from each other.

Figure 50A:
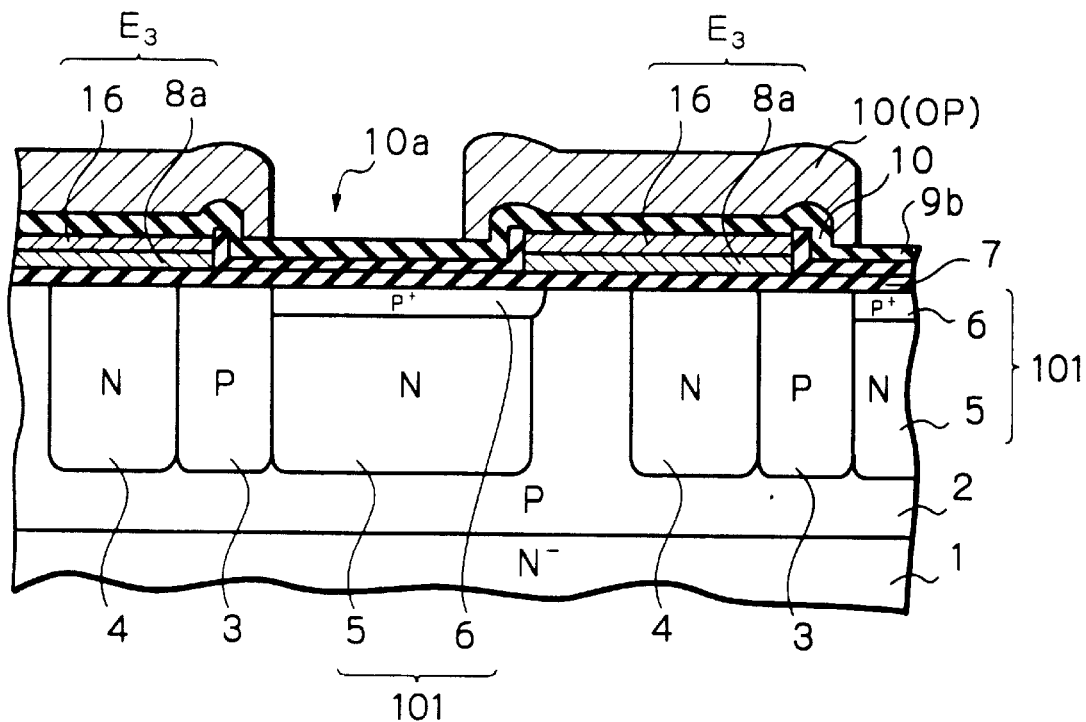
Figure 50B:
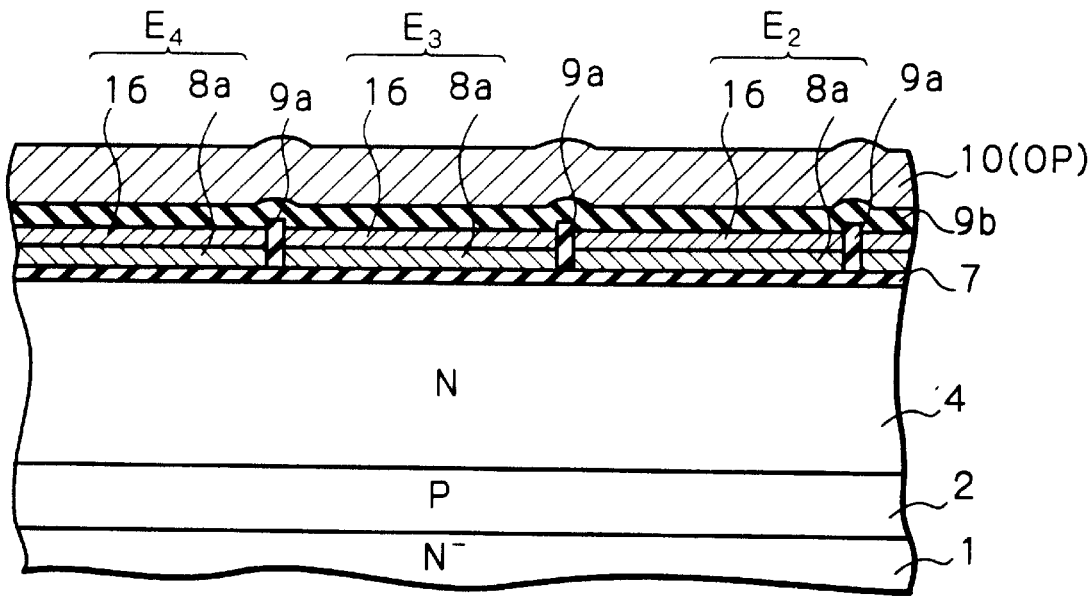
Figure 51A:
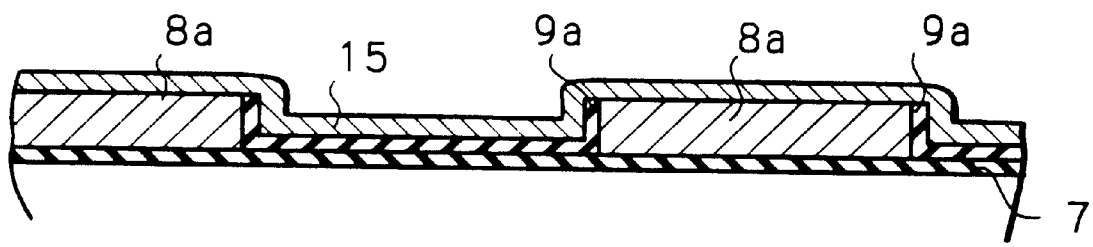
FIGS. 51A, 51B, 52A, 52B, 53A, 53B, 54A and 54B are cross-sectional views illustrating a modification of the seventh embodiment.
Figure 51B:
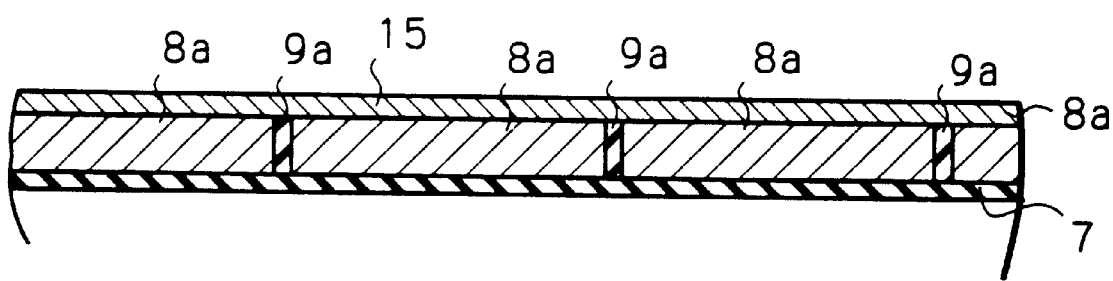
Figure 52A:
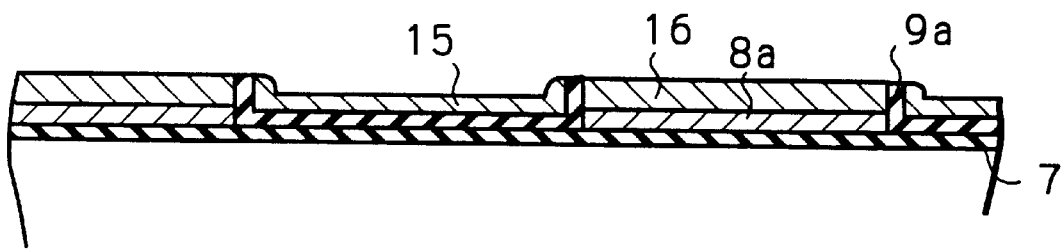
Figure 52B:
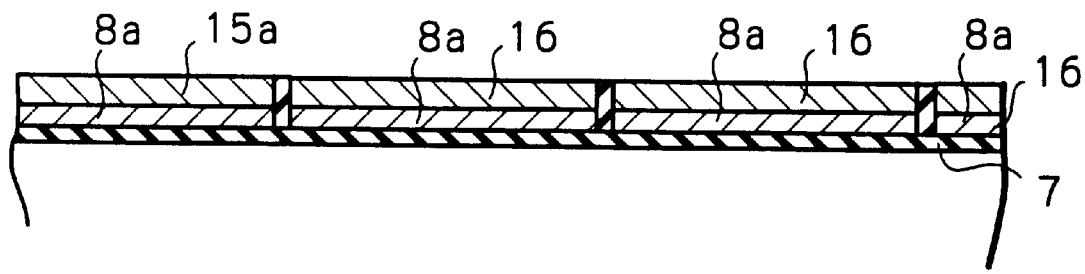

Finally, referring to FIGS. 50A and 50B, in the same way as in FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

Even in the seventh embodiment as shown in FIGS. 42A, 42B, 43A, 43B, 44A, 44B, 45A, 45B, 46A, 46B, 47A, 47B, 48A, 48B, 49A, 49B, 50A and 50B, the parasitic resistance of the charge transfer electrodes $E_1$, $E_2$, $E_3$ and $E_4$ can be remarkably reduced.

According to a modification of the seventh embodiment, if the etching process performed upon the polycrystalline silicon layer 8a as shown in FIGS. 46A and 46B is omitted, FIGS. 47A, 47B, 48A, 48B, 49A, 49B, 50A and 50B are replaced by FIGS. 51A, 51B, 52A, 52B, 53A, 53B, 54A and 54B, respectively. That is, the upper surface of the metal silicide layer 16 is approximately the same as the top of the insulating layer 9a.

Figure 53A:
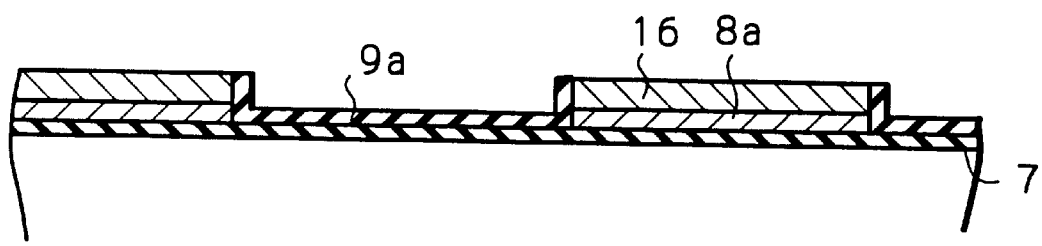
Figure 53B:
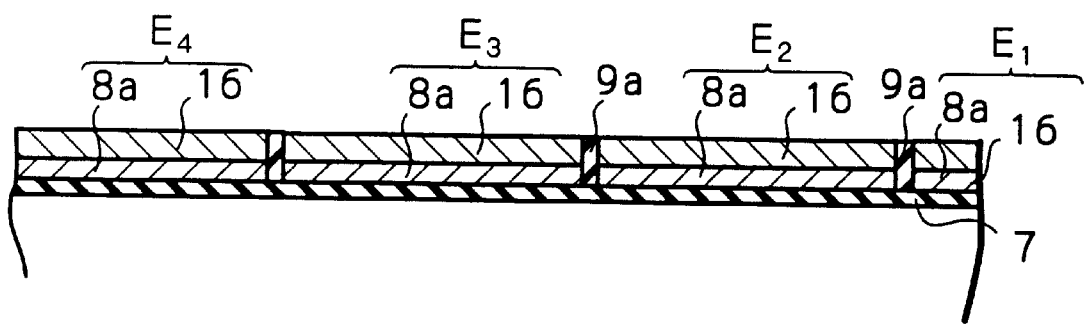
Figure 54A:
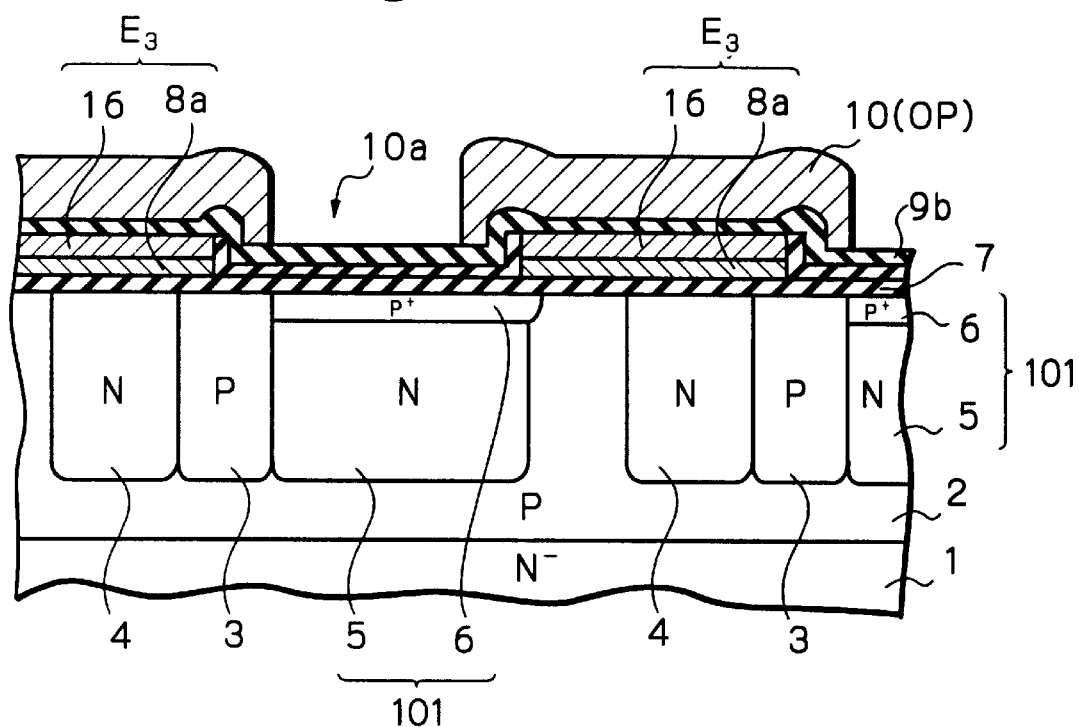
Figure 54B:
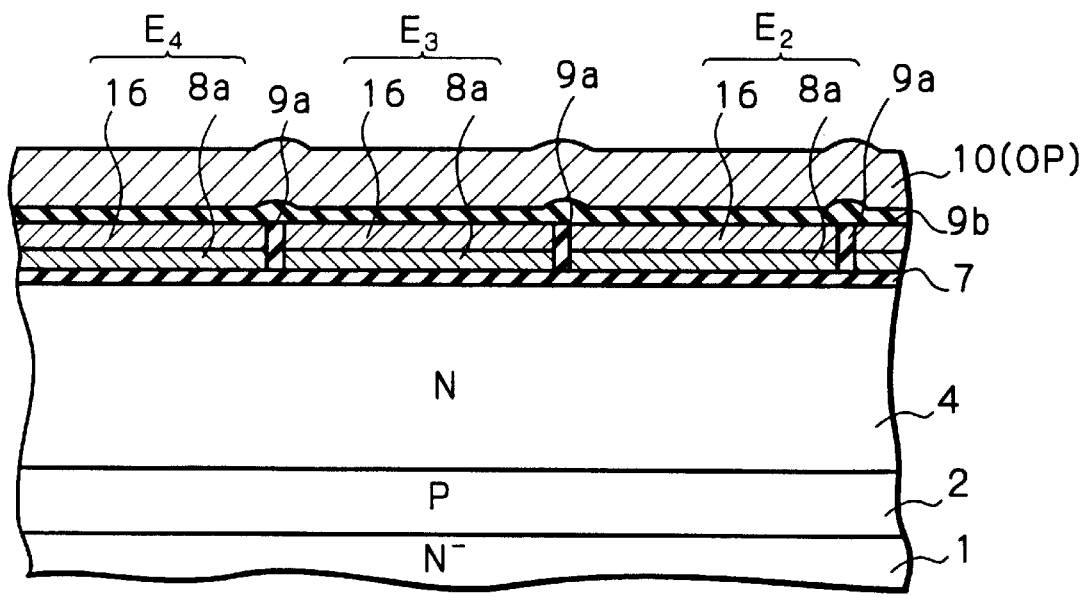
Figure 55A:
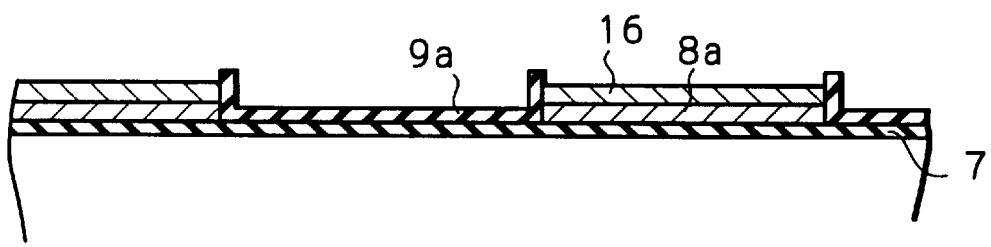
FIGS. 55A and 55B are cross-sectional views illustrating another modification of the seventh embodiment.
Figure 55B:
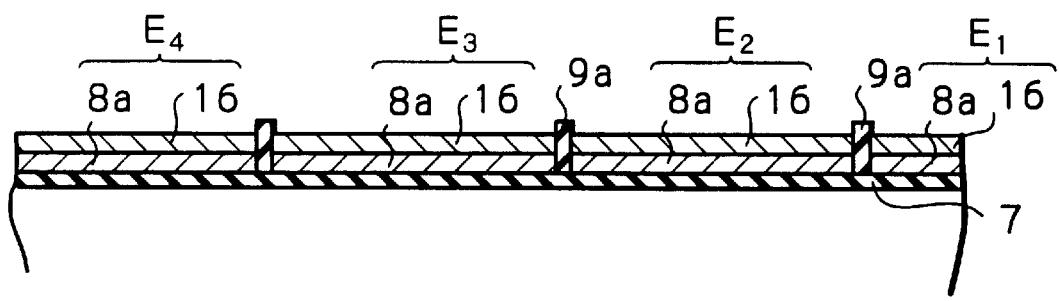

In the modification of the seventh embodiment as shown in FIGS. 51A, 51B, 52A, 52B, 53A, 53B, 54A and 54B, the charge transfer electrodes $E_1$, $E_2$, $E_3$ and $E_4$ and electrically isolated from each other by the insulating layer 9a having the same height as the charge transfer electrodes $E_1$, $E_2$, $E_3$ and $E_4$. In order to secure electrical isolation of the charge transfer electrodes $E_1$, $E_2$, $E_3$ and E, an etching process for the metal silicide layer 16 as illustrated in FIGS. 55A and 55B is added after the process as shown in FIGS. 53A and 53B. In this case, the device as illustrated in FIGS. 50A and 50B can be obtained.

FIGS. 56A, 56B, 57A, 57B, 58A, 58B, 59A, 59B, 60A, 60B, 61A, 61B, 62A, 62B, 63A, 63B, 64A and 64B are cross-sectional views for explaining an eighth embodiment of the CCD type solid state image pickup device according to the present invention. Note that FIGS. 56A, 56B, 57A, 57B, 58A, 58B, 60A, 60B, 61A, 61B, 63A, 63B, 64A and 64B correspond to FIGS. 5A, 5B, 6A, 6B, 7A, 7B, 8A, 8B, 9A, 9B, 10A, 10B, 11A and 11B, respectively.

Figure 56A:
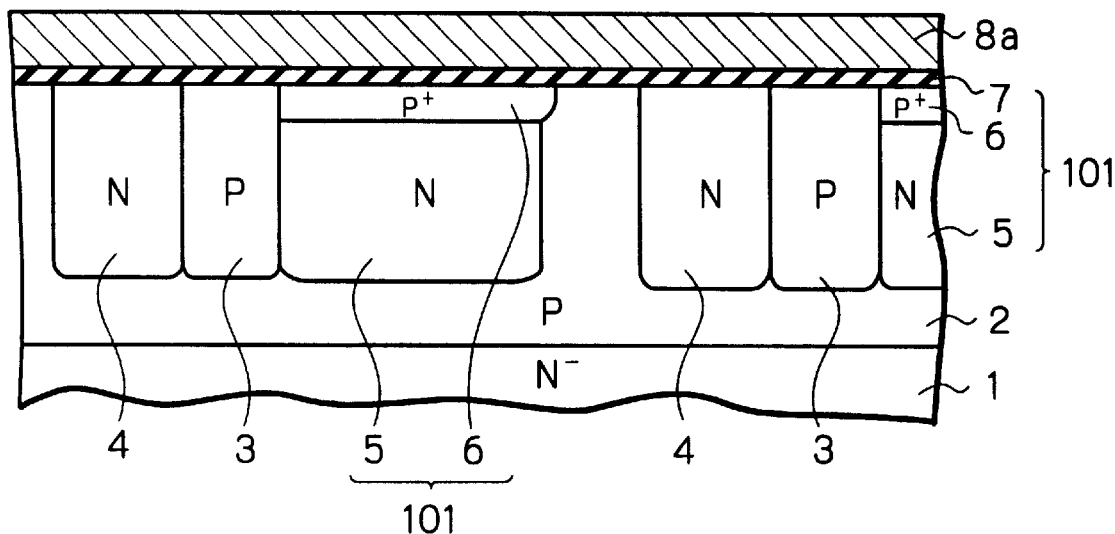
FIGS. 56A, 56B, 57A, 57B, 58A, 58B, 59A, 59B, 60A, 60B, 61A, 61B, 62A, 62B, 63A, 63B, 64A and 64B are cross-sectional views for explaining an eighth embodiment of the CCD type solid state image pickup device according to the present invention.
Figure 56B:
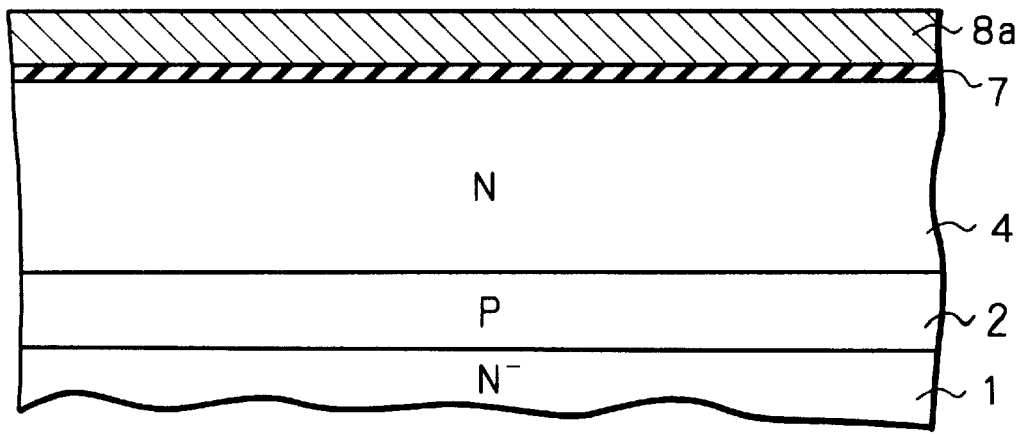

First, referring to FIGS. 56A and 56B, in the same way as in FIGS. 5A and 5B, P-type impurities are introduced into a N⁺-type monocrystalline silicon substrate 1 to form a P-type well 2. Next, a P-type isolation region 3, an N-type charge transfer region 4, an N-type impurity region 5 and a P⁺-type impurity region 6 are sequentially formed by using an ion implantation method in the P-type well 2. In this case, the N-type impurity diffusion region 5 and the P⁺-type impurity diffusion region 6 form a diode, i.e., a photo/electro conversion portion. Then, an about 500 to 1500 Å thick gate insulating layer 7 made of a multi-layer or a single layer formed by silicon oxide and/or silicon nitride is formed. Then, an about 0.3 to 0.8 μm thick polycrystalline silicon layer 8a including phosphorus is deposited on the gate insulating layer 7.

Figure 57A:
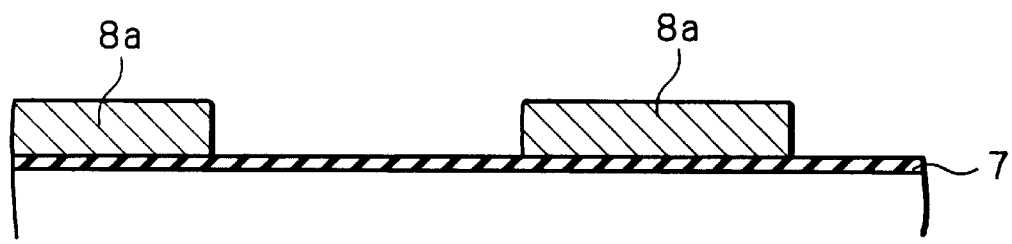
Figure 57B:
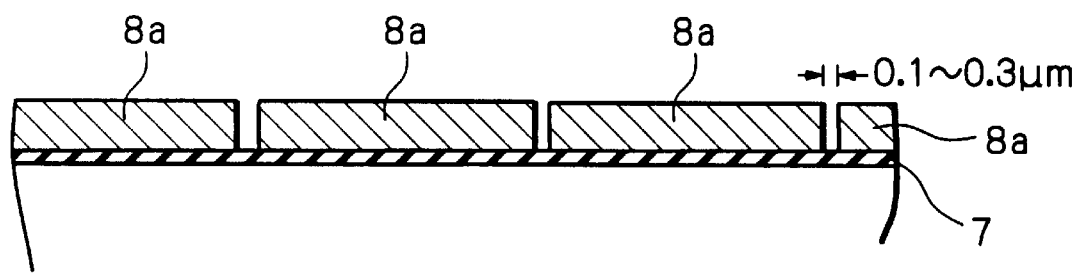

Next, referring to FIGS. 57A and 57B, in the same way as in FIGS. 6A and 6B, the polycrystalline silicon layer 8a is patterned by using a photolithography and etching process. In this case, a gap of the patterned polycrystalline silicon layer 8a is about 0.1 to 0.3 μm. Note that boron ions can be introduced through the gap of the polycrystalline silicon layer 8a to reduce the potential gap of the charge transfer region 4. Also, a silicon oxide layer can be deposited before the formation of a photoresist pattern, and the silicon oxide layer is then patterned by using the photoresist pattern. In this case, the polycrystalline silicon layer 8a is patterned by using the patterned silicon oxide layer, and thereafter, a silicon oxide layer is again deposited, and is etched back so that a sidewall silicon oxide layer is formed within the gap of the polycrystalline silicon layer 8a.

Figure 58A:
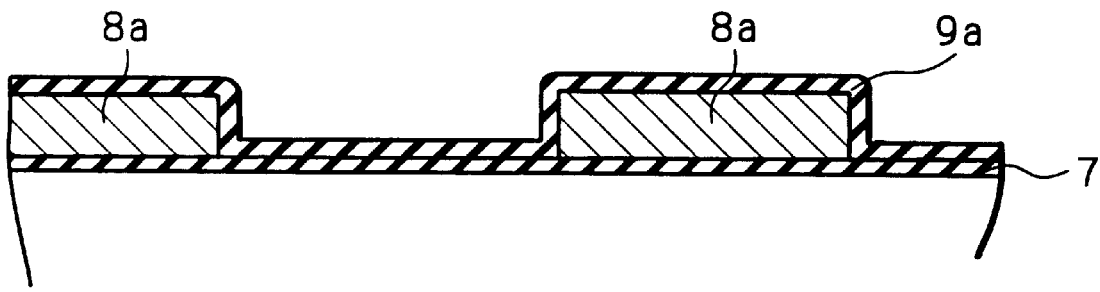
Figure 58B:
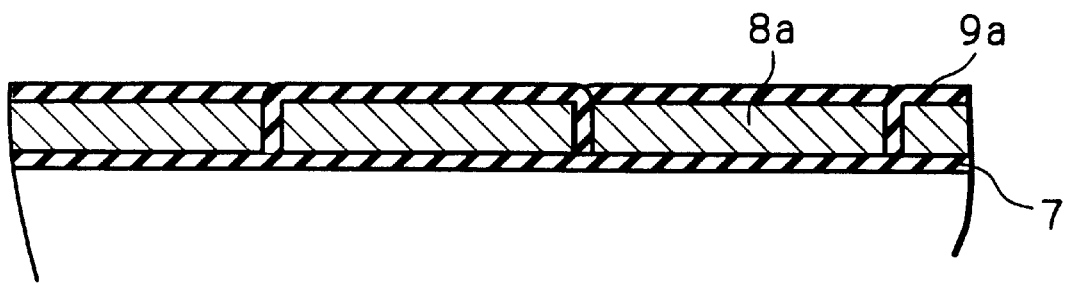

Next, referring to FIGS. 58A and 58B, in the same way as in FIGS. 7A and 7B, an insulating layer 9a made of silicon oxide or silicon nitride is deposited on the entire surface, so that the insulating layer 9a is completely buried in the gap of the polycrystalline silicon layer 8a.

Figure 59A:
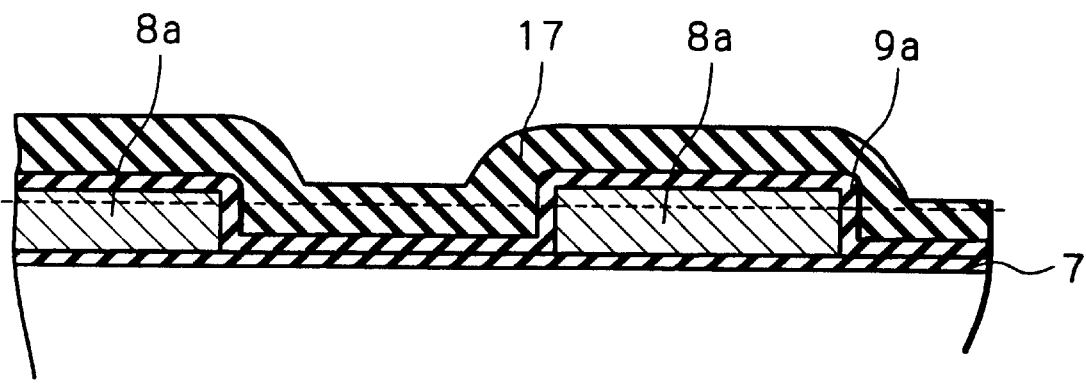
Figure 59B:
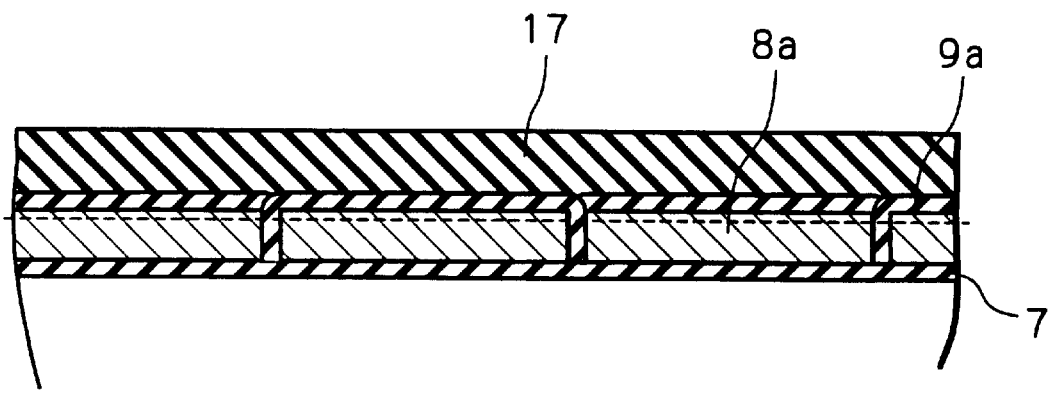

Next, referring to FIGS. 59A and 59B, a BSG layer 17 is deposited on the entire surface. In this case, the BSG layer 17 is thicker the polycrystalline silicon layer 8a. For example, the thickness of the BSG layer 17 is about 1.5 to 2 times that of the polycrystalline silicon layer 8a.

Figure 60A:
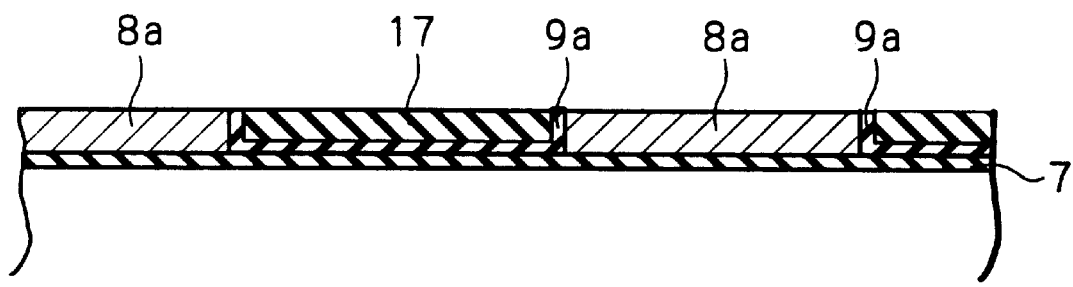
Figure 60B:
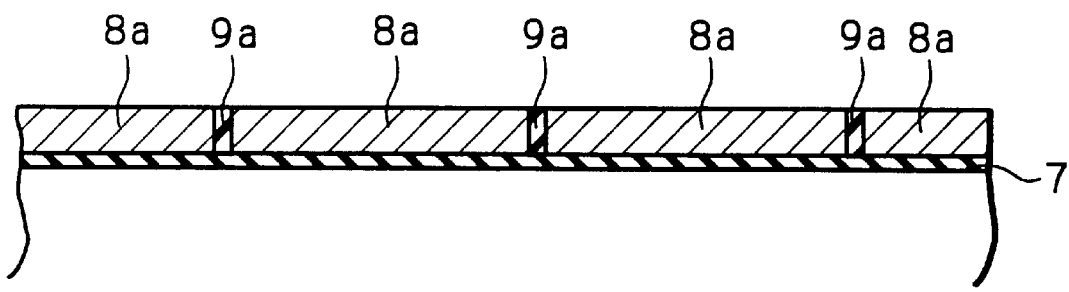

Next, referring to FIGS. 60A and 60B, in a similar way to that of FIGS. 8A and 8B, the BSG layer 17 and the insulating layer 9a is removed by a CMP process, until the polycrystalline silicon layer 8a is exposed. In this case, a part of the upper portion of the polycrystalline silicon layer 8a as indicated by a dot line in FIGS. 59A and 59B is also removed. Thus, the BSG layer 17 is left in an area where the polycrystalline silicon layer 8a is absent.

Figure 61A:
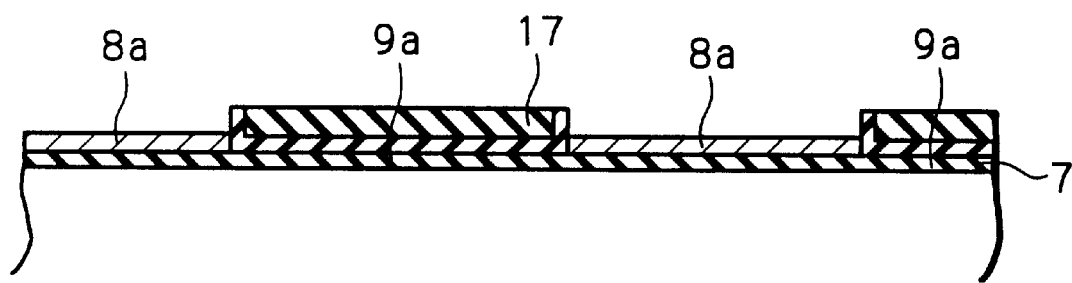
Figure 61B:
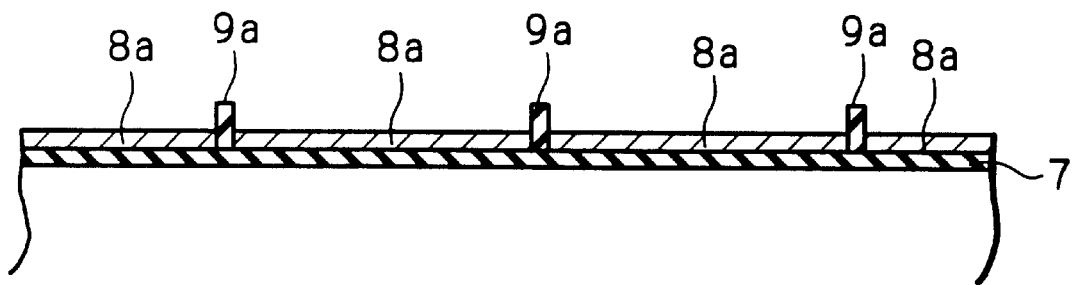

Next, referring to FIGS. 61A and 61B, in the same way as in FIGS. 9A and 9B, the upper portion of the polycrystalline silicon layer 8a is etched by using dilute nitric acid. In this case, if the polycrystalline silicon layer 8a before the etching is 0.6 μm, the etching amount is 3500 Å and accordingly, the remaining polycrystalline silicon layer 8a is 2500 Å thick.

Figure 62A:
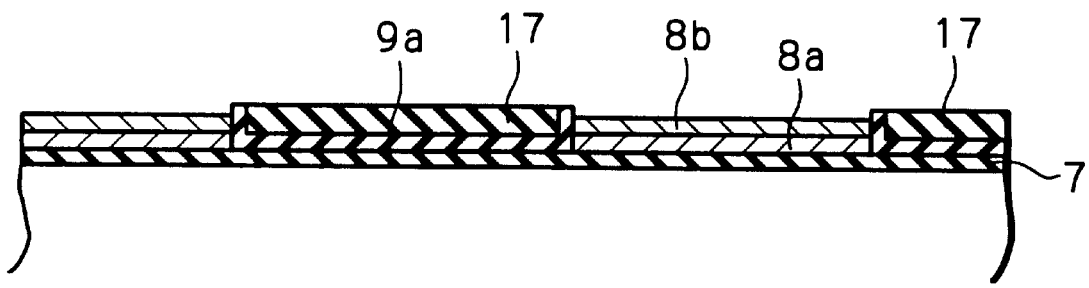
Figure 62B:
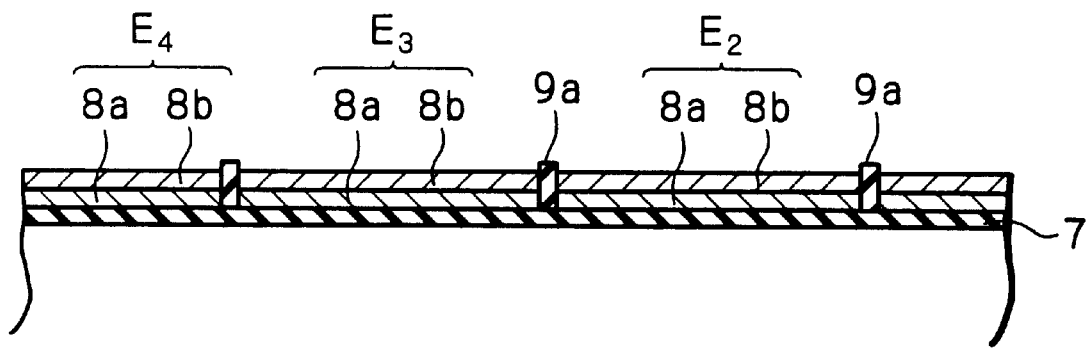

Next, referring to FIGS. 62A and 62B, in the same way as in FIGS. 10A and 10B, a metal layer 8b made of aluminum or refractory metal such as tungsten is selectively grown on only the polycrystalline silicon layer 8a. In this case, the upper surface of the metal layer 8b is made lower than the top of the insulating layer 9a. Therefore, the charge transfer electrodes $E_1$, $E_2$, $E_3$ and $E_4$ formed by the polycrystalline silicon layer 8a and the metal layer 8b are electrically isolated from each other.

Figure 63A:
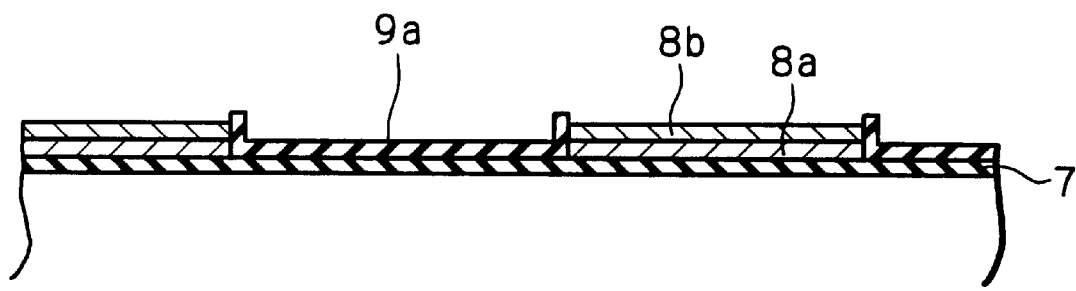
Figure 63B:
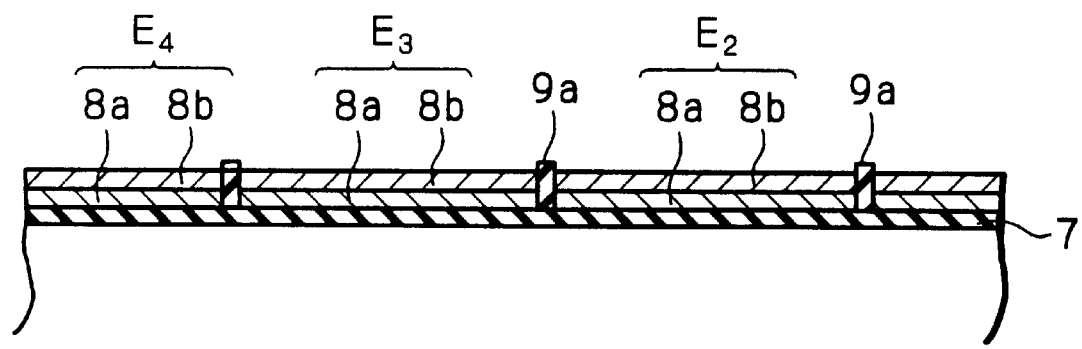

Next, referring to FIGS. 63A and 63B, the BSG layer 17 is etched by a gas phase fluoric acid etching process.

Figure 64A:
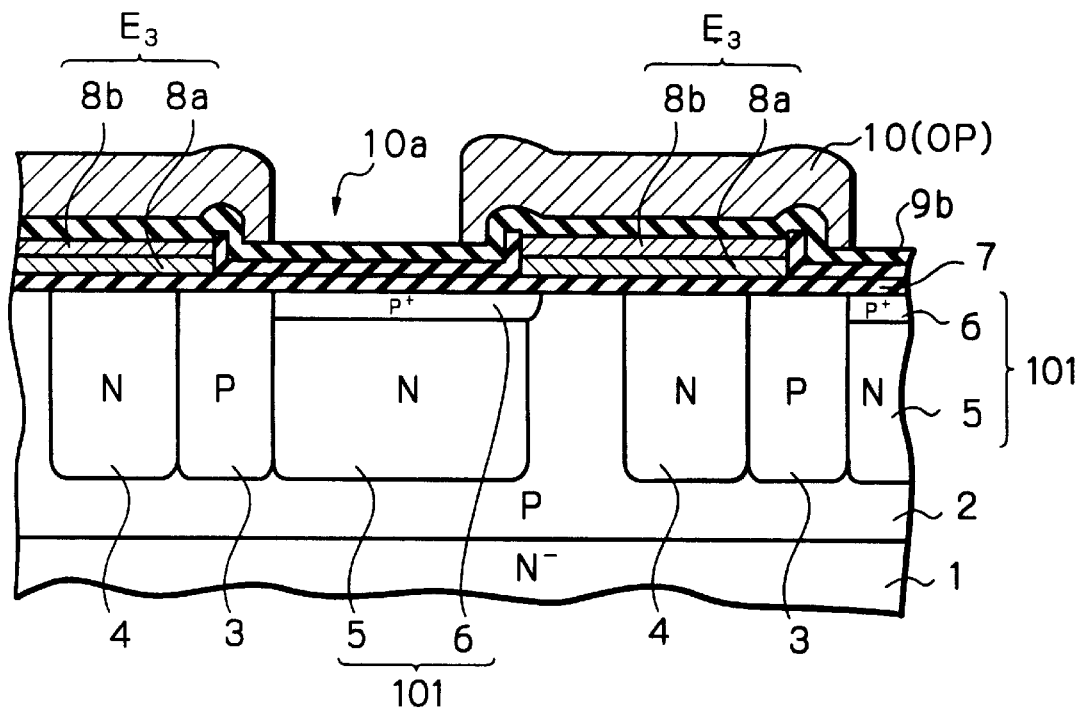
Figure 64B:
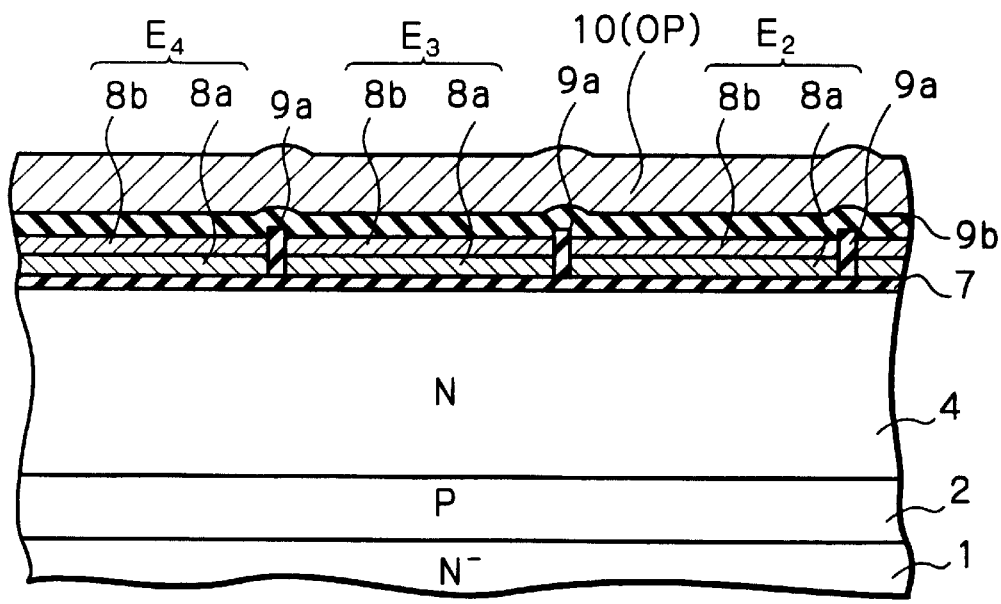

Finally, referring to FIGS. 64A and 64B, in the same way as in FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

In the eighth embodiment as shown in FIGS. 56A, 56B, 57A, 57B, 58A, 58B, 59A, 59B, 60A, 60B, 61A, 61B, 62A, 62B, 63A and 63B, the parasitic resistance of the charge transfer electrodes $E_1$, $E_2$, $E_3$ and $E_4$ can be remarkably reduced. Additionally, since the BSG layer 17 is formed on the photo/electro conversion portion, even when a residual part of the polycrystalline silicon layer 8a by the CMP process is deposited on the photo/electro conversion portion, this residual part is completely removed by the etching process of the BSG layer 17 as shown in FIGS. 63A and 63B. Thus, smear charges can be decreased.

FIGS. 65A, 65B, 66A, 66B, 67A, 67B, 68A, 68B, 69A, 69B, 70A, 70B, 71A, 71B, 72A and 72B are cross-sectional views for explaining a ninth embodiment of the CCD type solid state image pickup device according to the present invention. FIGS. 65A, 65B, 66A, 66B, 68A, 68B, 69A, 69B, 70A, 70B, 72A and 72B correspond to FIGS. 5A, 5B, 6A, 6B, 8A, 8B, 9A, 9B, 10A, 10B, 11A and 11B, respectively.

Figure 65A:
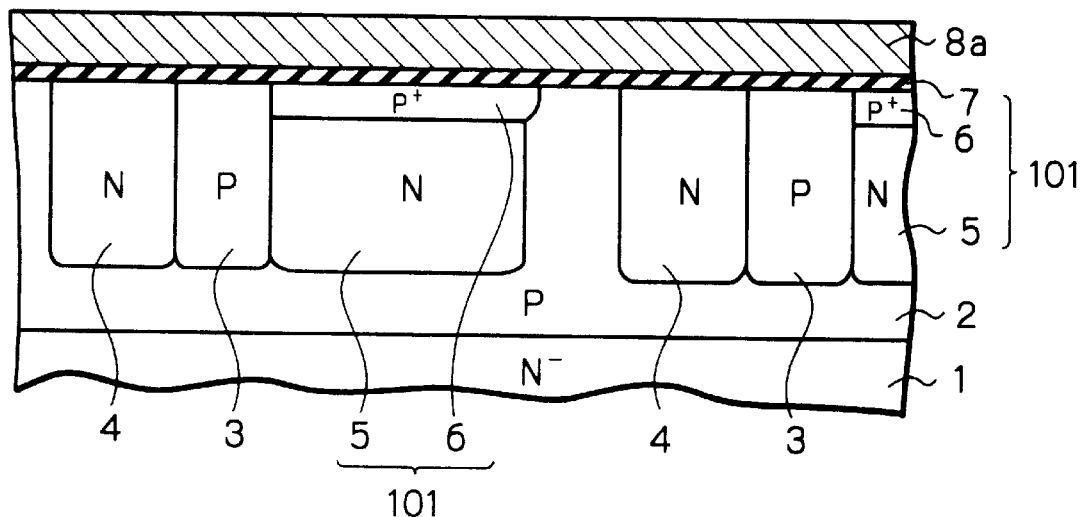
FIGS. 65A, 65B, 66A, 66B, 67A, 67B, 68A, 68B, 69A, 69B, 70A, 70B, 71A, 71B, 72A and 72B are cross-sectional views for explaining a ninth embodiment of the CCD type solid state image pickup device according to the present invention.
Figure 65B:
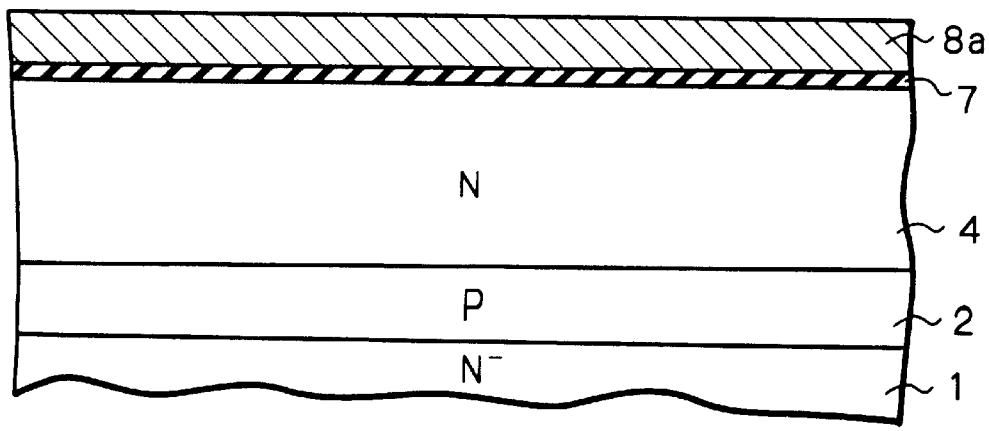

First, referring to FIGS. 65A and 65B, in the same way as in FIGS. 5A and 5B, P-type impurities are introduced into an $N^-$-type monocrystalline silicon substrate 1 to form a P-type well 2. Next, a P-type isolation region 3, an N-type charge transfer region 4, an N-type impurity region 5 and a $P^+$-type impurity region 6 are sequentially formed by using ion implantation method in the P-type well 2. In this case, the N-type impurity diffusion region 5 and the $P^+$-type impurity diffusion region 6 form a diode, i.e., a photo/electro conversion portion. Then, an about 500 to 1500 Å thick gate insulating layer 7 is formed. In this case, the gate insulating layer 7 is made of silicon nitride. Then, an about 0.3 to 0.8 μm thick polycrystalline silicon layer 8a including phosphorus is deposited on the gate insulating layer 7.

Figure 66A:
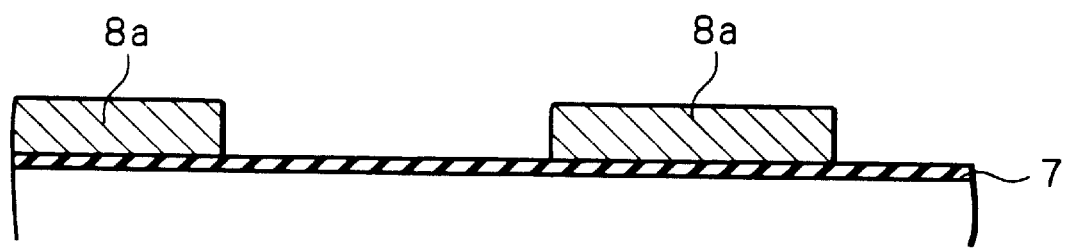
Figure 66B:
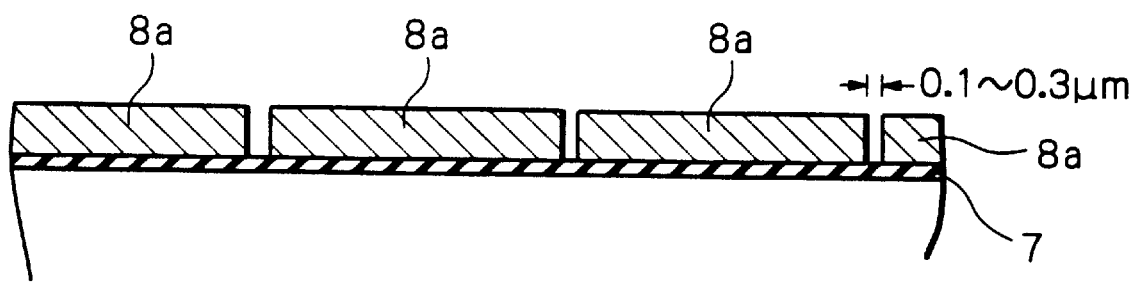

Next, referring to FIGS. 66A and 66B, in the same way as in FIGS. 6A and 6B, the polycrystalline silicon layer 8a is patterned by using a photolithography and etching process. In this case, a gap of the patterned polycrystalline silicon layer 8a is about 0.1 to 0.3 μm. Note that boron ions can be introduced through the gap of the polycrystalline silicon layer 8a to reduce the potential gap of the charge transfer region 4. Also, a silicon oxide layer can be deposited before the formation of a photoresist pattern, and the silicon oxide layer is patterned by using the photoresist pattern. In this case, the polycrystalline silicon layer 8a is patterned by using the patterned silicon oxide layer, and thereafter, a silicon oxide layer is again deposited, and is etched back so that a sidewall silicon oxide layer is formed within the gap of the polycrystalline silicon layer 8a.

Figure 67A:
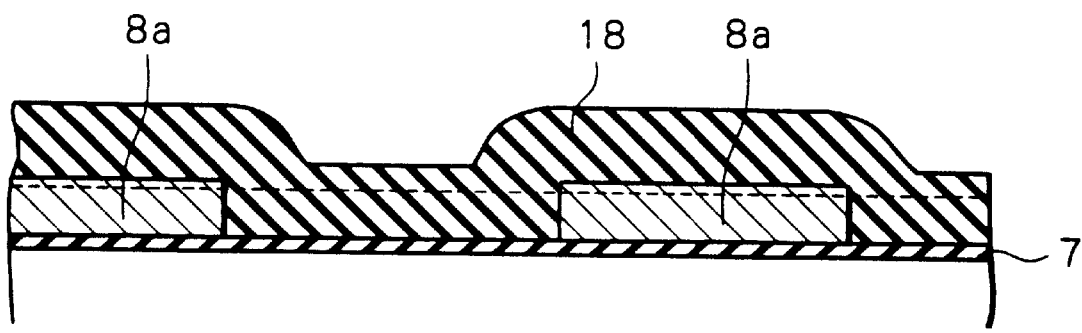
Figure 67B:
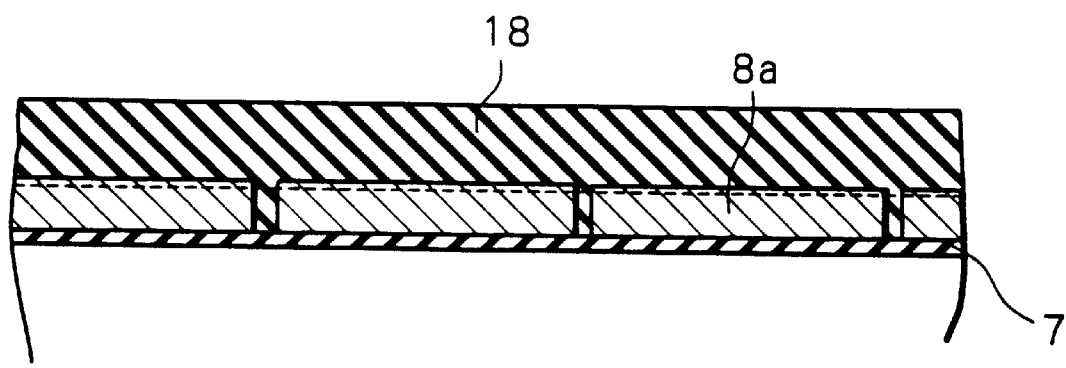

Next, referring to FIGS. 67A and 67B, a silicon oxide layer 18 is deposited on the entire surface. In this case, the silicon oxide layer 18 is thicker than the polycrystalline silicon layer 8a. For example, the thickness of the silicon oxide layer 18 is about 1.5 to 2 times that of the polycrystalline silicon layer 8a.

Figure 68A:
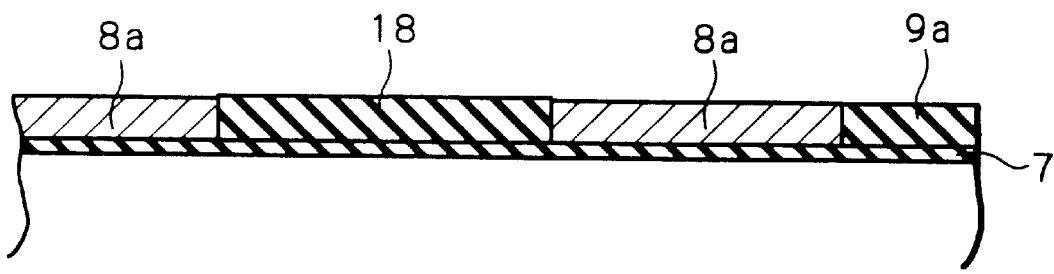
Figure 68B:
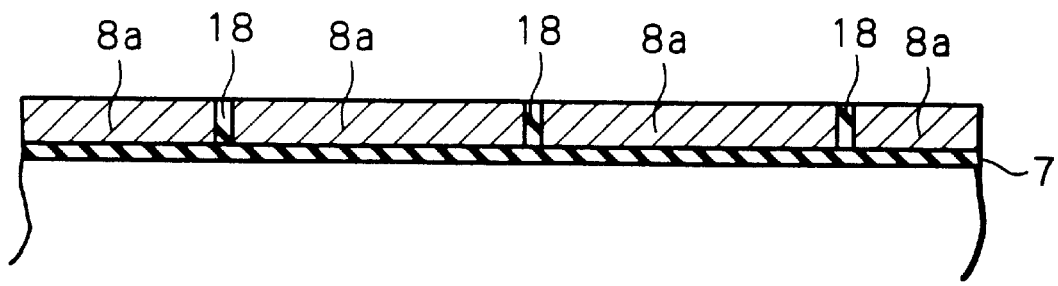

Next, referring to FIGS. 68A and 68B, in a similar way to that of FIGS. 8A and 8B, the silicon oxide layer 18 is removed by a CMP process, until the polycrystalline silicon layer 8a is exposed. In this case, a part of the upper portion of the polycrystalline silicon layer 8a as indicated by a dot line in FIGS. 67A and 67B is also removed. Thus, the silicon oxide layer 18 is left in an area where the polycrystalline silicon layer 8a is absent.

Figure 69A:
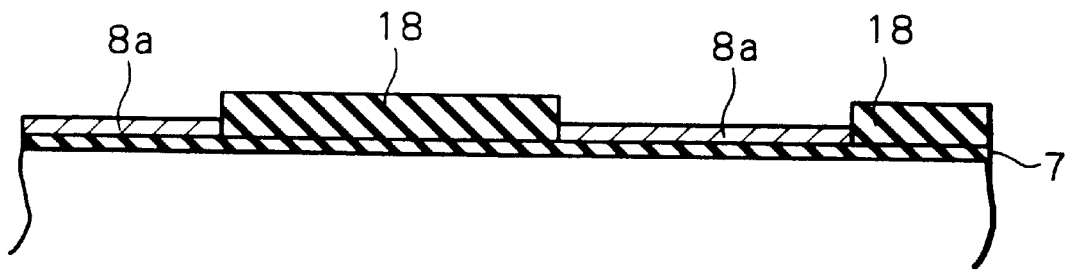
Figure 69B:
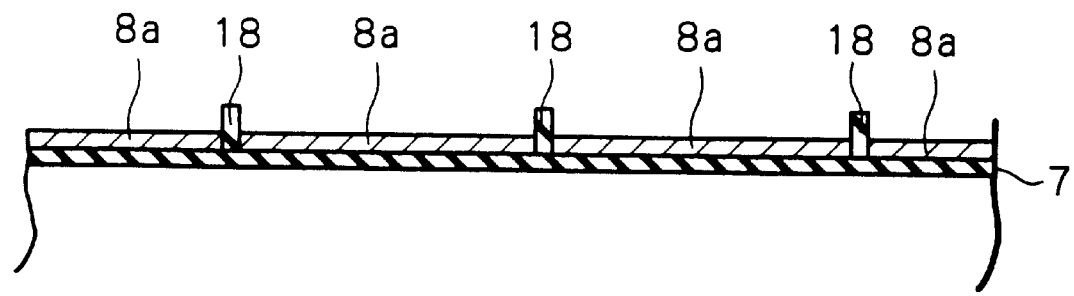

Next, referring to FIGS. 69A and 69B, in the same way as in FIGS. 9A and 9B, the upper portion of the polycrystalline silicon layer 8a is etched by using dilute nitric acid. In this case, if the polycrystalline silicon layer 8a before the etching is 0.6 μm, the etching amount is 3500 Å and accordingly, the remaining polycrystalline silicon layer 8a is 2500 Å thick.

Figure 70A:
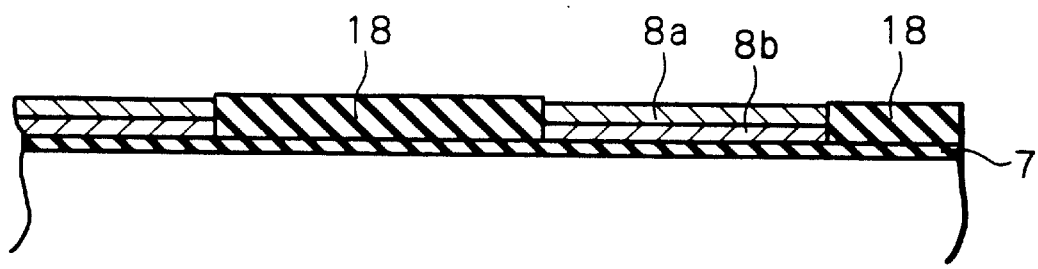
Figure 70B:
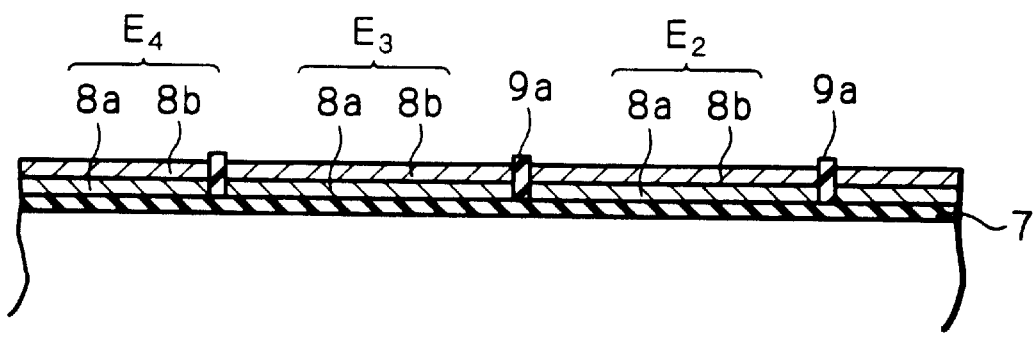

Next, referring to FIGS. 70A and 70B, in the same way as in FIGS. 10A and 10B, a metal layer 8b made of aluminum or refractory metal such as tungsten is selectively grown only on the polycrystalline silicon layer 8a. In this case, the upper surface of the metal layer 8b is made lower than the top of the silicon oxide layer 18a. Therefore, the charge transfer electrodes $E_1$, $E_2$, $E_3$ and $E_4$ formed by the polycrystalline silicon layer 8a and the metal layer 8b are electrically isolated from each other.

Figure 71A:
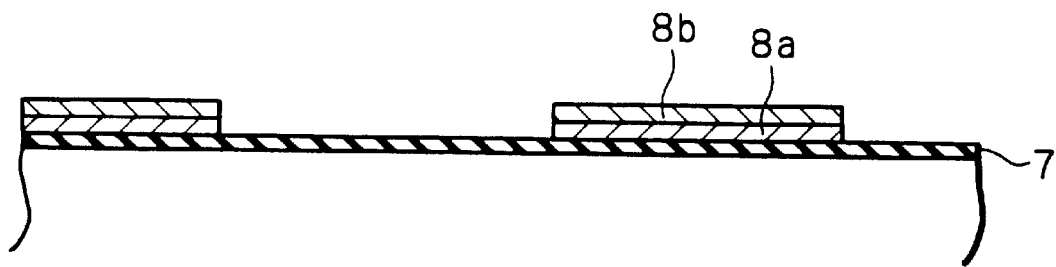
Figure 71B:
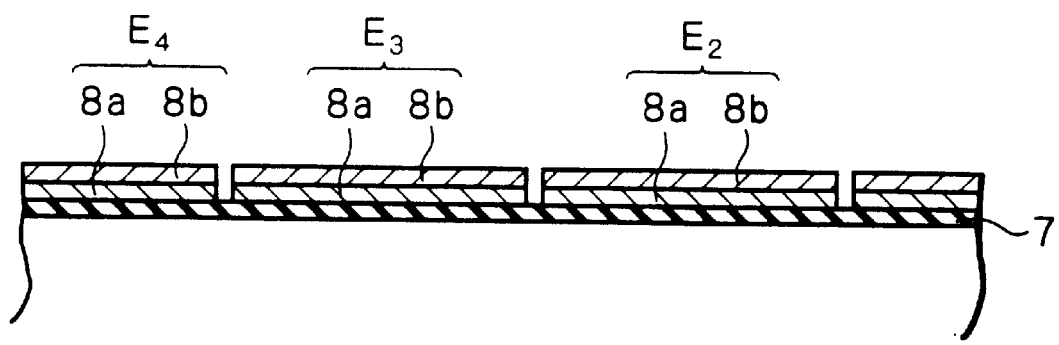

Next, referring to FIGS. 71A and 71B, the silicon oxide layer 18 is etched by dilute fluoric acid.

Figure 72A:
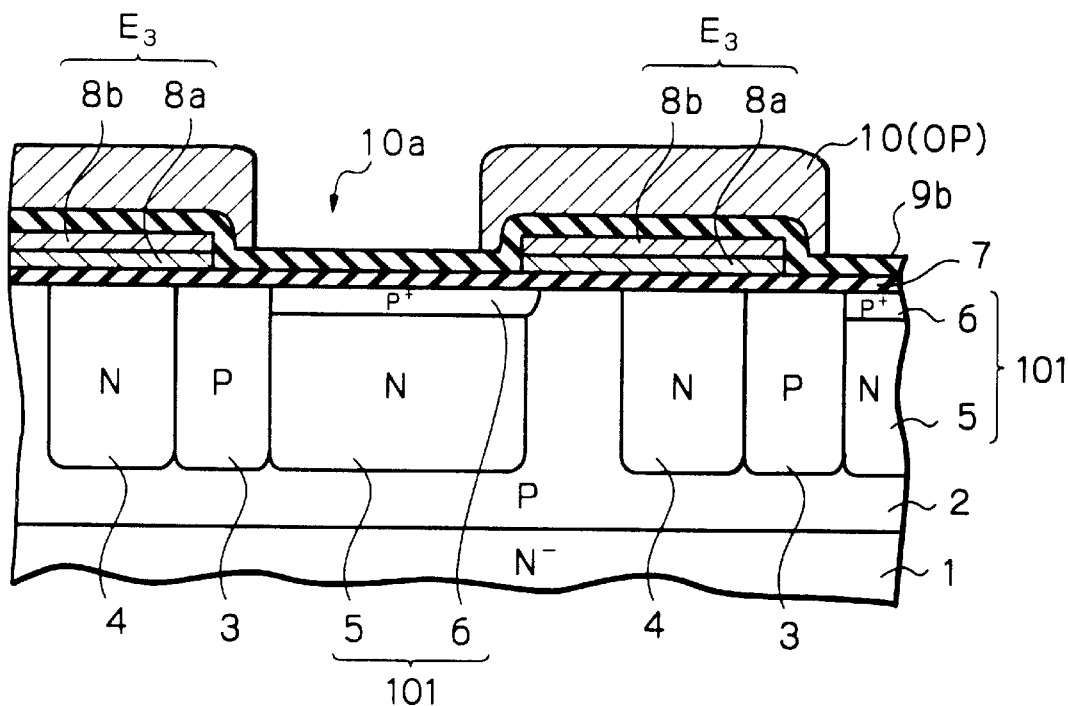
Figure 72B:
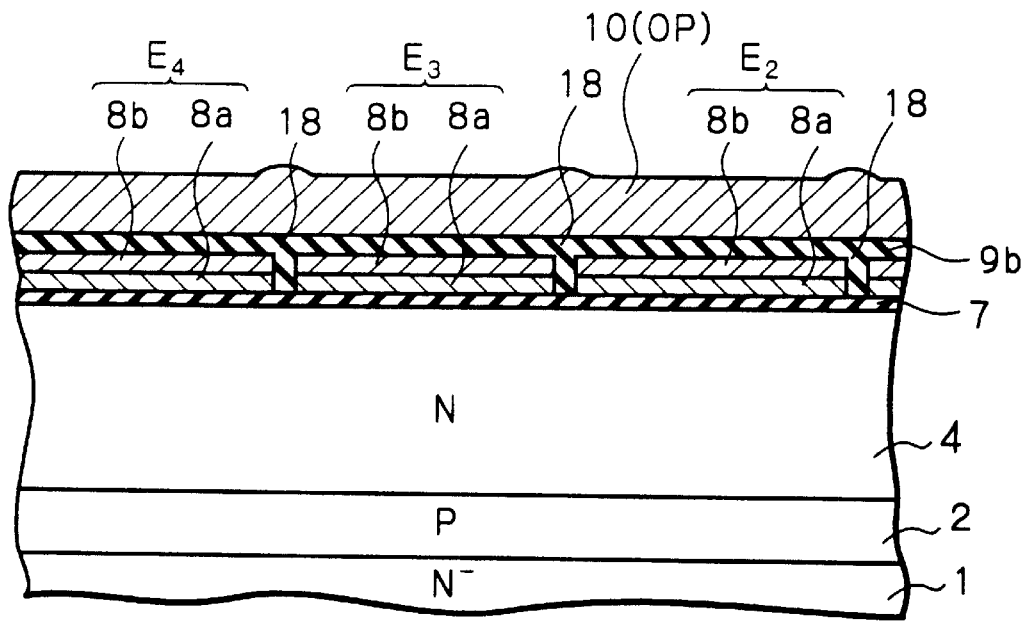

Finally, referring to FIGS. 72A and 72B, in the same way as in FIGS. 11A and 11B, an insulating layer 9b made of silicon oxide or the like is deposited on the entire surface. Then, a metal layer 10 made of tungsten or aluminum is deposited on the entire surface, and is patterned to form an opening 10a for the photo/electro conversion portion. Thus, the device is completed.

In the ninth embodiment as shown in FIGS. 65A, 65B, 66A, 66B, 67A, 67B, 68A, 68B, 69A, 69B, 70A, 70B, 71A, 71B, 72A and 72B, the parasitic resistance of the charge transfer electrodes $E_1$, $E_2$, $E_3$ and $E_4$ can be remarkably reduced. Additionally, since the silicon oxide layer 18 is formed on the photo/electro conversion portion, even when a residual part of the polycrystalline silicon layer 8a by the CMP process is deposited on the photo/electro conversion portion, this residual part is completely removed by the etching process of the silicon oxide layer 18 as shown in FIGS. 71A and 71B. Thus, smear charges can be decreased. Further, since the thickness of the insulating layers on the photo/electro conversion portions is smaller in the ninth embodiment than in the eighth embodiment, the smear charges can be further decreased.

As explained hereinabove, according to the present invention, since each charge transfer electrode is a double structure made of silicon and low-conductive material such as aluminum or refractory metal, the parasitic resistance of the charge transfer electrodes can be reduced, which enhances the charge transfer efficiency.

What is claimed is:

1. A method for manufacturing a CCD type solid state image pickup device, comprising the steps of:
   forming a charge transfer region within a semiconductor substrate;
   forming a first insulating layer on said semiconductor substrate;
   forming a first conductive layer on said first insulating layer;
   patterning said first conductive layer;
   forming a second insulating layer on said patterned first conductive layer and said first insulating layer;
   removing said second insulating layer only on an upper surface of said patterned first conductive layer to expose the upper surface of said patterned first conductive layer;
   etching an upper part of said patterned first conductive layer;
   growing a second conductive layer only on said patterned first conductive layer after the upper part of said first conductive layer is etched.

2. The method as set forth in claim 1, wherein said first conductive layer is made of polycrystalline silicon, and said second conductive layer is made of one of aluminum and refractory metal.

3. The method as set forth in claim 1, wherein said removing step uses a chemical mechanical polishing process.

4. The method as set forth in claim 1, wherein said removing step uses an anisotropic etching process.

5. The method as set forth in claim 1, wherein a top of said second insulating layer is higher than said second conductive layer.

6. A method for manufacturing a CCD type solid state image pickup device, comprising the steps of:
   forming a charge transfer region within a semiconductor substrate;
   forming a first insulating layer on said semiconductor substrate;
   forming a first conductive layer on said first insulating layer;
   patterning said first conductive layer;
   forming a second insulating layer on said patterned first conductive layer and said first insulating layer;
   forming a second conductive layer on said first and second insulating layers;
   patterning said second conductive layer;
   removing said patterned second conductive layer only on said second insulating layer and said second insulating layer only on an upper surface of said patterned first conductive layer to expose the upper surface of said patterned first conductive layer;
   etching an upper part of said patterned first and second conductive layers;
   growing a third conductive layer only on said patterned first and second conductive layers after the upper part of said first and second conductive layers is etched.

7. The method as set forth in claim 6, wherein said first and second conductive layers are made of polycrystalline silicon, and said third conductive layer is made of one of aluminum and refractory metal.

8. The method as set forth in claim 6, wherein said removing step uses a chemical mechanical polishing process.

9. The method as set forth in claim 6, wherein said removing step uses an anisotropic etching process.

10. The method as set forth in claim 6, wherein a top of said second insulating layer is higher than said third conductive layer.

11. A method for manufacturing a CCD type solid state image pickup device, comprising the steps of:
    forming a charge transfer region within a semiconductor substrate;
    forming a first insulating layer on said semiconductor substrate;
    forming a first conductive layer on said first insulating layer;
    forming a dummy layer on said first conductive layer;
    patterning said dummy layer and said first conductive layer;
    forming a second insulating layer on said patterned dummy layer and said first insulating layer;
    removing said second insulating layer only on an upper surface of said patterned dummy layer to expose the upper surface of said patterned dummy layer;
    etching said patterned dummy layer;
    growing a second conductive layer only on said patterned first conductive layer after said patterned dummy layer is etched.

12. The method as set forth in claim 11, wherein said dummy layer is made of BSG,
    said dummy etching step using a gas phase fluoric etching process.

13. The method as set forth in claim 11, wherein said first conductive layer is made of polycrystalline silicon, and said second conductive layer is made of one of aluminum and refractory metal.

14. The method as set forth in claim 11, wherein said removing step uses a chemical mechanical polishing process.

15. The method as set forth in claim 11, wherein said removing step uses an anisotropic etching process.

16. The method as set forth in claim 11, wherein a top of said second insulating layer is higher than said second conductive layer.

17. A method for manufacturing a CCD type solid state image pickup device, comprising the steps of:

forming a charge transfer region within a semiconductor substrate;

forming a first insulating layer on said semiconductor substrate;

forming a first conductive layer on said first insulating layer;

forming a first dummy layer on said first conductive layer;

forming a second dummy layer on said first dummy layer;

patterning said second and first dummy layers and said first conductive layer;

forming a second insulating layer on said patterned second dummy layer and said first insulating layer;

removing said second insulating layer only on an upper surface of said patterned second dummy layer to expose the upper surface of said patterned second dummy layer;

etching said patterned second dummy layer;

etching said patterned first dummy layer after said patterned dummy layer;

growing a second conductive layer only on said patterned first conductive layer after said patterned first dummy layer is etched.

18. The method as set forth in claim 17, wherein said first dummy layer is made of silicon oxide and said second dummy layer is made of polycrystalline silicon.

19. The method as set forth in claim 17, wherein said first conductive layer is made of polycrystalline silicon, and said second conductive layer is made of one of aluminum and refractory metal.

20. The method as set forth in claim 17, wherein said removing step uses a chemical mechanical polishing process.

21. The method as set forth in claim 17, wherein said removing step uses an anisotropic etching process.

22. The method as set forth in claim 17, wherein a top of said second insulating layer is higher than said second conductive layer.

23. A method for manufacturing a CCD type solid state image pickup device, comprising the steps of:

forming a charge transfer region within a semiconductor substrate;

forming a first insulating layer on said semiconductor substrate;

forming a first conductive layer on said first insulating layer;

patterning said first conductive layer;

forming a second insulating layer on said patterned first conductive layer and said first insulating layer;

removing said second insulating layer only on an upper surface of said patterned first conductive layer to expose the upper surface of said patterned first conductive layer;

growing a third insulating layer only on said second insulating layer by a liquid phase deposition process;

growing a second conductive layer only on said patterned first conductive layer after said third insulating layer is grown.

24. The method as set forth in claim 23, wherein said first conductive layer is made of polycrystalline silicon, said second conductive layer being made of one of aluminum and refractory metal, said third insulating layer being made of silicon oxide.

25. The method as set forth in claim 23, wherein said removing step uses a chemical mechanical polishing process.

26. The method as set forth in claim 23, wherein said removing step uses an anisotropic etching process.

27. The method as set forth in claim 23, wherein a top of said third insulating layer is higher than said second conductive layer.

28. A method for manufacturing a CCD type solid state image pickup device, comprising the steps of:

forming a charge transfer region within a semiconductor substrate;

forming a first insulating layer on said semiconductor substrate;

forming a first conductive layer made of polycrystalline silicon on said first insulating layer;

patterning said first conductive layer;

forming a second insulating layer on said patterned first conductive layer and said first insulating layer;

removing said second insulating layer only on an upper surface of said patterned first conductive layer to expose the upper surface of said patterned first conductive layer;

growing a second conductive layer made of metal on said patterned first conductive layer and said second insulating layer after said second insulating layer is removed;

performing an heating operation upon said first and second conductive layers, so that a third conductive layer made of metal silicide is formed by reaction of said first and second conductive layers; and removing an unreacted portion of said second conductive layer after said heating operation is performed.

29. The method as set forth in claim 28, wherein said metal is one of aluminum and refractory metal.

30. The method as set forth in claim 28, further comprising a step of removing a part of an upper portion of said first conductive layer after said second insulating layer is removed.

31. The method as set forth in claim 28, further comprising a step of removing a part of an upper portion of said third conductive layer after said unreacted portion of said second conductive layer is removed.

32. The method as set forth in claim 28, wherein said removing step uses a chemical mechanical polishing process.

33. The method as set forth in claim 28, wherein said removing step uses an anisotropic etching process.

34. The method as set forth in claim 28, wherein a top of said third insulating layer is higher than said second conductive layer.

35. A method for manufacturing a CCD type solid state image pickup device, comprising the steps of:

forming a charge transfer region within a semiconductor substrate;

forming a first insulating layer on said semiconductor substrate;

forming a first conductive layer on said first insulating layer;

patterning said first conductive layer;

forming a second insulating layer on said patterned first conductive layer and said first insulating layer;

forming a dummy layer on said second insulating layer;

removing said dummy layer and said second insulating layer only on an upper surface of said patterned first conductive layer to expose the upper surface of said patterned first conductive layer;

etching an upper part of said patterned first conductive layer;

growing a second conductive layer only on said patterned first conductive layer after the upper part of said first conductive layer is etched; and removing said dummy layer after said second conductive layer is grown.

36. The method as set forth in claim 35, wherein said first conductive layer is made of polycrystalline silicon, said second conductive layer is made of one of aluminum and refractory metal, and said dummy layer is made of BSG.

37. The method as set forth in claim 35, wherein said removing step uses a chemical mechanical polishing process.

38. The method as set forth in claim 35, wherein said removing step uses an anisotropic etching process.

39. The method as set forth in claim 36, wherein a top of said second insulating layer is higher than said second conductive layer.

40. A method for manufacturing a CCD-type solid state image pickup device, comprising:

forming a charge transfer region within a semiconductor substrate;

forming an insulating layer on said semiconductor substrate;

forming a first conductive layer on said insulating layer;

patterning said first conductive layer;

forming a dummy layer on said patterned first conductive layer and said insulating layer, said dummy layer being made of material different from that of said insulating layer;

removing said dummy layer only on an upper surface of said patterned first conductive layer to expose the upper surface of said patterned first conductive layer;

etching an upper part of said patterned first conductive layer;

growing a second conductive layer only on said patterned first conductive layer after the upper part of said first conductive layer is etched; and removing said dummy layer after said second conductive layer is grown.

41. The method as set forth in claim 40, wherein said first conductive layer is made of polycrystalline silicon, and said second conductive layer is made of one of aluminum and refractory metal.

42. The method as set forth in claim 40, wherein said removing said dummy layer uses a chemical mechanical polishing process.

43. The method as set forth in claim 40, wherein said removing said dummy layer uses an anisotropic etching process.

44. The method as set forth in claim 40, further comprising forming a second insulating layer on said patterned first conductive layer and said insulating layer, wherein a top of said second insulating layer is higher than said second conductive layer.

* * * * *